US006117698A

United States Patent [19]

Atobe et al.

[11] Patent Number: 6,117,698

[45] Date of Patent: Sep. 12, 2000

[54] METHOD FOR PRODUCING THE HEAD OF AN INK-JET RECORDING APPARATUS

[75] Inventors: Mitsuro Atobe; Shinichi Kamisuki; Shinichi Yotsuya; Hiroshi Koeda; Yoshihiro Ohno, all of Suwa; Hitoshi Tanbo, Wakayama, all of Japan

[73] Assignee: Seiko Epson Corporation, Tokyo, Japan

[21] Appl. No.: 09/099,483

[22] Filed: Jun. 17, 1998

Related U.S. Application Data

[60] Division of application No. 08/477,681, Jun. 7, 1995, which is a continuation-in-part of application No. 07/757,691, Sep. 11, 1991, Pat. No. 5,534,900, which is a continuation-in-part of application No. 08/069,198, May 28, 1993, abandoned.

[30] Foreign Application Priority Data

| | | | |
|---|---|---|---|
| Sep. 21, 1990 | [JP] | Japan | 2-252252 |
| Nov. 14, 1990 | [JP] | Japan | 2-307855 |
| Nov. 15, 1990 | [JP] | Japan | 2-309335 |
| Jun. 12, 1991 | [JP] | Japan | 3-140009 |
| Jun. 5, 1992 | [JP] | Japan | 4-145764 |
| Jun. 12, 1992 | [JP] | Japan | 4-153808 |
| Jul. 8, 1992 | [JP] | Japan | 4-181233 |
| Jul. 8, 1992 | [JP] | Japan | 4-181240 |

[51] Int. Cl.[7] .................... H01L 21/00

[52] U.S. Cl. .................... 438/21; 347/54; 347/55; 216/27; 29/890.1

[58] Field of Search .................... 438/21; 347/54, 347/55; 216/27; 29/890.1

[56] References Cited

U.S. PATENT DOCUMENTS

| | | |
|---|---|---|
| 4,203,128 | 5/1980 | Guckel et al. . |
| 4,234,361 | 11/1980 | Guckel et al. . |
| 4,312,008 | 1/1982 | Taub et al. . |
| 4,384,899 | 5/1983 | Myers . |
| 4,429,321 | 1/1984 | Matsumoto . |
| 4,471,363 | 9/1984 | Hanaoka . |
| 4,520,375 | 5/1985 | Kroll . |
| 4,588,998 | 5/1986 | Yamamuro et al. . |

(List continued on next page.)

FOREIGN PATENT DOCUMENTS

| | | |
|---|---|---|
| 0 479 441 | 4/1992 | European Pat. Off. . |
| 55-79171 | 6/1980 | Japan . |
| 56-142071 | 11/1981 | Japan . |
| 58-224760 | 12/1983 | Japan . |
| 61-59911 | 12/1986 | Japan . |
| 1-246850 | 2/1989 | Japan . |
| 2-012218 | 1/1990 | Japan . |
| 2-080252 | 3/1990 | Japan . |
| 2-266943 | 10/1990 | Japan . |
| 2-289351 | 11/1990 | Japan . |
| 2-51734 | 11/1990 | Japan . |
| 3-253346 | 12/1991 | Japan . |
| 3-288649 | 12/1991 | Japan . |
| 3-295654 | 12/1991 | Japan . |
| 3-297653 | 12/1991 | Japan . |
| 2 146 566 | 4/1985 | United Kingdom . |

OTHER PUBLICATIONS

Patent Abstract of Japan, Oct. 29, 1998, vol. 18, No. 66.

*Primary Examiner*—John F. Niebling
*Assistant Examiner*—David A. Zarneke

[57] ABSTRACT

A laminated, multi-substrate ink jet head and methods creating the same, wherein the ink jet head includes nozzle holes, emitting chambers respectively led to the nozzle holes, diaphragms formed on a wall of the emitting chambers, a common ink cavity for supplying ink to the emitting chambers through orifices and electrodes placed so as to face to the diaphragms so as to drive the diaphragms by static electricity. The lower substrate which forms the electrodes may include a plurality of indentations for mounting the electrode therein to serve as a gap spacing element for respective diaphragm/electrode pairs when the head is assembled. Alternatively, areas immediately beneath the diaphragm may be etched away to expand the vibrating chamber to a predetermined gap distance, or a membrane of a predetermined thickness may interpose the respective diaphragm and electrode substrates.

32 Claims, 26 Drawing Sheets

U.S. PATENT DOCUMENTS

| | | |
|---|---|---|
| 4,611,219 | 9/1986 | Sugitani et al. . |
| 4,719,477 | 1/1988 | Hess . |
| 4,725,851 | 2/1988 | Sutera et al. . |
| 4,733,447 | 3/1988 | Ageishi . |
| 4,766,666 | 8/1988 | Sugiyama et al. . |
| 4,879,568 | 11/1989 | Bartky et al. . |
| 5,116,457 | 5/1992 | Jerman . |
| 5,144,342 | 9/1992 | Kubota . |
| 5,163,177 | 11/1992 | Komura . |
| 5,376,231 | 12/1994 | Matsumoto et al. . |
| 5,446,485 | 8/1995 | Usui et al. . |
| 5,513,431 | 5/1996 | Ohno et al. . |
| 5,534,900 | 7/1996 | Ohno et al. . |

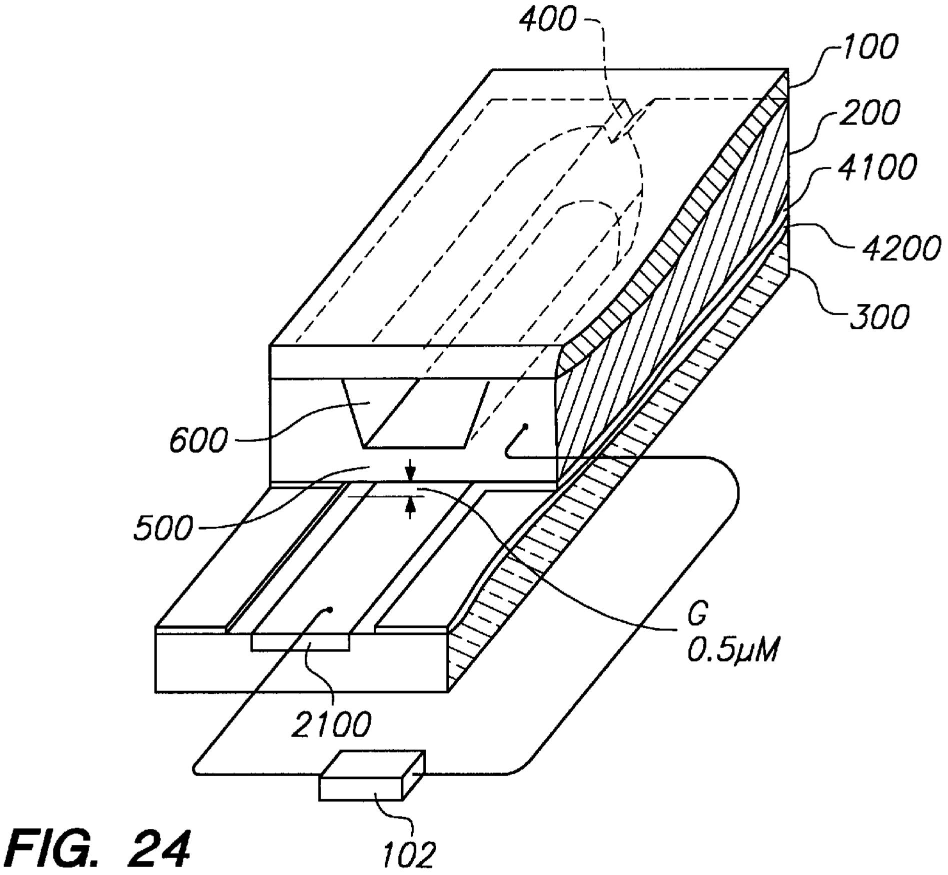
FIG. 24
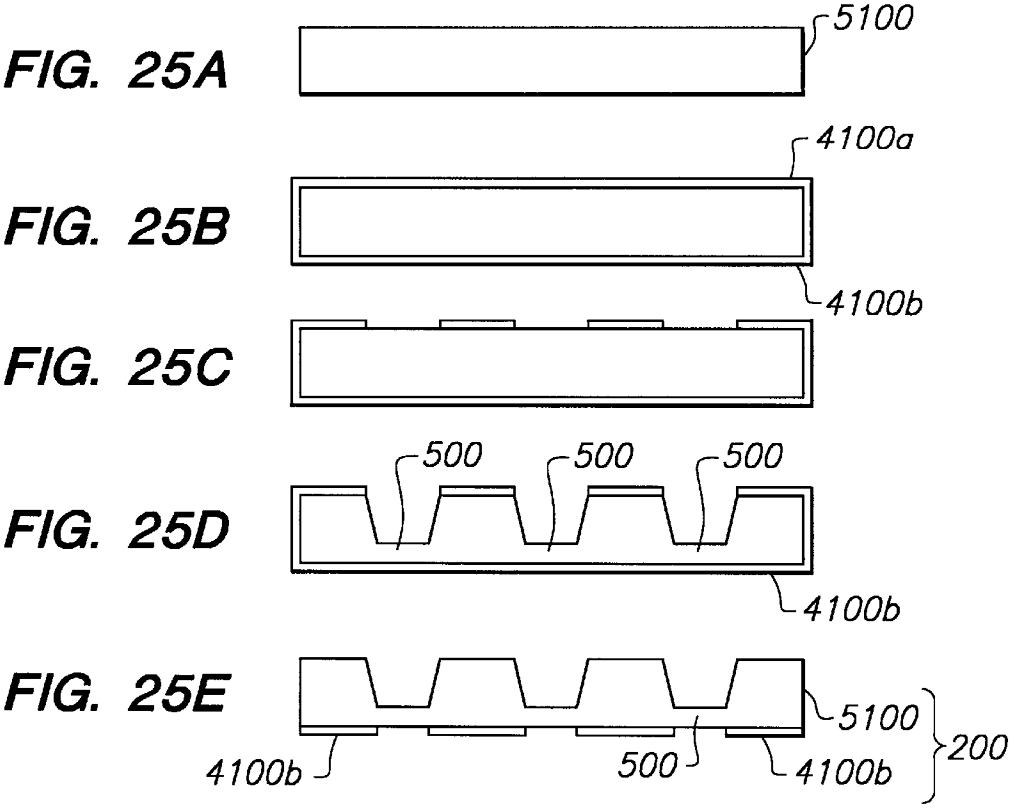
FIG. 25A
FIG. 25B
FIG. 25C
FIG. 25D
FIG. 25E

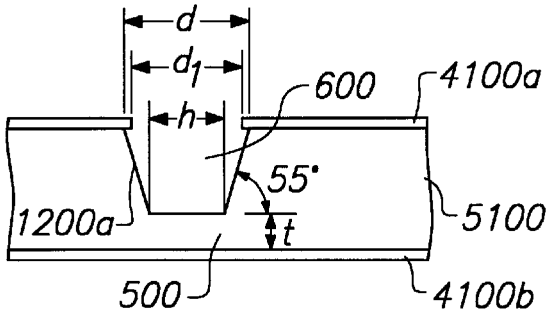
FIG. 26
FIG. 27A
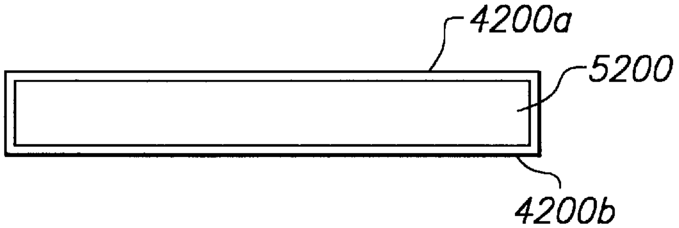
FIG. 27B
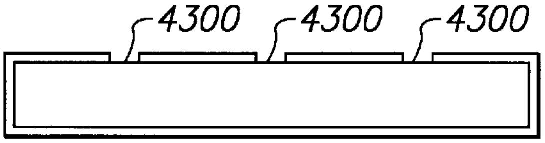
FIG. 27C
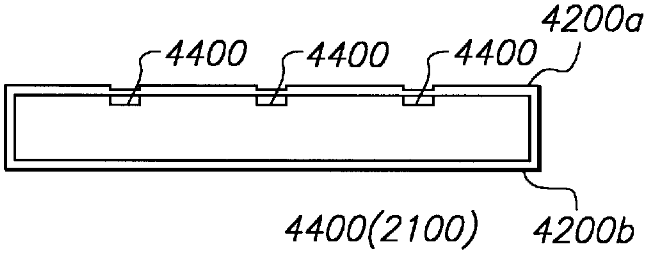
FIG. 27D
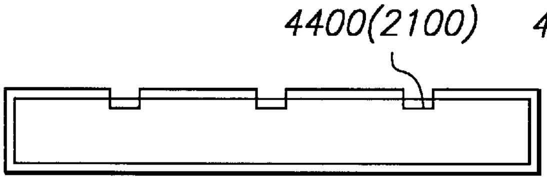
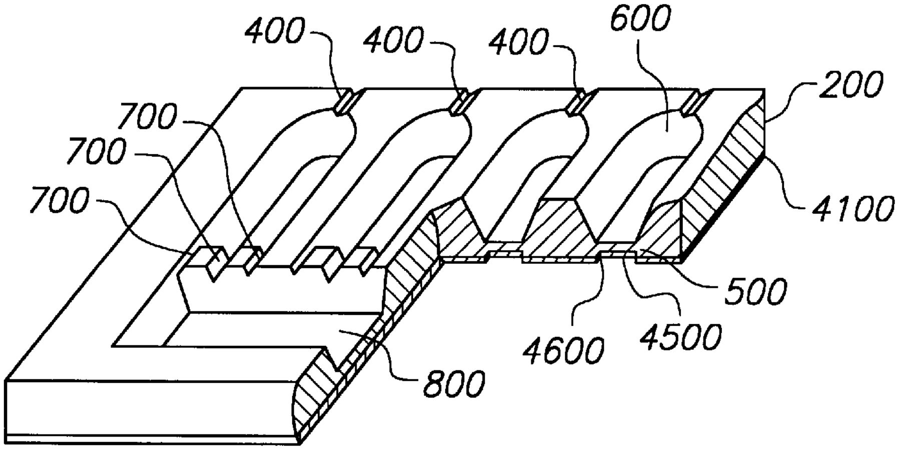
FIG. 28

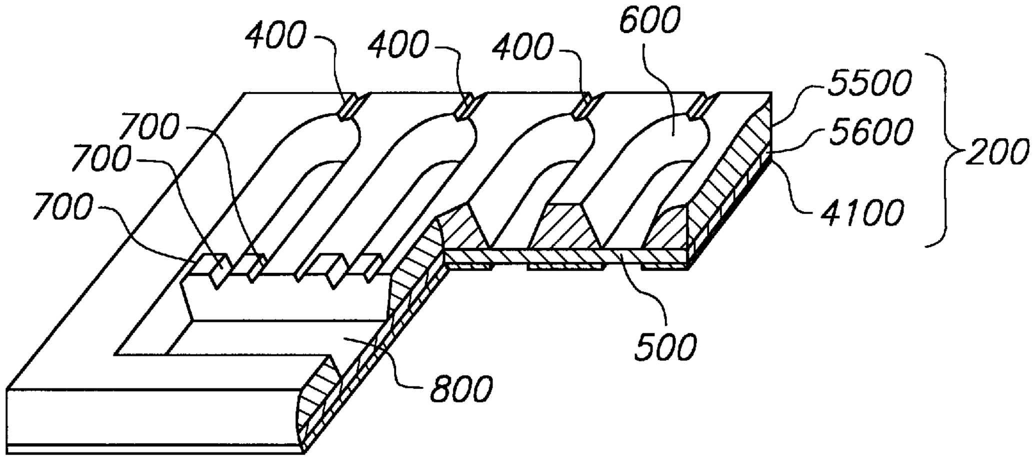
FIG. 32
FIG. 33A
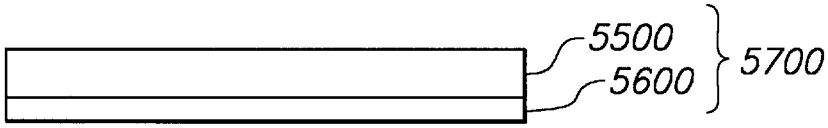
FIG. 33B
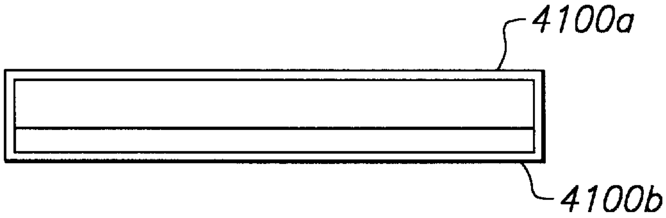
FIG. 33C
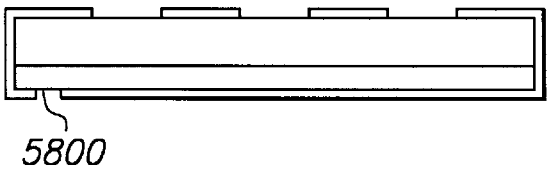
FIG. 33D
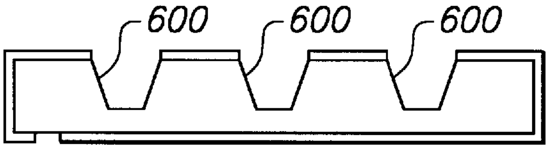
FIG. 33E
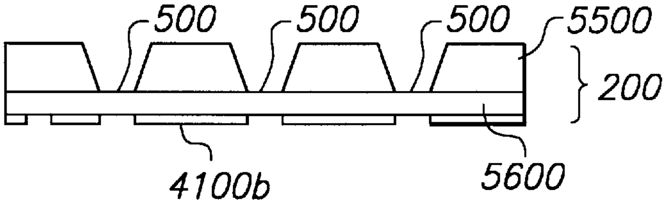

FIG. 36A
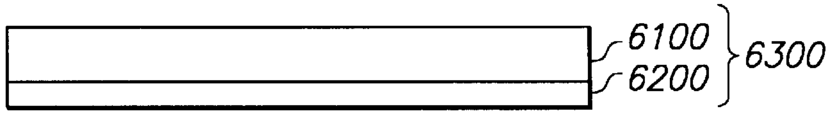
FIG. 36B
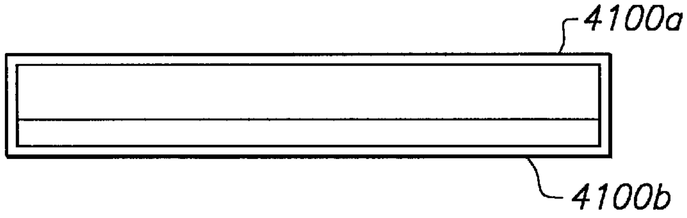
FIG. 36C
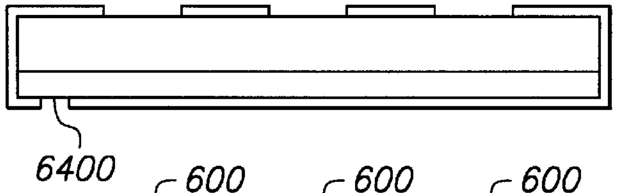
FIG. 36D
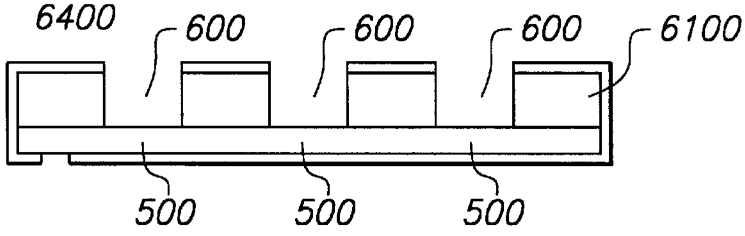
FIG. 36E
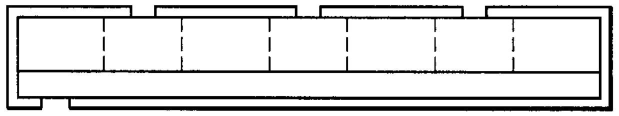
FIG. 36F
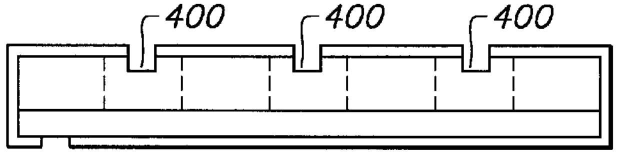
FIG. 36G
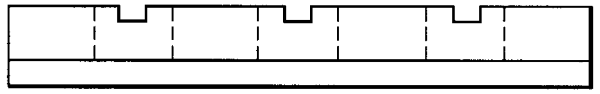
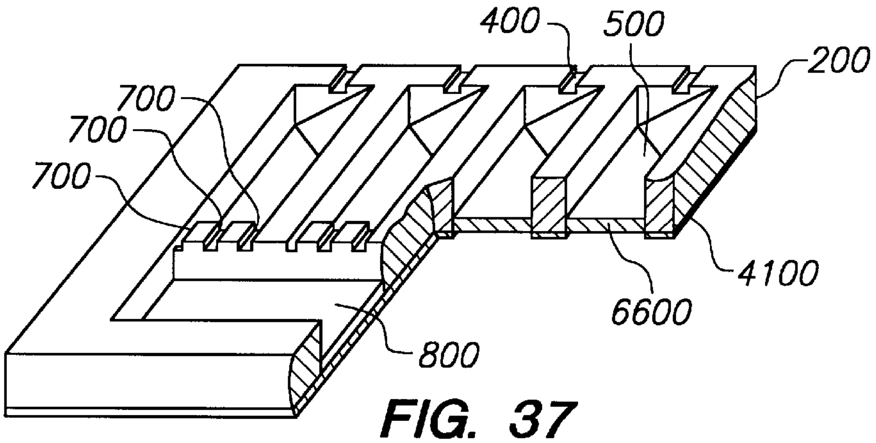
FIG. 37

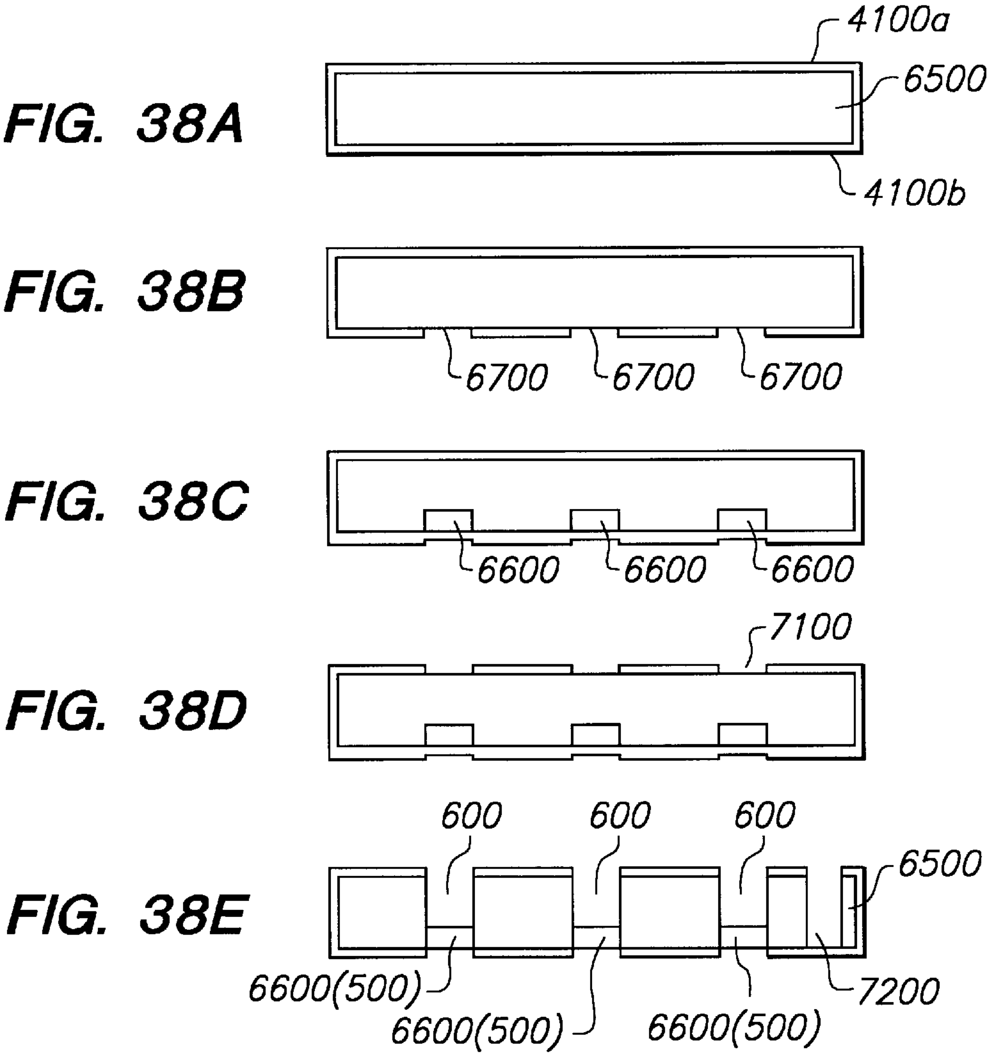
FIG. 38A
FIG. 38B
FIG. 38C
FIG. 38D
FIG. 38E
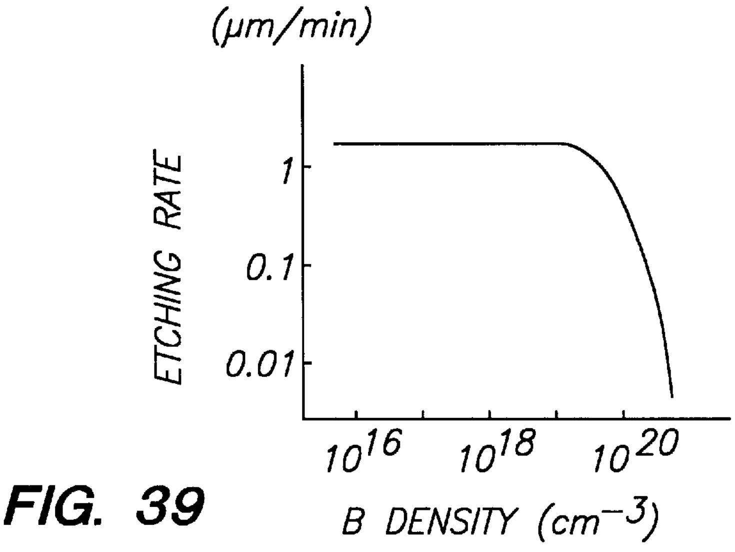
FIG. 39

METHOD FOR PRODUCING THE HEAD OF AN INK-JET RECORDING APPARATUS

CROSS REFERENCE TO RELATED APPLICATIONS

This is a Divisional of pending prior application Ser. No. 08/477,681 filed on Jun. 7, 1995 which is a continuation-in-part of Ser. No. 07/757,691, filed on Sep. 11, 1991, now U.S. Pat. No. 5,534,900, and Ser. No. 08/069,198 filed on May 28, 1993, which is now abandoned, the contents of which are incorporated herein by reference.

BACKGROUND OF THE INVENTION

1. Field of the Invention

The present invention relates to an ink-jet recording apparatus in which ink drops are ejected and deposited on a surface of recording paper only when recording is required. In particular, the present invention relates to a small-sized high-density ink-jet recording apparatus produced through application of a micro-machining technique, and relates to a method for producing an ink-jet head as a main part of such an ink-jet recording apparatus.

2. Description of the Prior Art

Ink-jet printers are advantageous in that noise is extremely low at the time of recording, high-speed printing can be made, the degree of freedom of ink is so high that inexpensive ordinary paper can be used, and so on. Among those ink-jet recording apparatuses, an ink-on-demand type apparatus in which ink drops are ejected only when recording is required has been the focus of attention because it is not necessary to recover unused ink drops.

In such an ink-on-demand type apparatus, as described, for example, in Japanese Patent Post-Examination Publication No. Hei-2-51734, or Japanese Laid Open Publication No. 1986-59911, a print head is constituted by: a plurality of nozzle openings arranged in parallel to each other to eject ink drops therefrom; a plurality of independent ejection chambers respectively communicated with the corresponding nozzle openings and each having walls one of which is partly formed to serve as a diaphragm; a plurality of piezoelectric elements respectively attached on the corresponding diaphragms so as to serve as electromechanical transducers; and a common ink cavity for supplying ink to the each of the ejection chambers. In such a print head, upon application of a printing pulse voltage to any one of the piezoelectric elements, the diaphragm corresponding to this piezoelectric element is mechanically distorted so that the volume of the associated ejection chamber and the pressure in the chamber increases instantaneously. As a result, an ink drop is ejected from the ejection chamber nozzle opening towards a recording sheet.

In the aforementioned structure of the conventional ink-jet recording apparatus, however, much labor and time are required for mounting such piezoelectric elements on the ejection chambers. The piezoelectric elements themselves are made by slicing off tiny portions of a suitable base material. Electrodes for driving the piezoelectric elements are then formed therein. Maintaining size and material uniformity here are critical in order to minimize distortion effects caused by piezoelectric element production scattering. In some cases, irregular elements will cause noticeable variations in ink drop ejection speeds among the ink jet nozzles, leading to undesirable smearing or underprinting in the resultant image.

Once suitable piezoelectric elements are manufactured, they are painstakingly attached to each individual nozzle chamber with an adhesive agent. Interposing such an agent between the substrate and the piezoelectric element serves as a semi-insulator between the substrate and the piezoelectric element, thus reducing the driving efficiency of the ink jet recording apparatus. This is turn requires stronger driving voltages and ultimately reduces the lifetime of the ink jet recording apparatus.

Finally, the latest printer designs demand high speed and high printing quality, which in turn increases the overall number of nozzle openings and increases the density of the ink jet head device. As discussed above, since a separate piezoelectric element is required for each nozzle, machining becomes less accurate and troublesome to implement, and results in a lower product yield and product quality.

Other than the above system in which the diaphragms are driven by the piezoelectric elements, there is a system in which the ink in the ejection chambers is heated as discussed in either Japanese Patent Post-Examination Publication No. Sho-61-59911 or Japanese Laid Open Publication 1986-59911. In this system, the ink in the ejection chambers is heated by a heatings means to induce ink evaporation and generate gas bubbles within the ink. As the ink begins to boil, pressure from the bubbles inside the chambers build. Eventually, this pressure build-up will force ink drops to be released through the nozzles.

This heating system is advantageous in that the heating resistors can be formed of thin-film resistors of $TaSiO_2$, NiWP or similar material created by spattering, CVD, evaporating deposition, plating or other well-known techniques. The system, however, has a problem in that the lifetime of the head itself is short because the delicate heating resistors are injured by repetition of heating/quenching cycles and microshocks produced by the breaking ink bubbles.

It is therefore an object of the present invention to provide an ink-jet recording apparatus which is small in size, high in density, high in printing speed, high in printing quality, long in life and high in reliability. This can by accomplished by employing a driving system using electrostatic force instead of the aforementioned piezoelectric or heating type systems.

It is another object of the present invention to provide an ink-jet recording apparatus having a structure which is formed by application of a micro-machining technique and which is suitable for mass- production thereof.

It is a further object of the present invention to provide a method suitable for production of an ink-jet head as a main part of the ink-jet recording apparatus which can attain these objects.

SUMMARY OF THE INVENTION

To attain the foregoing objects, according to the present invention, the ink-jet recording apparatus comprises an ink-jet head including a plurality of nozzle openings, a plurality of independent ejection chambers respectively correspondingly communicated with the nozzle openings, diaphragms respectively correspondingly formed in the ejection chambers partly on at least one side walls of the ejection chambers, a plurality of driving means for respectively correspondingly driving the diaphragms, and a common ink cavity for supplying ink to the plurality of ejection chambers. Upon application of electric pulses to the plurality of driving means, the driving means respectively correspondingly distort the diaphragms in the direction of increasing the respectively pressures in the ejection chambers to eject ink drops from the nozzle openings onto recording paper. The respective driving means are constituted by electrodes formed on the substrate to distort the diaphragms by electrostatic force.

More particularly, when a pulse voltage is applied to an electrode, the corresponding diaphragm is attracted and distorted by the negative or positive charge present on the surface of this diaphragm. Then, the volume of the corresponding ejection chamber is reduced by the restoring force of the diaphragm when the electrode is de-energized. As a result, the pressure in the ejection chamber increases instantaneously to thereby eject an ink drop from its nozzle opening. Because the driving of the diaphragms is controlled by such an electrostatic action, not only this apparatus can be produced by a micro-machining technique, but it can be made small in size, high in density, high in printing speed, high in printing quality, and long in lifetime.

Preferably, the ink-jet head has a lamination structure formed by bonding at least three substrates stacked one on top of another. The ejection chambers will respectively have bottom portions used for the diaphragms which may be provided on an intermediate one of the substrates, and the electrodes will be positioned preferably on the lowermost substrate and in alignment with these diaphragms when the substrates are brought together. Although the rear wall of each ejection chamber can be used as an electrostatic diaphragm, a bottom wall arrangement is preferred because known substrate lamination techniques can be used to make the entire ink jet head thinner. Also, it is preferable that the electrodes be coated with an insulating film not only to protect the electrodes but to prevent the electrodes from short-circuiting with the diaphragms when charged.

To increase the pressure in each of the ejection chambers, both the upper and lower walls of the ejection chamber may include diaphragms. In this case, the electrodes are provided for each chamber diaphragm to permit synchronous drive action, so that a higher chamber volume can be displaced. Accordingly, the driving voltages of the electrodes can be set to preferably lower values.

Further, preferably, each of the diaphragms is shaped to be a rectangle or a square. Each of the diaphragms is supported through bellows-like grooves formed on opposite sides or on all four sides of the rectangle or square. Alternatively, only one side need incorporate the bellow grooves to create a cantilever, so that the diaphragm can move over a relatively wide range. However, in the case of the cantilever type diaphragm, insulating ink is used because there is a possibility that ink comes into contact with the electrode portion, thus posing a short circuit risk between the electrode and the power supply.

Further, a pair of electrodes may be provided for each diaphragm in order to increase electrostatic action. In this case, the two electrodes may be arranged so that a first electrode is provided inside a vibration chamber just underneath the diaphragm, while the second electrode is provided outside the vibration chamber. Alternatively, both electrodes may be arranged inside the vibration chamber and connected to an oscillation circuit so that electric pulses opposite to each other in polarity are respectively alternately applied to the two electrodes. Moreover, by providing a metal electrode opposite the diaphragm electrode, the energization/de-energization sequence can be speeded up, and injection/disappearance of charge can be made high so that it is made possible to realize higher-frequency drive pulses and thereby obtain higher printing speed levels.

The nozzle openings themselves can be arranged at equal intervals on an edge of the intermediate substrate in laminated structure to achieve a so-called edge printing ink-jet head. Alternatively, the nozzle openings may be arranged at equal intervals in the upper substrate just above the ejection chambers in a so-called face ink-jet head.

Further, it is preferable that a gap holding means to maintain a predetermined separation between each electrode-diaphragm pair be included in the ink-jet head. Inclusion of an optimally-sized gap holding means permits high quality printing and good image stability while keeping drive voltages relatively low. Experimentation with particular gap sizes has revealed that good printing results can be obtained where the gap between electrode and diaphragm ranges from 0.2 $\mu$m to 2.0 $\mu$m. When the gap size is reduced below 0.05 $\mu$m, the volume of ink emitted is not enough to completely print letters. Furthermore, the diaphragm could contact the electrode and actually shatter or crack it. Conversely, a gap greater than 2.0 $\mu$m forces use of infeasibly high driving voltages in order to produce the desired electrostatic movement.

According to the presently preferred embodiment, the middle and lower substrates are formed from mono-crystal silicon. A $SiO_2$ membrane is formed on the connecting face of either of these substrates for maintaining a gap between the electrode and diaphragm. The thickness of this membrane determines the gap size between the electrode and-diaphragm. The $SiO_2$ membrane can be deposited by thermal oxidation of pure Si, spattering or sintering of an inorganic silicon compound, a CVD vaporizing process or a Sol-Gel process.

Alternatively, the ejection chamber could include a single diaphragm forming the bottom surface of said chamber, and the gap holding means may be formed by selectively etching a portion of the middle substrate defining the diaphragm. In this case, the portions of the middle substrate immediately beneath the diaphragms is etched away to form indentations or dents therein. When bonded to the lower substrate containing the corresponding electrodes, the dents are sealed off to complete the vibrating chamber. The depth of the dent determines the gap size and can be easily controlled through known etching techniques. Alternatively, the dent can be formed the lower substrate near the electrode or through a combination of etching both the middle and lower substrates.

According to yet another embodiment, the electrode is covered by a dielectric membrane. This results in an electrostatic gap formed between the electrode and the diaphragm. This dielectric layer can also protect against possible electrostatic shorting problems.

According to still another embodiment, the gap holding means comprises a photosensitive resin layer or an insulating adhesive agent patterned about each electrode.

According to still another embodiment of the ink jet head of the present invention, the ink jet head includes a second electrode integrally formed in the diaphragm so as to maintain a predetermined gap between the diaphragm and opposingly charged first electrode. Here, the second or diaphragm electrode is formed by doping p-type or n-type impurities into the diaphragm layer. This embodiment is especially advantageous because the presence of the second electrode reduces overall electrical resistance, as previously discussed.

According to another embodiment of the ink-jet head of the present invention, the gap distance holding means comprises a gap spacer formed by a boro-silicated glass membrane previously formed on at least one face of the connecting portion of the middle and lower substrates. The boro-silicated glass membrane is produced by a known spattering process.

According to still another embodiment of the ink-jet head of the present invention, the diaphragm is formed by doping n-type impurities layer or a high density p-type impurities layer within the lower substrate. This arrangement can improve the driving frequency and crosstalk of the ink-jet head.

According to yet another embodiment of the present invention, the middle substrate is a silicon substrate of crystal face direction (110) made by epitaxially growing a n-type impurities layer on a p-type silicon substrate. In this embodiment, it is possible to make the side walls of the ink cavity perpendicular to the face of the silicon substrate while still etching horizontally to achieve a minimal nozzle pitch distance, and so attain a small and high density of the ink-jet head.

The method for producing the ink-jet according to the present invention comprises: a step in which a nozzle substrate (the above-mentioned middle substrate and upper substrates) is prepared by anisotropically etching a silicon mono-crystal substrate so as to form important portions of the substrate; another step in which an electrode substrate (the above mentioned lower substrate) is prepared by forming electrodes only or electrodes and an insulating film on a substrate; and a further step in which the nozzle substrate and the electrode substrate are bonded with each other through anodic treatment.

Preferably being in the form of a mono-crystal, silicon can be subjected to anisotropic etching. For example, the (100) face can be etched regularly in the direction of 550. The (111) face can be etched in the direction of 900. By using this property of silicon, it is possible to form the respective important parts, such as nozzle openings, ejection chambers, orifices, an ink cavity, etc., with high accuracy. Finally, the silicon nozzle substrate and the electrode substrate (constituted by a glass or insulating plate which is near in thermal expansion coefficient to silicon) in which electrodes and an insulating film are formed are put on each other and heated at a temperature of 300° C. to 500° C. At the same time, a voltage of the order of hundreds of volts is applied between the silicon side as an anode and the electrode substrate side as a cathode to stick the substrate to each other through anodic bonding. Thus, an ink-jet head being high in airtightness can be produced.

More particularly, according to a preferable mode of manufacturing the ink-jet head according to the present invention, an $SiO_2$ membrane of a predetermined thickness is pattern-formed on the connecting face of the middle silicon substrate forming the diaphragm excepting those areas constituting the diaphragm, and of pattern-forming of $SiO_2$ membrane of a predetermined thickness on the connecting face of the lower silicon substrate forming the electrode excepting those areas constituting the electrode, and of anode bonding together the middle and lower silicon substrates through the $SiO_2$ membrane by means of a Si direct connecting process.

According to another embodiment of the ink-jet head manufacturing method of the present invention, the method includes a diaphragm forming step carried out by alkali anisotropy etching the middle silicon substrate, and an electrode manufacturing step consisting of conventional p-type or n-type doping of the electrode areas on the lower silicon substrate.

Another embodiment of the ink-jet manufacturing method includes a step of forming a n-type impurity layer on a p-type silicon substrate, and a step of forming the diaphragm by performing an electrochemical anisotropy etching process on this silicon substrate.

According to still another embodiment of the ink-jet head manufacturing method of the present invention, the anode bonding method for bonding the middle substrate to the lower substrate includes a step for controlling the voltage difference between the diaphragm and the electrode during anode bonding. In this embodiment, the potential of the electrode is made identical with that of the diaphragm. When the potential between the diaphragm and the electrode is controlled or lowered, it is possible to prevent discharging between the diaphragm and the electrode as well as disperse their electric fields when during anode-bonding. This prevents peeling-off of the dielectric membrane due to static electricity attractive force generation, and of electrode melting or stress fracturing of the diaphragm.

According to still another embodiment of the ink-jet head manufacturing method of the present invention, the anode bonding process comprises forming a common electrode adapted to be connected to respective electrode on the lower substrate, controlling or decreasing a potential between the diaphragm and the common electrode when the middle and lower substrates are anode-bonded, and separating the common electrode from the electrode after the anode-connecting process.

According to another embodiment, the gap between the diaphragm and the electrode is exposed to outside air before the anode bonding, and is sealed by a sealing member after the anode connection process is done.

BRIEF DESCRIPTION OF THE DRAWINGS

A better understanding of the invention can be had when the following detailed description of the alternative embodiments are considered in conjunction with the following drawings, in which:

FIG. 24 is an enlarged perspective view of a part of the thirteenth embodiment of the present invention.

FIGS. 25(*a*) to 25(*e*) show a manufacturing step diagram of the middle substrate according to the thirteenth embodiment.

FIG. 26 illustrates diaphragm measurements according to the thirteenth embodiment of the present invention.

FIGS. 27(*a*) to 27(*d*) show a manufacturing step diagram of the lower substrate of the thirteenth embodiment.

FIG. 28 is a perspective view of the middle substrate of the thirteenth embodiment of the ink-jet head according to the present invention.

FIG. 32 is a perspective view of the middle substrate of the ink-jet head according to the sixteenth embodiment of the present invention.

FIGS. 33(*a*) to 33(*e*) show a manufacturing step diagram of the middle substrate according to the sixteenth embodiment of the present invention.

FIGS. 36(*a*) to 36(*g*) show a manufacturing step diagram of the middle substrate of the seventeenth embodiment.

FIG. 37 is a perspective view of the middle substrate of the ink-jet head according to the eighteenth embodiment of the present invention.

FIGS. 38(*a*) to 38(*e*) show a manufacturing step diagram of the middle substrate according to the eighteenth embodiment of the present invention.

FIG. 39 is a relationship view of boron density and etching rate at an alkali anisotropic etching process according to the present invention.

FIG. 43 is a plan view of the lower substrate shown in FIG. 42.

DESCRIPTION OF THE PREFERRED EMBODIMENTS

Embodiment 1

Figure 1:
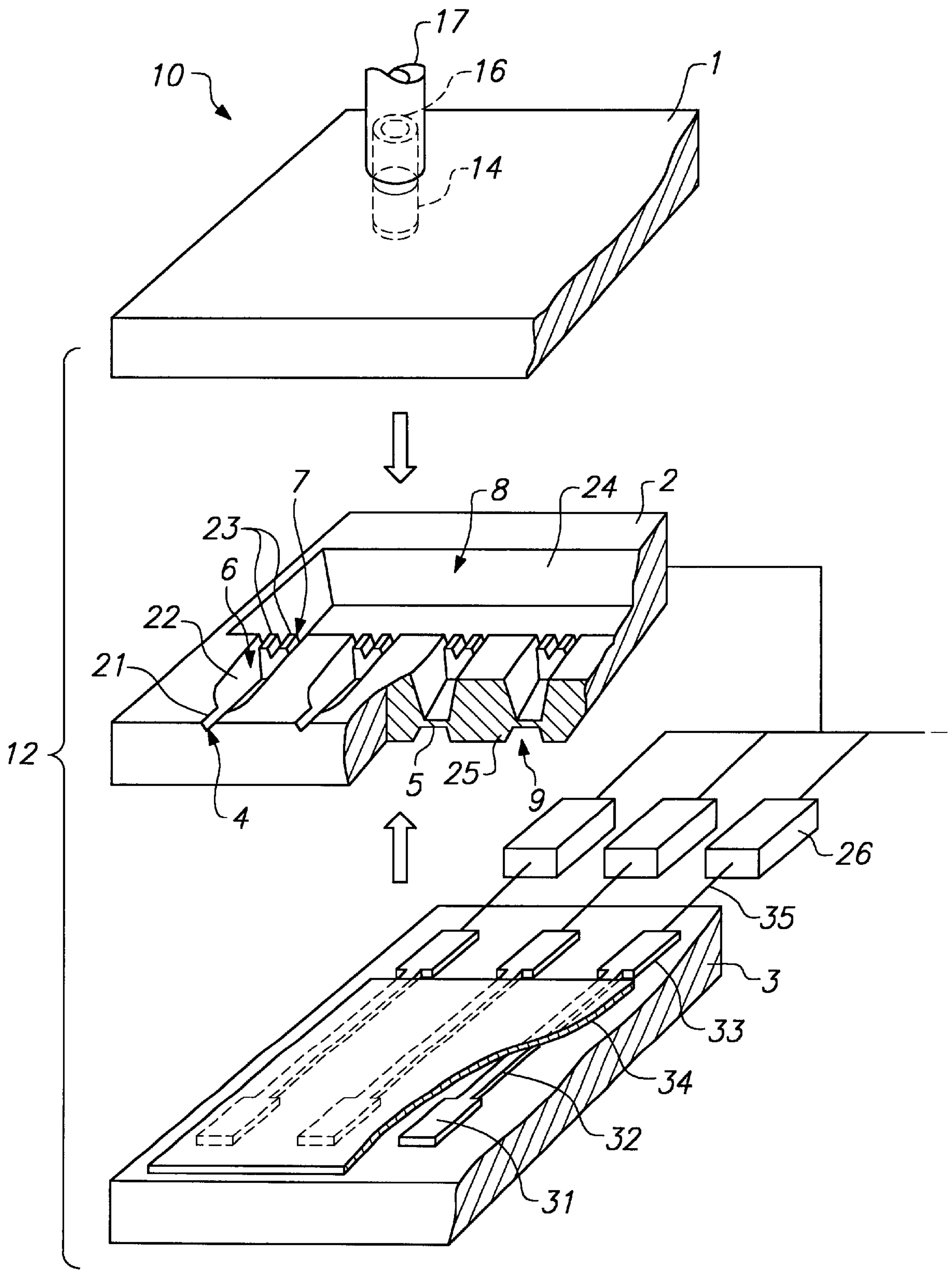
FIG. 1 is an exploded perspective view partly in section, showing main parts of a first embodiment of the present invention.
Figure 3:
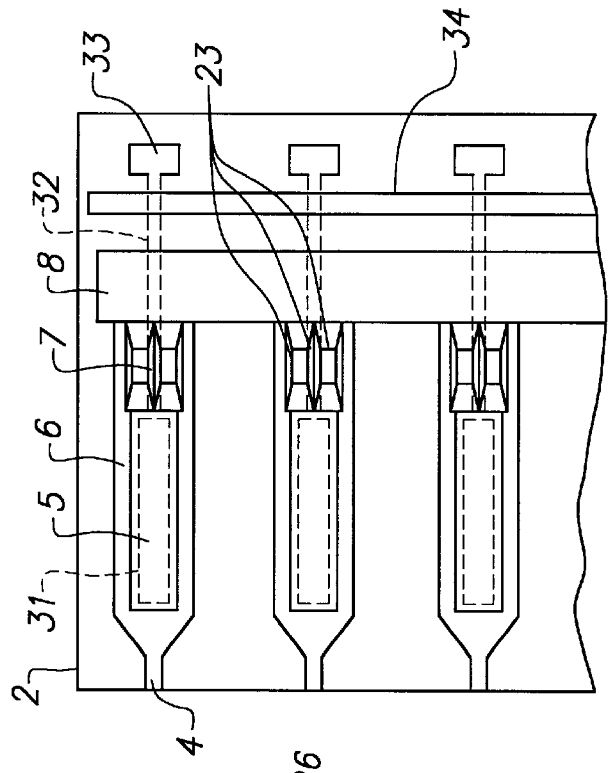
FIG. 3 is a view taken on line A—A of FIG. 2.
Figure 2:
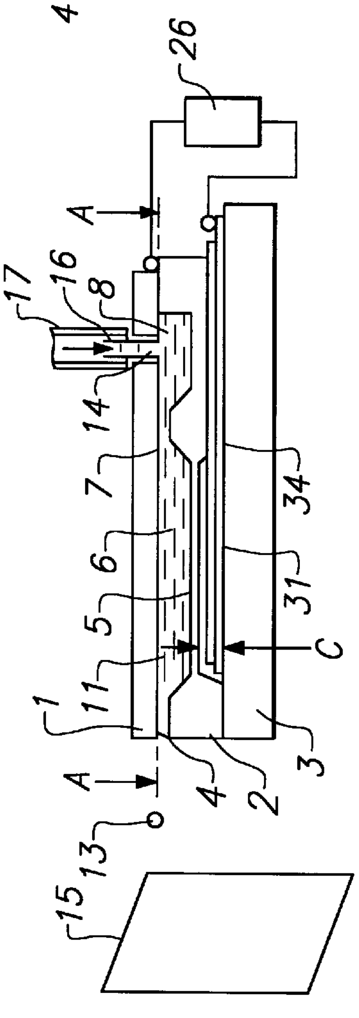
FIG. 2 is a sectional side view of the first embodiment of FIG. 1 after assembly.

FIG. 1 is a partly exploded perspective view partly in section, of an ink-jet recording apparatus according to a first embodiment of the present invention. The illustrated embodiment relates to an edge ink-jet type apparatus in which ink drops are ejected from nozzle openings formed in an end portion of a substrate. FIG. 2 is a sectional side view of the whole apparatus after assembly. FIG. 3 is a view taken on line A—A of FIG. 2.

As shown in the drawings an ink-jet head 12 as a main portion of an ink-jet recording apparatus 10 has a lamination structure in which three substrates 1, 2 and 3 are stuck to one another as will be described hereunder.

An intermediate or middle substrate 2 such as a silicon substrate has: a plurality of nozzle grooves 21 arranged at equal intervals on a surface of the substrate and extending in parallel to each other from an end thereof to form nozzle openings; concave portions 22 respectively communicated with the nozzle grooves 21 to form ejection chambers 6 respectively having bottom walls serving as diaphragms 5; fine grooves 23 respectively provided in the rear of the concave portions 22 and serving as ink inlets to form orifices 7; and a concave portion 24 to form a common ink cavity 8 for supplying ink to the respective ejection chambers 6. Further, concave portions 25 are respectively provided under the diaphragms 5 to form vibration chambers 9 so as to mount electrodes as will be described later. The nozzle grooves 21 are arranged at intervals of the pitch of about 2 mm. The width of each nozzle groove 21 is selected to be about 40 μm. For example, the upper substrate 200 stuck onto the upper surface the intermediate substrate 2 is made by glass or resin. The nozzle openings 4, the ejection chambers 6, the orifices 7 and the ink cavity 8 are formed by bonding the upper substrate 200 on the intermediate substrate 2. An ink supply port 14 communicated with the ink cavity 8 is formed in the upper substrate 200. The ink supply port 14 is connected to an ink tank (not shown), through a connection pipe 14 and a tube 17.

For example, the lower substrate 3 to be bonded on the lower surface of the intermediate substrate 2 is made by glass or resin. The vibration chambers 9 are formed by bonding the lower substrate 3 on the intermediate substrate 2. At the same time, electrodes are formed on a surface of the lower substrate 3 and in positions corresponding to the respective diaphragms 5. Each of the electrodes 31 has a lead portion 32 and a terminal portion 33. The electrodes 31 and the lead portions 32 except the terminal portions 33 are covered with an insulating film 34. The terminal portions 33 are respectively correspondingly bonded to lead wires 35.

The substrates 1, 2 and 3 are assembled to constitute an ink-jet head 12 as shown in FIG. 2. Further, oscillation circuits 26 are respectively correspondingly connected between the terminal portions 33 of the electrodes 31 and the intermediate substrate 2 to thereby constitute the ink-jet recording apparatus 10 having a lamination structure according to the present invention. Ink 11 is supplied from the ink tank (not shown) to the inside of the intermediate substrate 2 through the ink supply port 14, so that the ink cavity 8, the ejection chambers 6 and the like are filled with the ink. The distance c between the electrode 31 and the corresponding diaphragm 5 is kept to be about 1 μm. In FIG. 2, the reference numeral 13 designates an ink drop ejected designates from the nozzle opening 4, and 15 designates recording paper. The ink used is prepared by dissolving/dispersing a surface active agent such as ethylene glycol and a dye (or a pigment) into a main solvent such as water, alcohol, toluene, etc. Alternatively, hot-melt ink may be used if a heater or the like is provided in this apparatus.

In the following, the operation of this embodiment is described. For example, a positive pulse voltage generated by one of the oscillation circuits 26 is applied to the corresponding electrode 31. When the surface of the electrode 31 is charged with electricity to a positive potential, the lower surface of the corresponding diaphragm 5 is charged with electricity to a negative potential. Accordingly, the diaphragm 5 is distorted downward by the action of the electrostatic attraction. When the electrode 31 is then made off, the diaphragm 5 is restored. Accordingly, the pressure in the ejection chamber 6 increases rapidly, so that the ink drop 13 is ejected from the nozzle opening 4 onto the recording paper 15. Further, the ink 11 is supplied from the ink cavity 8 to the ejection chamber 6 through the orifice 7 by the downward distortion of the diaphragm 5. As the oscillation circuit 26, a circuit for alternately generating a zero voltage and a positive voltage, an AC electric source, or the like, may be used. Recording can be made by controlling the electric pulses to be applied to the electrodes 31 of the respective nozzle openings 4.

Here, the quantity of displacement, the driving voltage and the quantity of ejection of the diaphragm 5 are calculated in the case where the diaphragm 5 is driven as described above.

The diaphragm 5 is shaped like a rectangle with short side length 2$a$ and long side length b. The four sides of the rectangle are supported by surrounding walls. When the aspect ratio (b/2a) is large, the coefficient approaches to 0.5, and the quantity of displacement of the thin plate (diaphragm) subjected to pressure P can be expressed by the following formula because the quantity of displacement depends on a.

$$w=0.5\times Pa^4/Eh^3 \qquad (1)$$

In the formula, w: the quantity of displacement (m)

p: pressure (N/m$^2$)

a: a half length(m) of the short side h: the thickness k(m) of the plate (diaphragm)

E: Young's modulus (N/m$^2$, silicon $11\times10^{10}$ N/m$^2$)

The pressure of attraction by electrostatic force can be expressed by the following formula.

$$P=\tfrac{1}{2}\times\epsilon\times(V/t)^2$$

In the formula,

ε: the dielectric constant (F/m, the dielectric constant in vacuum: $8.8\times10^{-12}$ F/m)

V: the voltage (V)

t: the distance (m) between the diaphragm and the electrode

Accordingly, the driving voltage V required for acquiring necessary ejection pressure can be expressed by the following formula.

$$V=t(2P/c)^{1/2} \qquad (2)$$

Figure 4B:
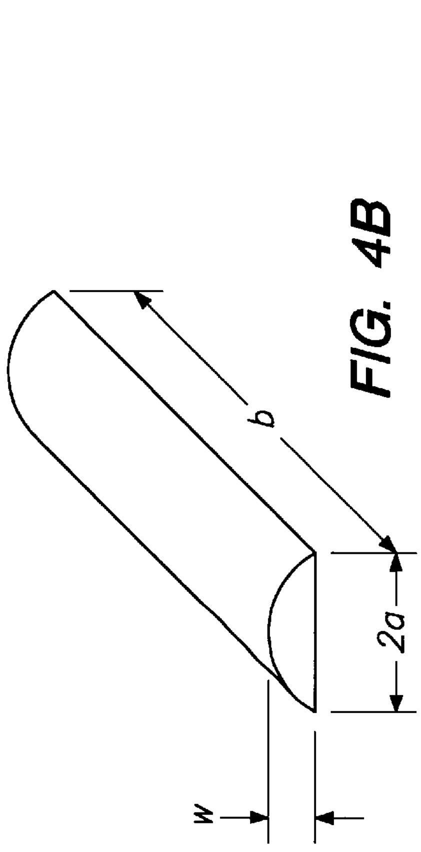
FIGS. 4A and 4B show explanatory views concerning the design of a diaphragm, FIG. 4A being an explanatory view showing the size of a rectangular diaphragm, FIG. 4B being an explanatory view for calculating ejection pressure and ejection quantity.
Figure 4A:
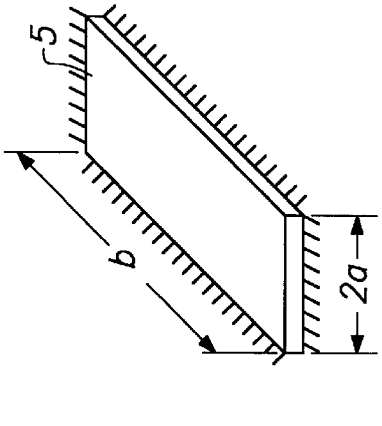

In the following, the volume of a semi-cylindrical shape as shown in FIG. 4(B) is calculated to thereby calculate the quantity of ejection.

The following formula can be obtained because the equation Δw=4/3×abw is valid.

$$w=\tfrac{3}{4}\times\Delta w/ab \qquad (3)$$

When the formula (3) is substituted into the equation $P=2w\times Eh^3/a^4$ obtained by rearranging the formula (1), the following formula(4) can be obtained.

$$P=3/2\times\Delta Eh^3/a^5b \qquad (4)$$

When the formula (4) is substituted into the formula (2), the following formula can be obtained.

$$V=t\times(3Eh^3\ \Delta w/\epsilon b)^{1/2}\times(1/a^5)^{1/2} \qquad (5)$$

That is, the driving voltage required for acquiring the quantity of ejection of ink is expressed by the formula (5).

Figure 5A:
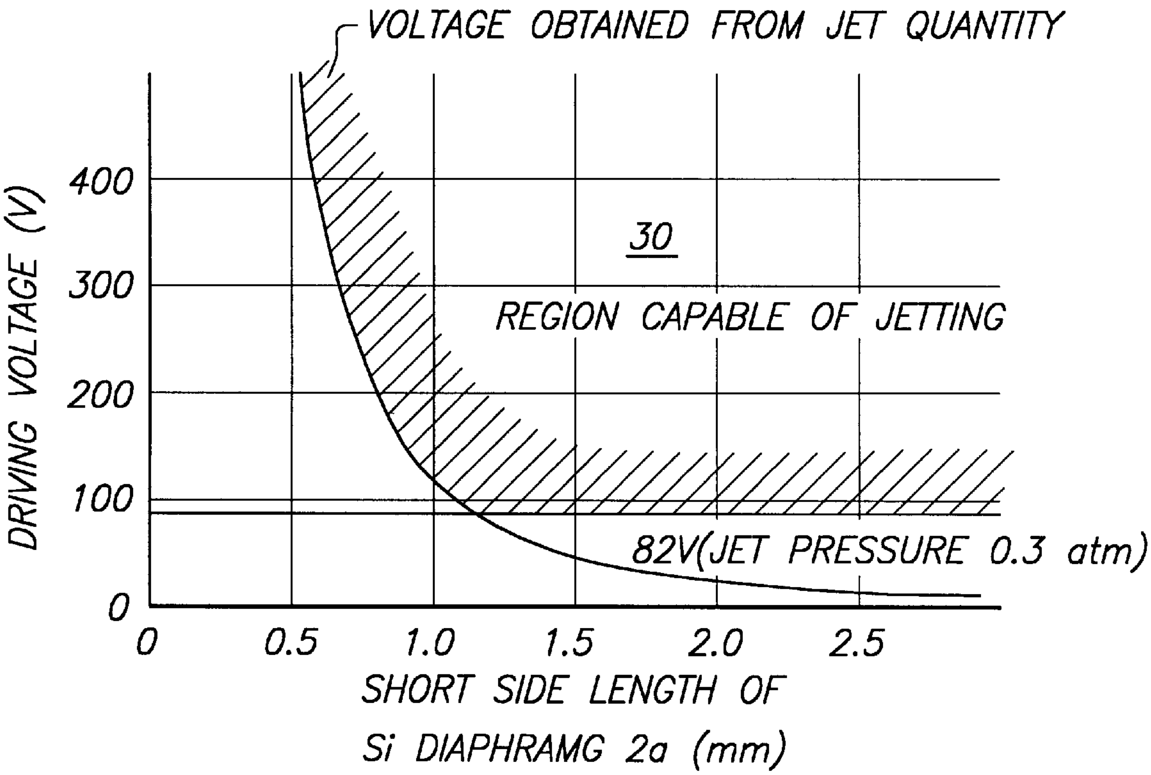
FIG. 5A is a graph showing the relationship between the length of the short side of the diaphragm and the driving voltage.
Figure 5B:
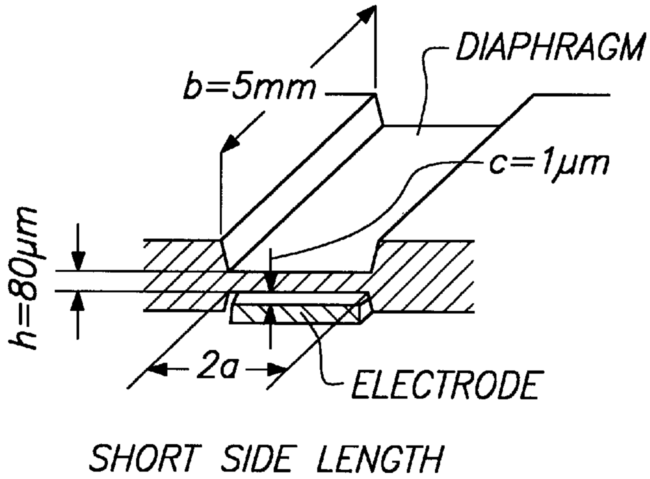
FIG. 5B illustrates, in detail, the diaphragm structure of the first embodiment.

The allowable region of ink ejection as shown in FIG. 5A can be calculated on the basis of the formulae (2) and (5). FIG. 5A shows the relationship between the short side length 2$a$(mm) and the driving voltage (V) in the case where the long side length b of the silicon diaphragm, the thickness h thereof and the distance c between the diaphragm and the electrode are selected to be 5 mm, 80 μm and 1 μm respectively. The ejection allowable region 30 is shown by the oblique lines in FIG. 5A when the jet (ejection) pressure P is 0.3 atm.

Although it is more advantageous for the diaphragm to make the size of the diaphragm larger, the appropriate width of the nozzle in the direction of the pitch is within a range of from about 0.5 mm to about 4.0 mm in order to make the nozzle small in size and high in density.

The length of the diaphragm is determined according to the formula (4) on the basis of the quantity of ejection of ink as a target, the Young's modulus of the silicon substrate, the ejection pressure thereof and the thickness thereof.

When the width is selected to be about 2 mm, it is necessary to select the thickness of the diaphragm to be about 50 μm or more on the consideration of the ejection rate. If the diaphragm is drastically thicker than the above value, the driving voltage increases abnormally as obvious from the formula (5). If the diaphragm is too thin, the ink-jet ejection frequency cannot be obtained. That is, a large lag occurs in the frequency of the diaphragm relative to the applied pulses for ink jetting.

After the ink-jet head 12 in this embodiment was assembled into a printer, ink drops were flown in the rate of 7 m/sec by applying a voltage of 150 V with 5 KHz. When printing was tried at a rate of 300 dpi, a good result of printing was obtained.

Though not shown, the rear wall of the ejection chamber may be used as a diaphragm. The head itself, however, can be more thinned by using the bottom wall of the ejection chamber 6 as a diaphragm as shown in this embodiment.

Embodiment 2

Figure 6:
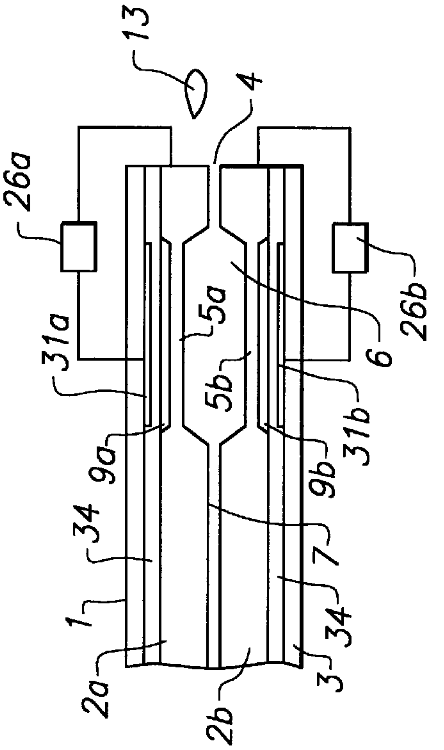
FIG. 6 is a sectional view of a second embodiment of the present invention.

FIG. 6 is a sectional view of a second embodiment of the present invention showing an edge ink-jet type apparatus similarly to the first embodiment.

In this embodiment, the upper and lower walls of the ejection chamber 6 are used as diaphragms 5*a* and 5*b*. Therefore, two intermediate substrates 2*a* and 2*b* are used and stuck to each other through the ejection chamber 6. The diaphragms 5*a* and 5*b* and vibration chambers 9*a* and 9*b* are respectively formed in the substrates 2*a* and 2*b*. The substrates 2*a* and 2*b* are arranged symmetrically with respect to a horizontal plane so that the diaphragms 5*a* and 5*b* form the upper and lower walls of the ejection chamber 6. The nozzle opening 4 is formed in an edge junction surface between the two substrates 2*a* and 2*b*. Further, electrodes 31*a* and 31*b* are respectively provided on the lower surface of the upper substrate 200 and on the upper surface of the lower substrate 3 and respectively mounted into the vibration chambers 9*a* and 9*b*. Oscillation circuits 26*a* and 26*b* connected respectively between the electrode 31*a* and the intermediate substrate 2*a* and between the electrode 31*b* and the intermediate substrate 2*b*.

In this embodiment, the diaphragms 5*a* and 5*b* can be driven by a lower voltage because an ink drop 13 can be ejected from the nozzle opening 4 by symmetrically vibrating the upper and lower diaphragms 5*a* and 5*b* of 5 the ejection chamber 6 through the electrodes 31*a* and 31*b*. The pressure in the ejection chamber 6 is increased by the diaphragms 5*a* and 5*b* vibrating symmetrically with respect to a horizontal plane, so that the printing speed is improved.

Embodiment 3

The following embodiments describe an ink-jet type apparatus in which ink drops are ejected from nozzle openings provided in a surface of a substrate. The object of the embodiments is to drive diaphragms by a lower voltage. The embodiments can be applied to the aforementioned edge ink jet type apparatus.

Figure 7:
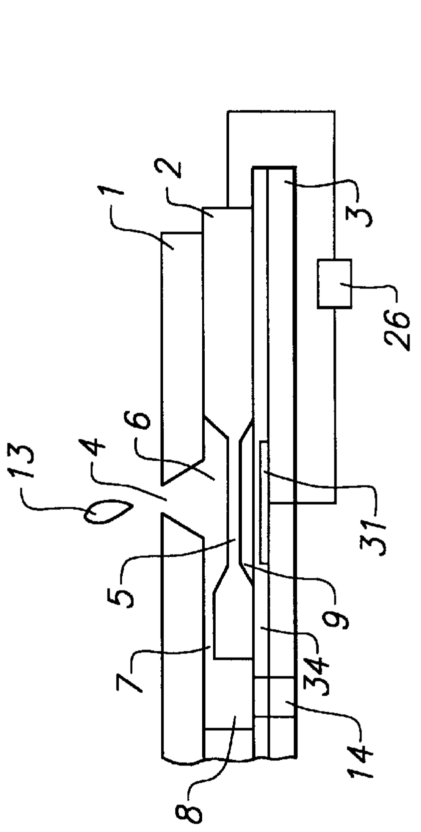
FIG. 7 is a sectional view of a third embodiment of the present invention.

FIG. 7 shows a third embodiment of the present invention in which each circular nozzle opening 4 is formed in an upper substrate 200 just above an ejection chamber 6. The bottom wall of the ejection chamber 6 is used as a diaphragm 5. The diaphragm 5 is formed on an intermediate substrate 2. Further, an electrode 31 is formed on a lower substrate 3 and in a vibration chamber 9 under the diaphragm 5. An ink supply port 14 is provided in the lower substrate 3.

In this embodiment, an ink drop 13 is ejected from the nozzle opening 4 provided in the upper substrate, through the vibration of the diaphragm 5. Accordingly, a large number of nozzle openings 4 can be provided in one head, so that high-density recording can be made.

Embodiment 4

Figure 9B:
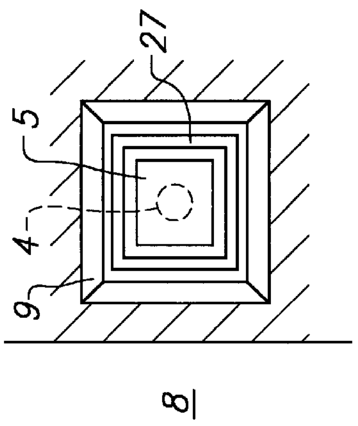
FIGS. 9A and 9B are views taken on line B—B of FIG. 8 and illustrate the case where bellows grooves are formed on the two opposite sides of the diaphragm and the case where bellows grooves are formed on all the four sides of the diaphragm.
Figure 9A:
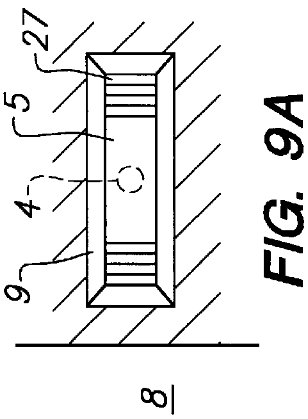
Figure 8:
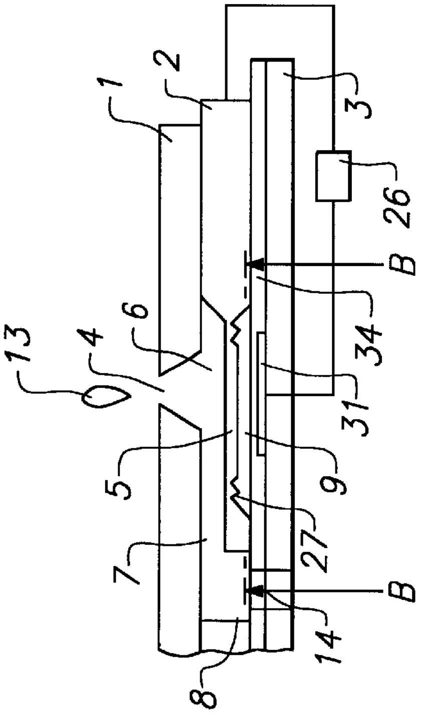
FIG. 8 is a sectional view of a fourth embodiment of the present invention.

In this embodiment, as shown in FIGS. 8, 9A and 9B, each diaphragm 5 is supported by at least one bellows-shaped groove 27 provided on the two opposite sides (see FIG. 9A) or four sides (see FIG. 9B) of a rectangular diaphragm 5 to thereby make it possible to increase the quantity of displacement of the diaphragm 5. Ink in the ejection chamber 6 can be pressed by a surface of the diaphragm 5 perpendicular to the direction of ejection of ink, so that the ink drop 13 can be flown straight.

Embodiment 5

Figure 10:
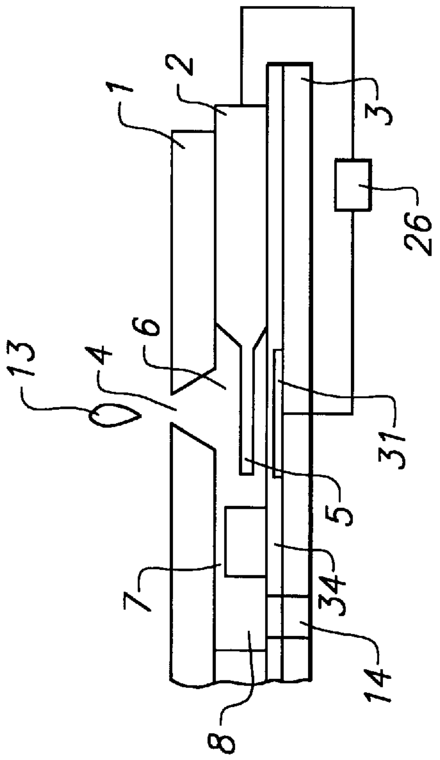
FIG. 10 is a sectional view of a fifth embodiment of the present invention.

In this embodiment, shown in FIG. 10, the rectangular diaphragm 5 is formed as a cantilever type diaphragm supported by one short side thereof. By making the diaphragm 5 be of the cantilever type, the quantity of displacement of the diaphragm 5 can be increased without making the driving voltage high. Because the ejection chamber 6 becomes communicated with the vibration chamber, however, it is necessary that insulating ink is used as the ink 11 to secure electrical insulation of the ink from the electrode 31.

Embodiment 6

Figure 11:
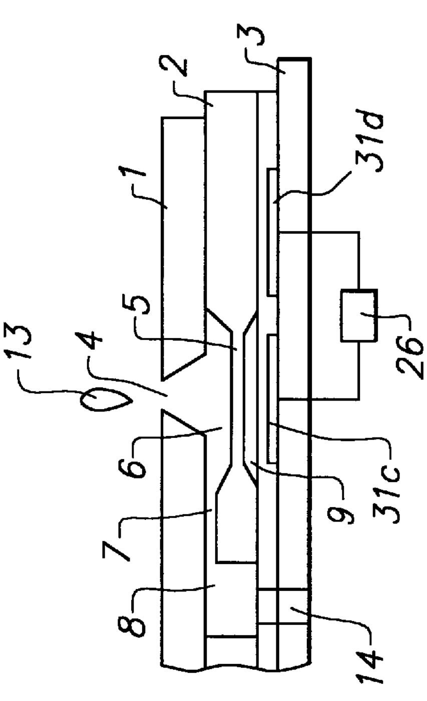
FIG. 11 is a sectional view of a sixth embodiment of the present invention.

In this embodiment, two electrodes 31*c* and 31*d* are 5 provided for each diaphragm 5 as shown in FIG. 11 so that the two electrodes 31*c* and 31*d* drive the diaphragm 5.

In this embodiment, the first electrode 31*c* is arranged inside a vibration chamber 9, and, on the other hand, the second electrode 31*d* is arranged outside the vibration chamber 9 and under an intermediate substrate 2. An oscillation circuit 26 is connected between the two electrodes 31*c* and 31*d*, and an alternating pulse signal to the electrodes 31*c* and 31*d* is repeated to 15 to thereby drive the diaphragm 5.

According to this structure, the driving portion is electrically independent because the silicon substrate 2 is not used as a common electrode unlike the previous embodiment. Accordingly, ejection of ink from an unexpected nozzle opening can be prevented when a nozzle head adjacent thereto is driven. Further, in the case of using a high resistance silicon substrate, or in the case where a high resistance layer is formed, though not shown in FIG. 11, on the surface of the silicon substrate 2, pulse voltages opposite to each other in polarity may be alternately applied to the two electrodes 31*c* and 31*d* to thereby drive the diaphragm 5. In this case, not only electrostatic attraction as described above but repulsion act on the diaphragm 5. Accordingly, ejection pressure can be increased by a lower voltage.

Embodiment 7

Figure 12:
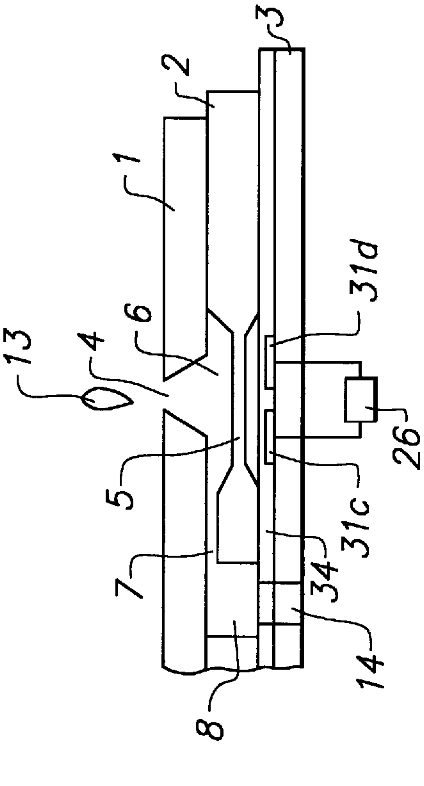
FIG. 12 is a sectional view of a seventh embodiment of the present invention.

In this embodiment, as shown in FIG. 12, both of the electrode 31*c* and 31*d* are arranged inside the vibration chamber 9 so that the diaphragm 5 is driven by surface polarization of silicon. That is, in the same manner as in the embodiment of FIG. 11, an alternating pulse signals is applied to the electrodes 31*c* and 31*d* repeatedly to thereby drive the diaphragm 5. Further, in the same manner as in the Embodiment 6, in the case of using a high resistance silicon substrate, or in the case where a high resistance layer is formed, though not shown in FIG. 12, on the surface of the silicon substrate 2, pulse voltages opposite to each other in polarity may be alternately applied to the two electrodes 31*c* and 31*d* to thereby drive the diaphragm 5. This embodiment is however different from the embodiment of FIG. 11 in that there is no projection of the electrodes between the intermediate substrate 2 and the lower substrate 3. Accordingly, in this embodiment, the two substrates can be bonded with each other easily.

Embodiment 8

Figure 13:
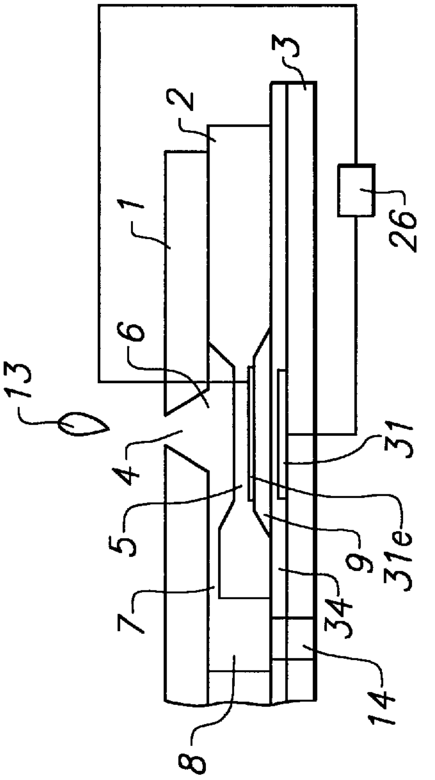
FIG. 13 is a sectional view of an eighth embodiment of the present invention.

In this embodiment, as shown in FIG. 13, a metal electrode 31*e* is provided on the lower surface of the diaphragm 5 so as to be opposite to the electrode 31. Because electric charge is not supplied to the diaphragm 5 through the silicon substrate 2 but supplied to the metal electrode 31*e* formed on the diaphragm 5 through metal patterned lines, the charge supply rate can be increased to thereby make high-frequency driving possible.

Embodiment 9

Figure 14:
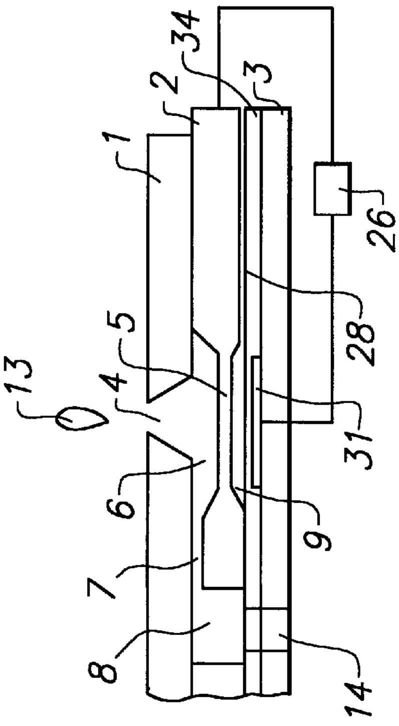
FIG. 14 is a sectional view of a ninth embodiment of the present invention.

In this embodiment, as shown in FIG. 14, an air vent or passage 28 is provided to well vent air in the vibration chamber 9. Because the diaphragm 5 cannot be vibrated easily when the vibration chamber 9 just under the diaphragm 5 is high in air tightness, the air vent 28 is provided between the intermediate substrate 2 and the lower substrate 3 in order to release the pressure in the vibration chamber 9.

Embodiment 10

Figure 15:
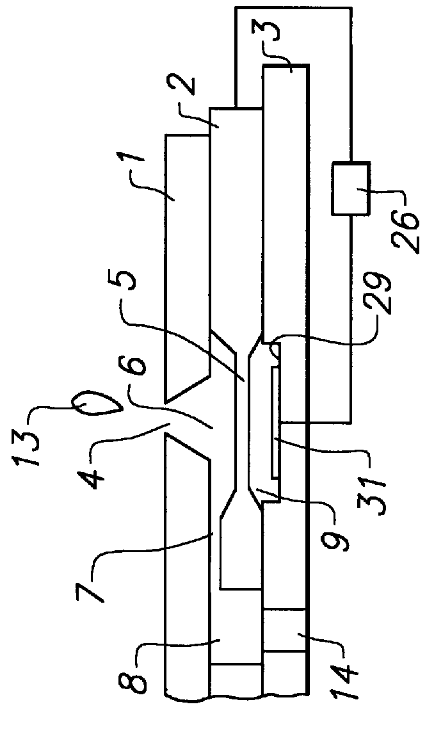
FIG. 15 is a sectional view of a tenth embodiment of the present invention.

In this embodiment, as shown in FIG. 15, the electrode 31 for driving the diaphragm 5 is formed in a concave portion 29 provided in the lower substrate 3. The short circuit of electrodes caused by the vibration of the diaphragm 5 can be prevented without providing any insulating film for the electrode 31.

In the following, an embodiment of a method for producing the aforementioned ink-jet head 12 is 5 described. Description will be made with respect to the structure of FIG. 1 as the central subject. The nozzle grooves 4, the diaphragm 5, the ejection chambers 6, the orifices 7, the ink cavity 8, the vibration chambers 9, etc., are formed in the 10 intermediate substrate (which is also called the "nozzle or middle substrate") 2 through the following steps.

Figure 16A:
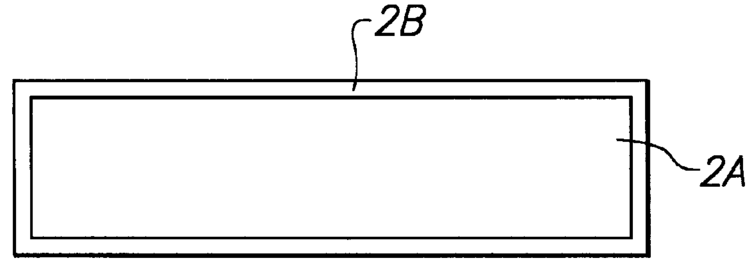
FIGS. 16(*a*) through (*f*) illustrate the steps of producing the nozzle substrate according to embodiments one through ten of the present invention.

(1) Silicon Thermally Oxidizing Step (Diagram of FIG. 16A)

A silicon monocrystal substrate 2A of face orientation (100) was used. Both the opposite surfaces of the substrate 2A were polished to a thickness of 280 μm. Silicon was thermally oxidized by heating the Si substrate 2A in the air at 1100° C. for an hour to thereby form a 1 μm-thick oxide film 2B of $SiO_2$ on the whole surface thereof.

Figure 16B:
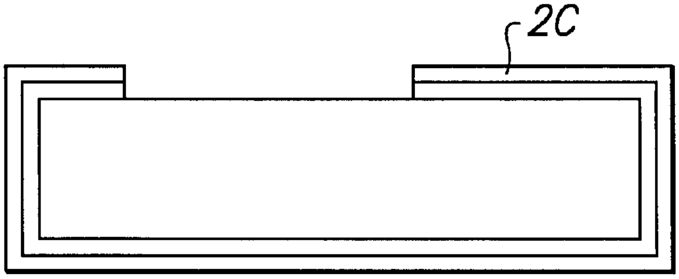
Figure 16C:
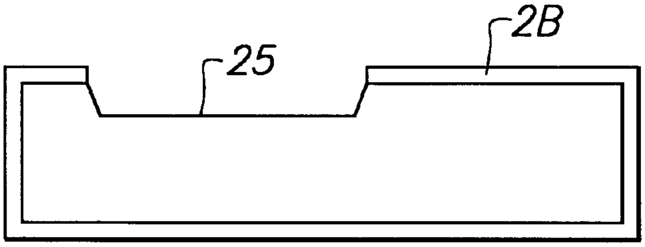

(2) Patterning Step (Diagram of FIG. 16B)

A resist pattern 2C was formed through the steps of: successively coating the two surfaces of the Si substrate 2A with a resist (OMR-83 made by TOKIYO OHKA) by a spin coating method to form a resist film having a thickness of about 1 μm; and making the resist film subject to exposure and development to form a predetermined pattern. The pattern determining the form of the diaphragm 5 was a rectangle with a width of 1 mm and with a length of 5 mm. In the embodiment of FIG. 7, the form of the diaphragm was a square having an each side length of 5 mm.

Then, the $SiO_2$ film 2B was etched under the following etching condition as shown in the drawing. While a mixture solution containing six parts by volume of 40 wt % ammonium fluoride solution to one of 50 wt % hydrofluoric acid was kept at 20° C., the aforementioned substrate was immersed in the mixture solution for 10 minutes.

(3) Etching Step (Diagram of FIG. 16)

The resist 2C was separated under the following etching condition. While a mixture solution containing four parts by volume of 98 wt % sulfuric acid to one of 30 wt % hydrogen peroxide was heated to 900c or higher, the substrate was immersed in the mixture solution for 20 minutes to separate the resist 2C. Then, the Si substrate 2A was immersed in a solution of 20 wt $\%_0$, KOH at 80° C. for a minute to perform etching by a depth of 1 μm. A concave portion 25 constituting a vibration chamber 9 was formed by the etching.

Figure 16D:
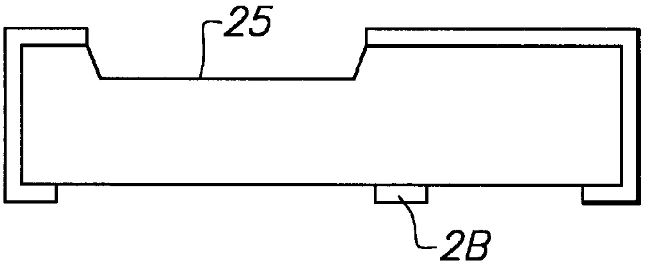

(4) Opposite Surface Patterning Step (Diagram of FIG. 16D)

The $SiO_2$ film remaining in the Si substrate 2A was 5 completely etched in the same condition as in the step (2). Then, a 1 μm-thick $SiO_2$ film was formed over the whole surface of the Si substrate 2A by thermal oxidization through the same process as shown in the steps (1) and (2). Then, the $SiO_2$ film 2B on the opposite surface (the lower surface in the drawing) of the Si substrate 2A was etched into a predetermined pattern through a photo-lithography process. The pattern determined the form of the ejection chamber 6 and the form of the ink cavity 8.

Figure 16E:
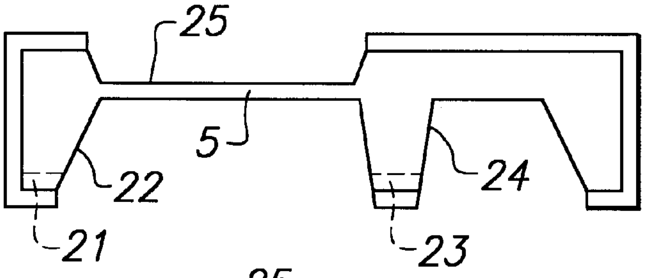

(5) Etching Step (Diagram of FIG. 16E)

The Si substrate 2A was etched by using the $SiO_2$ film as a resist through the same process in the step (3) to thereby form concave portions 22 and 24 for the ejection chamber 6 and the ink cavity 8. At the same time, a groove 21 for the nozzle opening 4 and the groove 23 of an orifice 7 were formed. The thickness of the diaphragm 5 was 100 μm.

In respect to the nozzle groove and the orifice groove, the etching rate in the KOH solution became very slow when the (111) face of the Si substrate appeared in the direction of etching. Accordingly, the etching progressed no more, so that the etching was stopped with the shallow depth. When, for example, the width of the nozzle groove is 40 μm, the etching is stopped with the depth of about 28 μm. In the case of 5 the ejection chamber or the ink cavity, it can be formed sufficiently deeply because the width is sufficiently larger than the etching depth. That is, portions different in depth can be formed at once by an etching process.

Figure 16F:
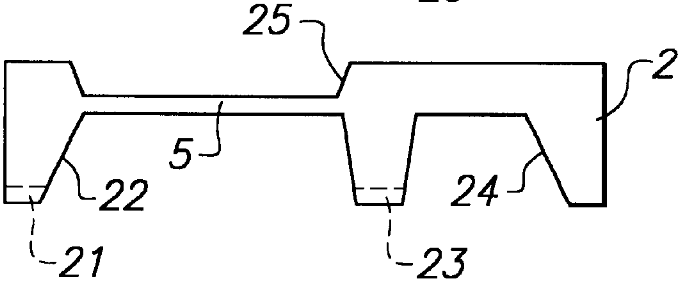
Figure 18A:
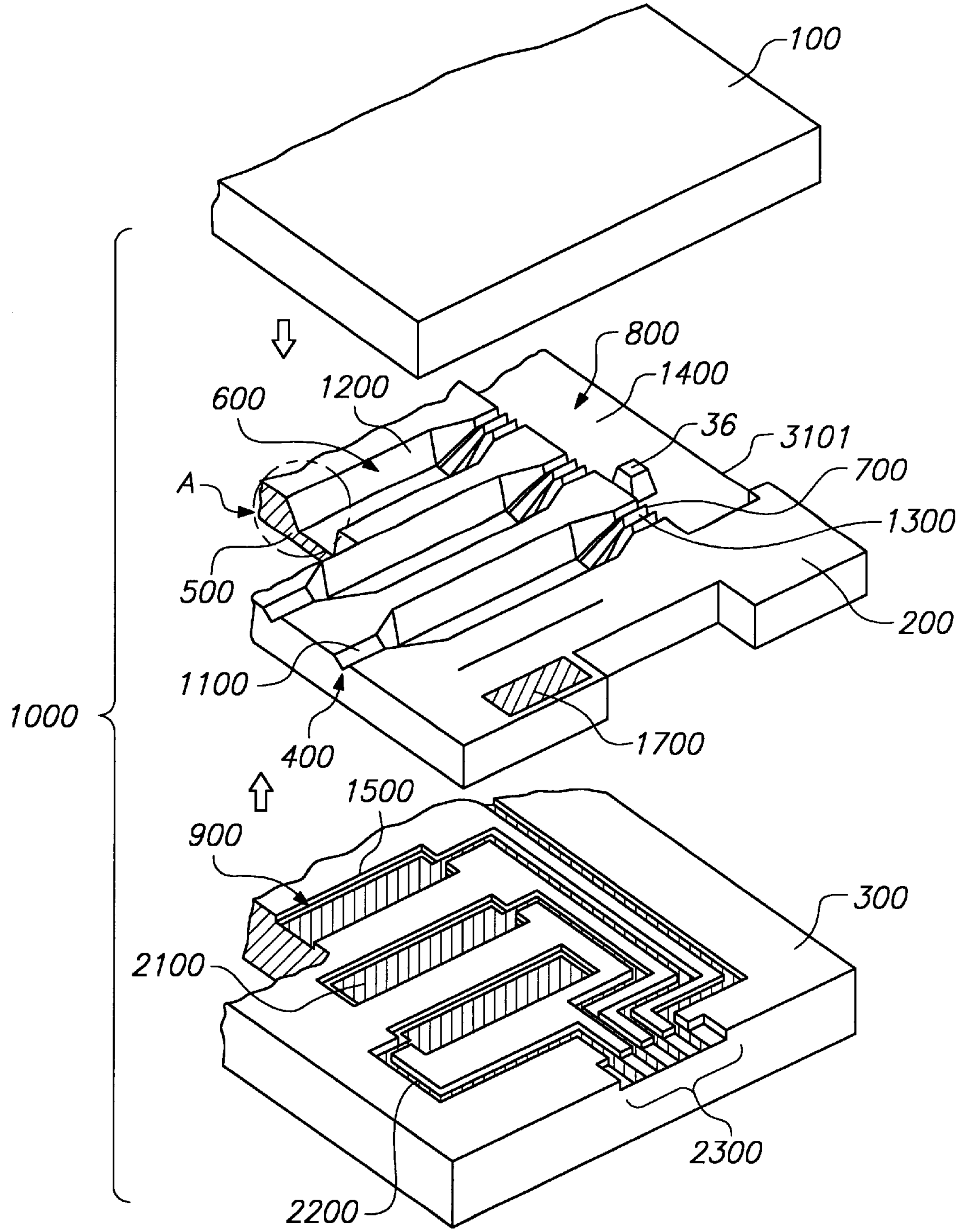
FIGS. 18(*a*) through 18(*d*) illustrate the eleventh embodiment of the present invention.
Figure 18B:
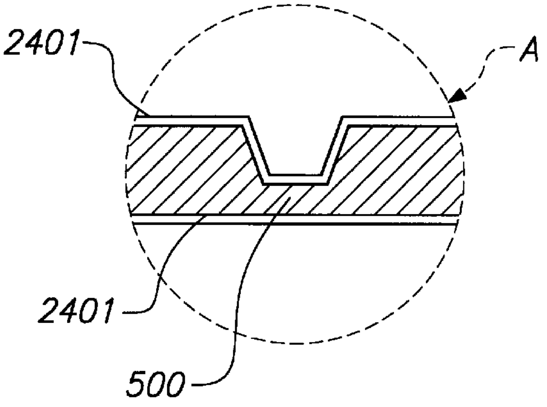
Figure 18C:
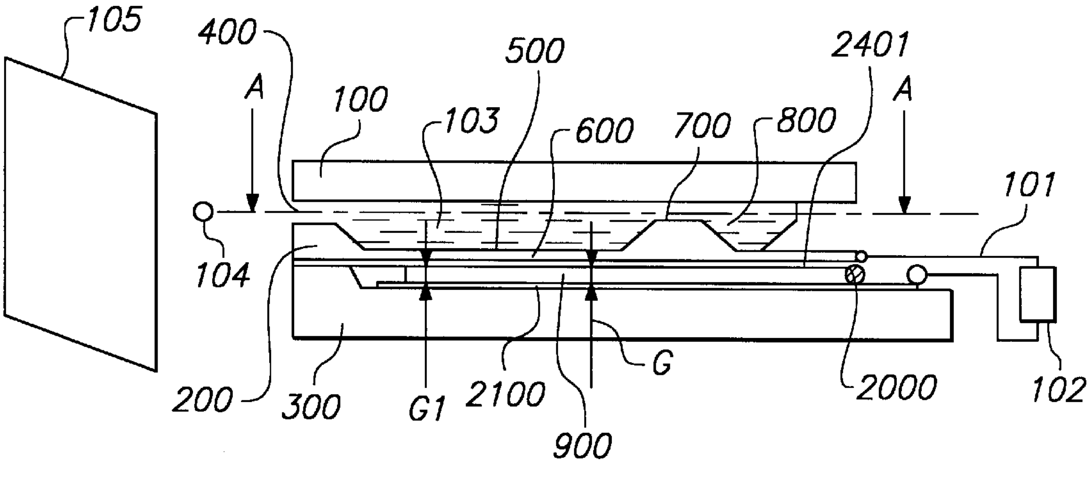
Figure 18D:
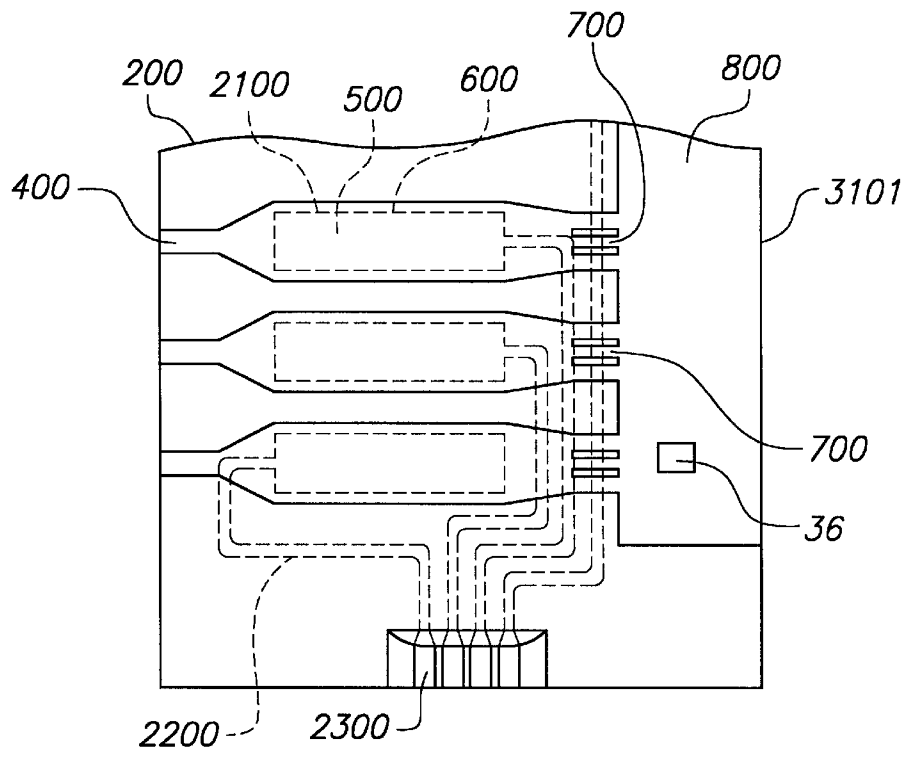

(6) $SiO_2$ Film Removing Step (Diagram of FIG. 16F)

Finally, a nozzle substrate having parts 21, 22, 23, 24, 25 and 5, or in other words, an intermediate substrate 2, was prepared by removing the remaining $SiO_2$ film by etching.

In the embodiment of FIG. 7, an intermediate substrate having the aforementioned parts 22, 23, 24, 25 and 5 except the nozzle grooves 21 and a nozzle substrate (upper substrate 200) having nozzle openings 4 with the diameter 50 μm on a 280 μm-thick Si substrate were prepared in the same process as described above.

In the following, a method for forming an electrode substrate (lower substrate 3) is described with reference to FIG. 17

Figure 17A:
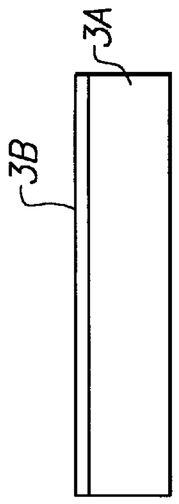
FIGS. 17(*a*) through (*c*) illustrate the steps of producing the electrode substrate according to embodiments one through ten of the present invention.

(1) Metal Film Forming Step (Diagram of FIG. 17A)

A 1000 A° thick Ni film 3B was formed on a surface of a 0.7 mm-thick Pyrex glass substrate 3A° by a spattering method.

Figure 17B:
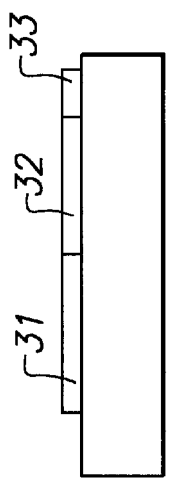

(2) Electrode Forming Step (Diagram of FIG. 17B)

The Ni film 3B was formed into a predetermined pattern by a photo-lithographic etching technique. Thus, the electrodes 31, the lead portions 32 and the terminal portions 33 were formed.

Figure 17C:
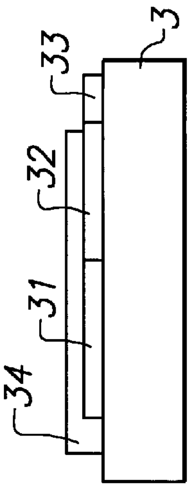

(3) Insulating Film Forming Step (Diagram of FIG. 17C)

Finally, the electrodes 31 and the lead portions 32 (see FIG. 1) except the terminal portions 33 were completely coated with an $SiO_2$ film as an insulating film by a mask sputtering method to form a film thickness of about 1 urn to thereby prepare the electrode substrate 3.

The nozzle substrate 2 and the electrode substrate 3 prepared as described above were stuck to each other through anodic bonding. That is after the Si substrate 2 and the glass substrate 3 were put on each other, the substrates were put on a hot plate. While the substrates were heated at 300° C., a DC voltage of 500V was applied to the substrates for 5 minutes with the Si substrate side used as an anode and with the glass substrate side used as a cathode to thereby stick the substrates to each other. Then, the glass substrate (upper substrate 200) having the ink supply port 14 formed therein was stuck onto the Si substrate 2 through the same anodic treatment.

In the embodiment of FIG. 7, the nozzle substrate 200 and the Si substrate 2 were bonded to each other through thermal compression.

The ink-jet heads 12 respectively shown in FIGS. 2 and 7 were produced through the aforementioned process.

Embodiment 11

FIG. 18(*a*) is an exploded perspective view of the eleventh embodiment, illustrating the presently preferred ink jet head of the present invention.

Figure 19:
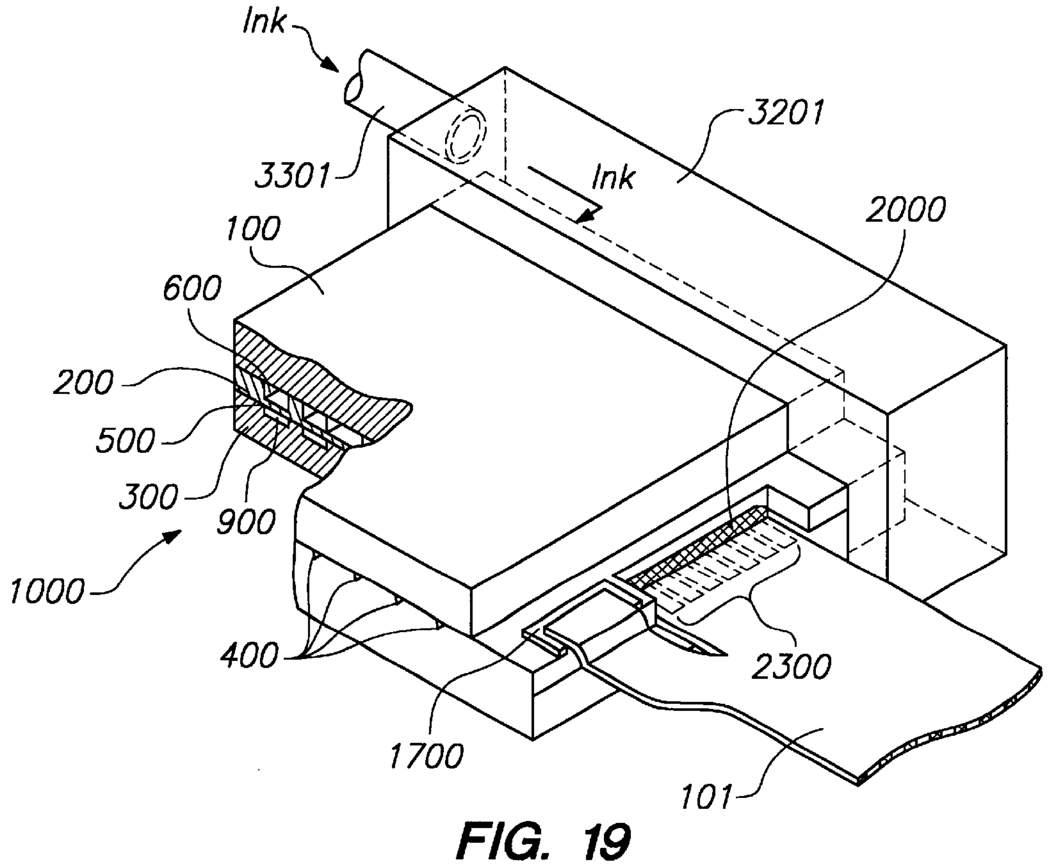
FIG. 19 is a partial plan view taken along line A—A shown in FIG. 18(*b*).

FIG. 18(*b*) is an enlarged cross-sectional view of portion A as shown in FIG. 18(*a*), FIG. 18(*c*) is a sectional elevation of the whole structure of the assembled ink-jet head, FIG. 18(*d*) depicts a partial plan view of FIG. 18(*c*) made along line A—A, and FIG. 19 is a perspective view of the assembled ink jet head.

The ink-jet head 1000 of this embodiment involves a laminated structure of three substrates, upper 100, middle 200 and lower 300, each respectively having a construction as will be described below.

The middle substrate 200 is composed of relatively pure Si and includes a plurality of nozzle grooves 1100 placed at one edge at regular intervals in parallel to each other which end with a plurality of nozzle holes 400. A plurality of dents or concave portions 1200 constituting emitting chambers 600 are respectively led to each nozzle groove 1100, and further include an individual diaphragm 500 forming the bottom wall of each chamber. A plurality of grooves 1300 of ink flowing inlets constituting orifices 700 are positioned at the rear of the concave portions 1200, and a dent or concave portion 1400 of a common ink cavity 800 supplies ink to the respective emitting chambers 600. Ink inlet 3101 is also disposed at the back of recess 1400.

The relationship between the work functions of the semiconductor and metallic material used for the electrodes is an important factor affecting the formation of common electrode 1700 to middle substrate 200. In the present embodiment the common electrode is made from platinum over a titanium base, or gold over a chrome base, but the invention shall not be so limited and other combinations may be used according to the characteristics of the semiconductor and electrode materials.

As shown in FIG. 18(*b*), an oxide thin film 2401 approximately 0.11 μm thick is formed on the entire surface of middle substrate 200 except for the common electrode 1700. Oxide thin film 2401 acts as an insulation layer for preventing dielectric breakdown and shorting when the ink jet head is driven.

The lower substrate 300, attached to the bottom face of the middle substrate 200, is made of boro-silicated glass. When bonded together, these attached substrates 200 and 300 constitute a plurality of vibrating chambers 900. At respective positions of the lower substrate 300, corresponding to respective diaphragms 500, ITO of a pattern similar to the shape of the diaphragm is spattered with a thickness of 0.1 μm. Electrode 2100 includes lead 2200 and terminal 2300.

In this preferred embodiment, a distance holding means is constituted by indentations or dents 1500 hollowed or etched out of the top or connecting face of lower substrate 300. When the substrates 200 and 300 are aligned and bonded, those dents form the lower portions of enclosed vibrating chamber 900 (the tope being formed by diaphragm 500 located on the bottom face of substrate 200). Also, diaphragm 500 will be positioned such that it is disposed opposite tot he corresponding electrode 2100 forming the bottom surface of the vibrating chamber 900.

The length of the electrical gap “G” (see FIG. 18(*c*)) is identical with the thickness of oxide thin film 2401 plus the difference between the depth of the dent 1500 and a thickness of the electrode 2100. According to this embodiment, the dent 1500 is etched to have a depth of 0.275 μm. The pitch of the nozzle grooves 1100 is 0.508 mm and the width of the nozzle groove 1100 is 60 μm.

The upper substrate 100, attached to the upper face of the middle substrate 200, is made of boro-silicated glass identical with that of the lower substrate 300. Combining the upper substrate 100 with the middle substrate 200 completes the nozzle holes 400, the emitting chambers 600, the orifices 700, the ink cavities 800, and ink inlet 3100. Support member 36 is also provided in ink cavity 800 to provide reinforcement and to prevent the collapsing of recess 1400 when middle substrate 200 and upper substrate 100 are bonded together.

The ink-jet head of the preferred embodiment is constructed as follows. First, the middle substrate 200 and the lower substrate 300 are anode bonded by applying an 800V source at 340° C. between them. Then, the middle substrate 200 and the upper substrate 100 are connected, resulting in the assembled ink-jet head shown in FIGS. 18(*a*) and 18(*c*). After anode bonding, the thickness of oxide thin film 2401 and difference between the depth of the dent 1500 and the thickness of the electrode 2100 constitutes the electrical gap length (here, approximately 0.285 μm). Distance G1 (air gap) between the diaphragm 500 and the electrode 2100 is approximately 0.175 μm.

After thus assembling the ink jet head, drive circuit 102 is connected by connecting flexible printed circuit (FPC) 101 between common electrode 1700 and terminal members 2300 of individual electrodes 2100 as shown in FIGS. 18(*c*) and 19. An anisotropic conductive film is preferably used in this embodiment for bonding leads of FPC 101 with electrodes 1700 and 2300.

Nitrogen gas is also injected to vibration chambers 900, which are sealed airtight using an insulated sealing agent 2000. Vibration chambers 900 are sealed near terminal members 2300 in this embodiment, thus enclosing vibration chamber 900 and a volume of lead member 2200.

Ink 103 is supplied from the ink tank (not shown in the figures) through ink supply tube 3301 and ink supply vessel 3201, which is secured externally to the back of the ink jet head to fill ink cavity 800 and ejection chambers 600 through ink inlet 3101. The ink in ejection chamber 600 becomes ink droplet 104 ejected from nozzles 400 and printed to recording paper 105 when ink jet head 100 is driven, as shown in FIG. 18(*c*).

Figure 49:
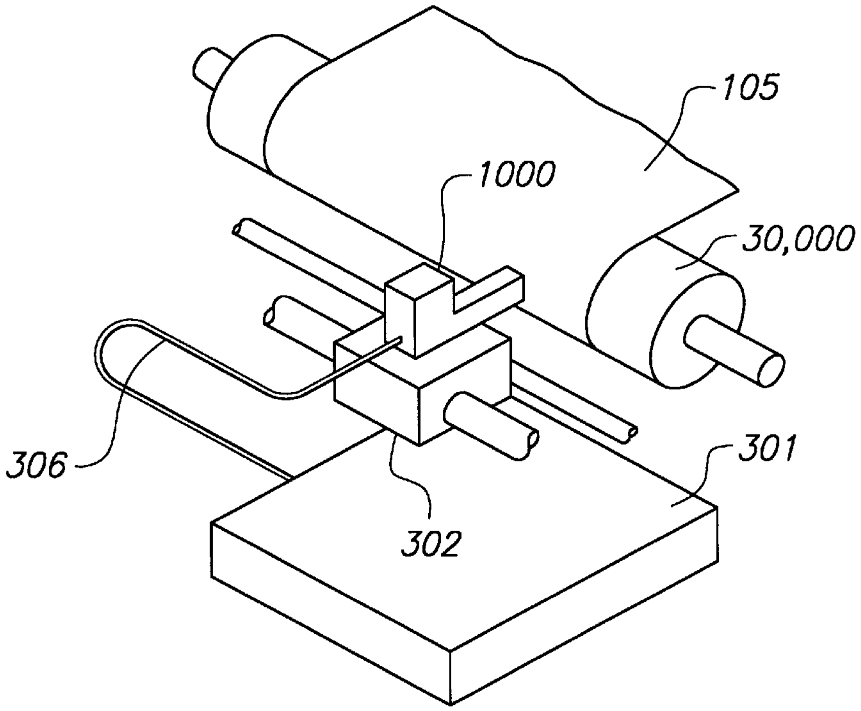
FIG. 49 is a schematic diagram of a printer incorporating the ink-jet head of the eleventh embodiment of the present invention.

In FIG. 49, numeral 305 is a platen, 301 is an ink tank, and 302 is a carriage of the ink head 10. When the electrical gap length between the diaphragm 500 and the electrode 2100 exceeds 2.5 μm, the required drive voltage impractically exceeds 250V. However, a very good image is obtained when driving the ink jet head of the presently preferred embodiment with 38 volt pulses at approximately 3.3 Khz. If so, the observed ink droplet ejection speed approaches 12 m/sec without underprinting, overprinting, smearing or other deleterious effects.

Embodiment 12

Figure 20:
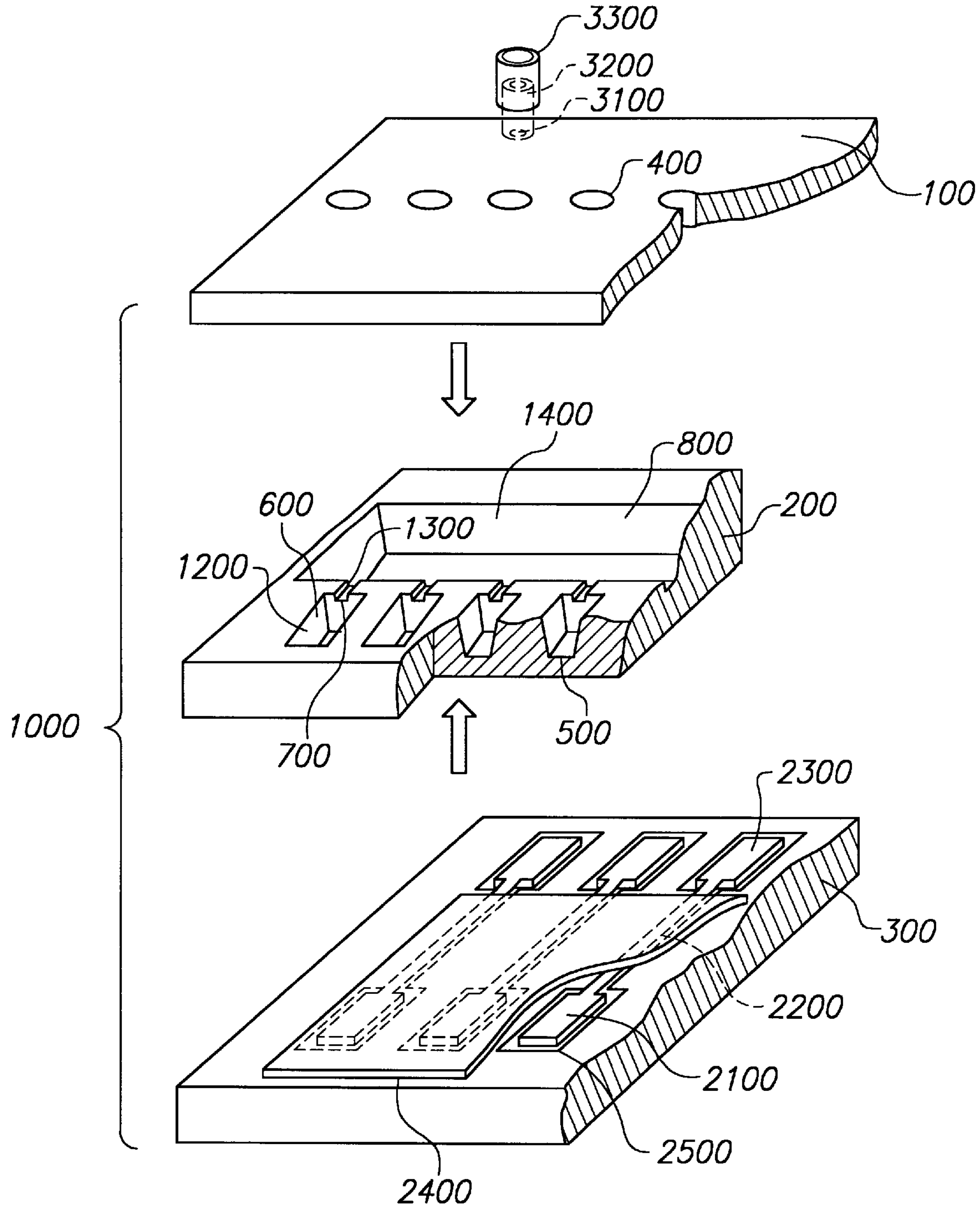
FIG. 20 is an exploded perspective view of the twelfth embodiment of the ink-jet head according to the present invention.
Figure 21:
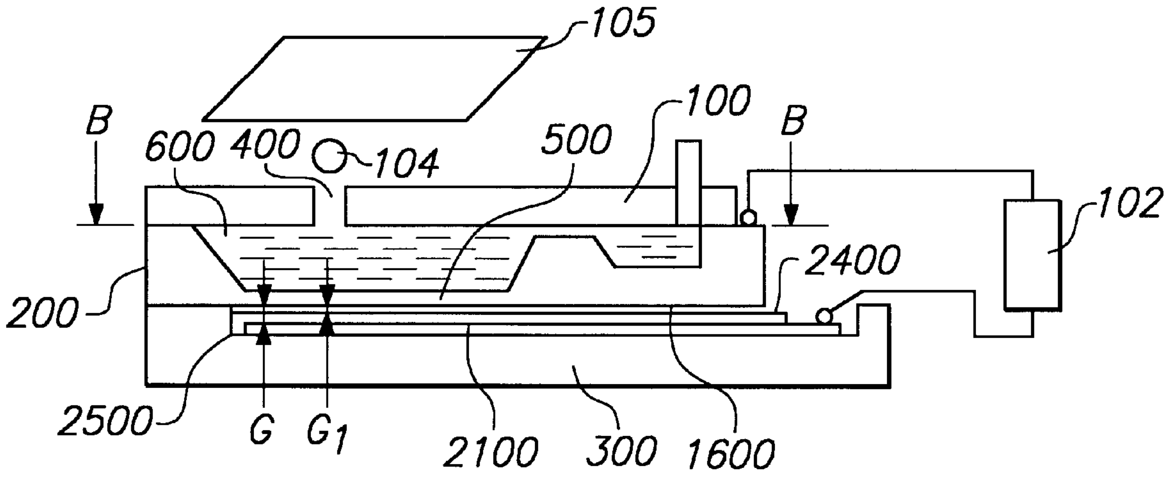
FIG. 21 is a sectional side elevation of the twelfth embodiment.
Figure 22:
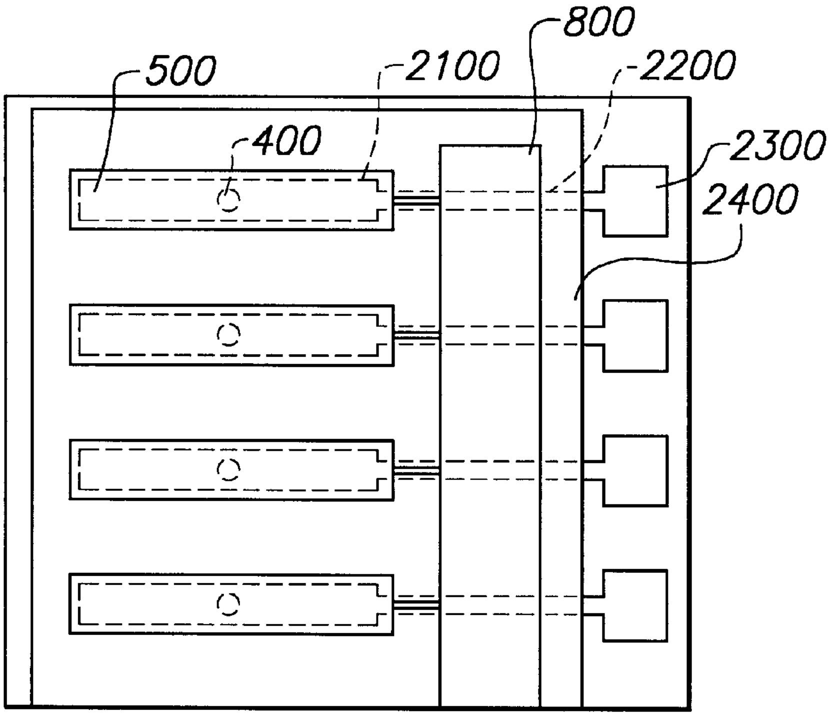
FIG. 22 is a B—B view of FIG. 21.

FIG. 20 is an exploded perspective view of the ink jet head according to the twelfth embodiment of the present invention partly shown in section. The ink jet head illustrated is of a face ink jet type having nozzle holes formed on the outside face of the upper substrate 100, through which holes ink drops emit. FIG. 21 shows a sectional side elevation of the whole construction of an assembled ink jet head according to this embodiment, and FIG. 22 shows a partial plan view taken along line B—B shown in FIG. 21. Hereinafter, the part or members of the ink jet head identical with or similar to that of embodiment 11 will be explained with the identical reference numbers of embodiment 11.

The ink jet head 1000 of the twelfth embodiment is adapted to emit ink drops through the nozzle holes 400 formed in a face of the upper substrate 100.

The middle substrate 200 of this twelfth embodiment is made of a silicon of crystal face direction (110) with a thickness of 380 μm. The bottom wall of the dent 1200 constituting the emitting chamber 600 is a diaphragm 500 approximately 3 μm thick. By contrast, there is no dent of the vibrating chamber of the eleventh embodiment at the lower portion of the diaphragm 500. Instead, the lower face of the diaphragm 500 therein is flat and smooth-face polished, e.g., as in a mirror.

The lower substrate 300 attached to the bottom face of the middle substrate 200 is made of boro-silicated glass as in that of the eleventh embodiment. The gap length G is formed on the lower substrate by a dent 2500 formed by an etching away of 0.5 μm in order to mount the electrode 2100. The dent 2500 is made in a pattern larger than the shape of the electrode in order to mount the electrode 2100, lead 2200, and terminal 2300 in the dent 2500. The electrode 2100 itself is made by spattering ITO of 0.1 μm thickness in the dent 2500 to form the ITO pattern, and gold is spattered only on the terminal 2300. Except for the electrode terminal 2300, a 0.1 μm thick boro-silicated glass spatter film covers the whole surface to make the dielectric layer 2400. In FIG. 20, the dielectric layer 2400 is drawn as a uniformly flat shape. However, as in diaphragm 500 here, the dielectric layer 2400 has indentations formed therein.

Consequently, according to the twelfth embodiment, the gap length is 0.4 μm and the space distance G1 is 0.3 μm after anodic bonding.

The upper substrate 100, attached to the top face of the middle substrate 200, is made of a stainless steel (SUS) plate approximately 100 μm thick. On the face of the upper substrate 100, there are nozzle holes 400 respectively led to the dent 1200 of the emitting chambers. The ink supply port 3100 is formed so as to be led to the ink cavity 1400.

When the ink jet head 1000 of the twelfth embodiment is used and a plate voltage of 0V to 100V is applied from the oscillation circuit 102 to the electrode 2100, a good printing efficiency corresponding to that of the eleventh embodiment is obtained. When the ink jet head provided with a gap length G exceeding 2.3 μm is used, the required driving voltage is more than 250V, and is thus impractical.

Embodiment 13

Figure 23:
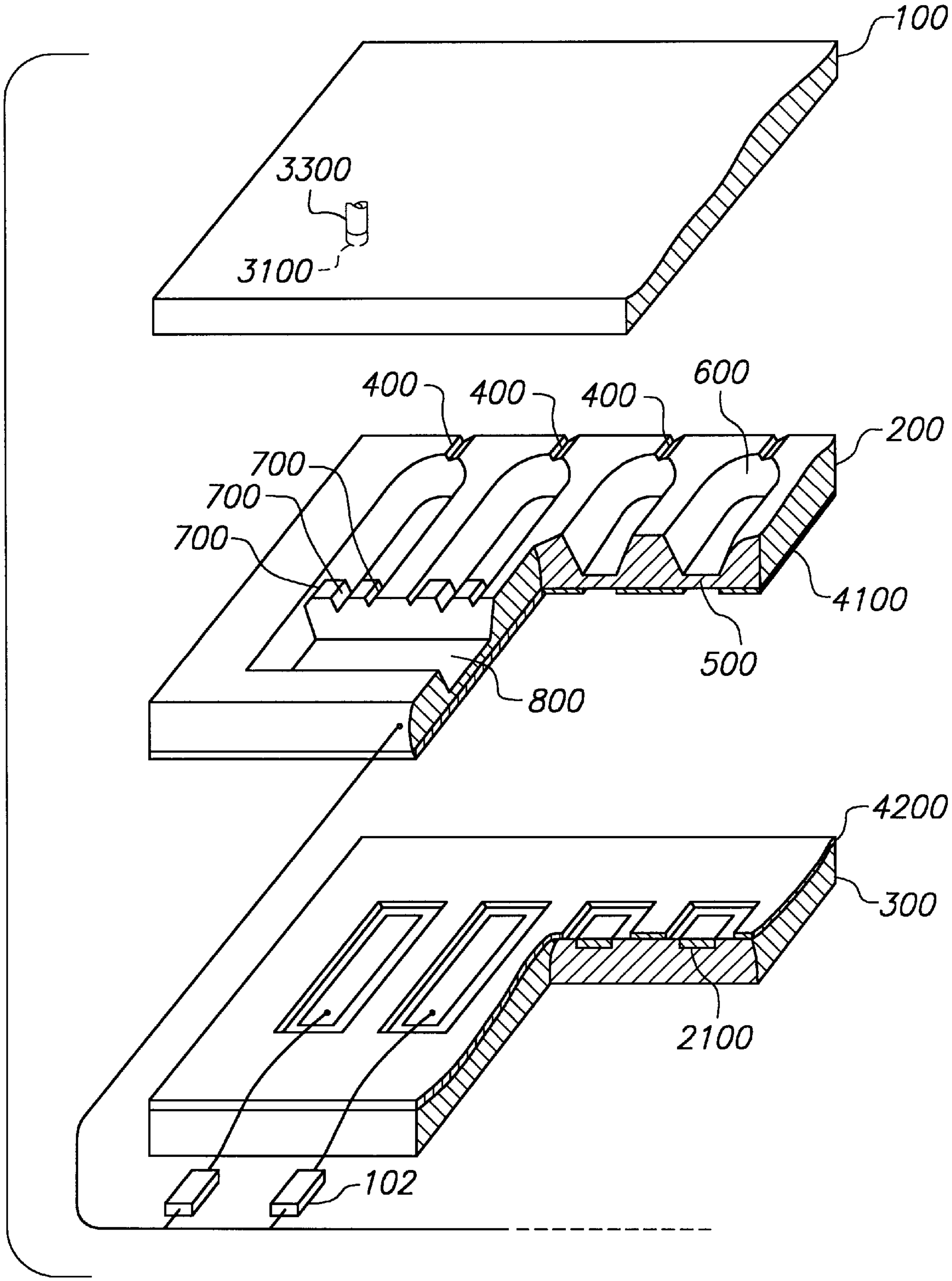
FIG. 23 is an exploded perspective view of the thirteenth embodiment of the ink-jet head according to the present invention.
Figure 29A:
FIGS. 29(*a*) to 29(*g*) show a manufacturing step diagram of the middle substrate of the fourteenth embodiment of the present invention.
Figure 29B:
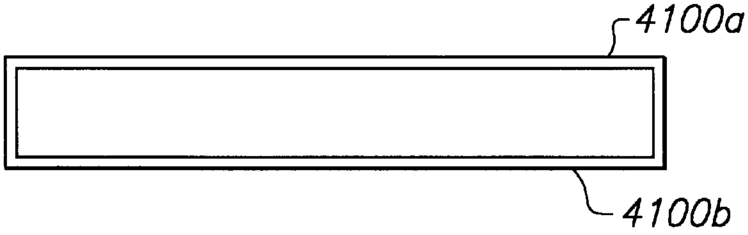
Figure 29C:
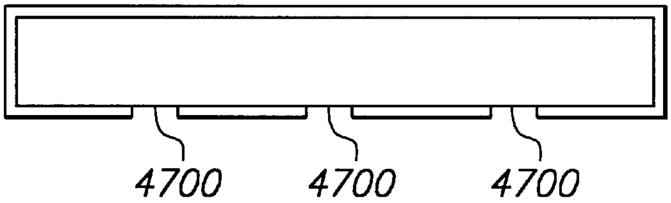
Figure 29D:
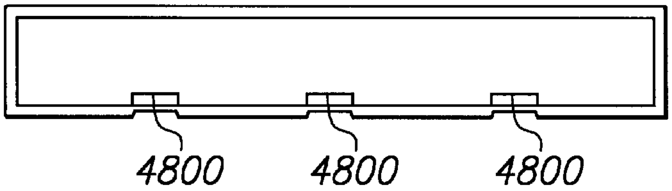
Figure 29E:
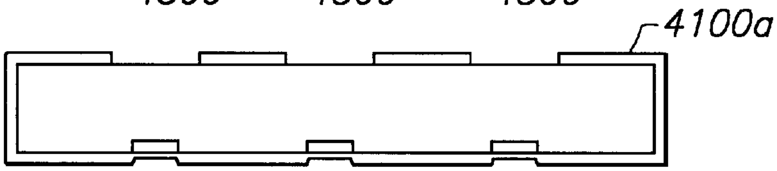
Figure 29F:
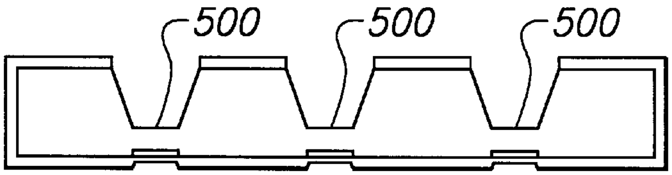
Figure 29G:
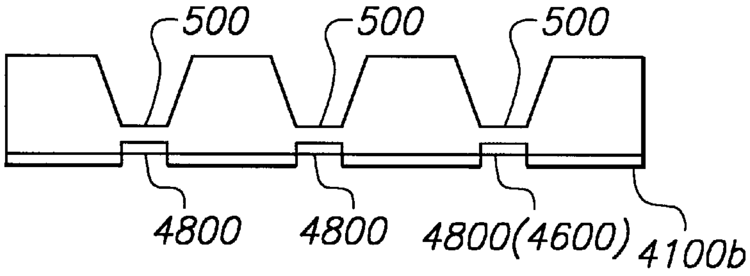

FIG. 23 shows an exploded perspective view of the ink jet head according to the thirteenth embodiment of the present invention, with a part of the head detailed in section. FIG. 24 is an enlarged perspective view of a portion of this ink jet head.

According to the thirteenth embodiment of the ink jet head, the gap length holding means is formed by $SiO_2$ membranes 4100 and 4200 respectively, previously deposited at the space between the middle substrate 200 and the lower substrate 300. These $SiO_2$ membranes 4100 and 4200 function as gap spacers. The middle substrate 200 is preferably made of a single crystal silicon wafer having a crystal face direction of (100). On the bottom face of this wafer, except a part corresponding to the diaphragms 500, a preferably 0.3 μm thick $SiO_2$ membrane 4100 is deposited. Similarly, the lower substrate 300 is made of a single crystal silicon wafer having a (100) crystal face direction. A 0.2 μm thick $SiO_2$ membrane 4200 is formed on the upper face of the lower substrate 300, except the area immediately adjacent to electrodes 2100.

This results in a gap length between the middle and lower substrates of approximately 0.5 μm after bonding (see FIG. 24).

FIGS. 25(*a*) to 25(*e*) show the manufacturing steps of the middle substrate according to the thirteenth embodiment of the present invention.

First, both faces of the silicon wafer having a (100) crystal face direction are mirror-polished in order to make a silicon substrate 5100 of a thickness 200 μm (see FIG. 25(*a*)). The silicon substrate 5100 is treated with thermal oxidization treatment using an oxygen and steam atmosphere heated to 1100° C. for 4 hours in order to form $SiO_2$ membranes 4100*a* and 4100*b* of a thickness 1 μm on both the faces of the silicon substrate 5100 (see FIG. 25(*b*)). $SiO_2$ membranes 4100*a* and 4100*b* function as an anti-etching material.

Next, on the upper face of the $SiO_2$ membrane 4100*a*, a photo-resist pattern (not shown) having a pattern corresponding to nozzles 400, emitting chambers 600, orifices 700 and ink cavities 800 is deposited. The exposed portion of the $SiO_2$ membrane 4100*a* is then etched by a fluoric acid etching agent and the photo-resist pattern is removed (see FIG. 25(*c*)).

Then, the silicon substrate 5100 is anisotrophy-etched by an alkali agent (FIG. 25(*d*)). When single crystal silicon is etched by an alkali such as kalium hydroxide solution or hydradin, etc., as is well known, the difference between etching speeds on various crystal faces of the single crystal silicon can be great. This makes it possible to carry out anisotrophy etching on them and still yield good results. In practice, because the etching speed of a (111) crystal face is the least or the lowest, the crystal face (111) will remain after the etching process finishes.

According to the thirteenth embodiment, a caustic potash solution containing isopropyl alcohol is used in the etching treatment. Because mechanical deformation characteristics of the diaphragm is determined by the dimensions of the diaphragm, every size characteristic of the diaphragm is determined with reference to desired ink emitting characteristics. According to the thirteenth embodiment, a width h of the diaphragm 500 is preferably 500 μm and its thickness is preferably 30 μm (see FIG. 26).

In the silicon substrate 5100 having a (111) face direction, the (110) face crosses structurally with (100) face of the substrate at an angle of about 550, so that when the sizes of the diaphragm to be formed in the silicon substrate of (100) face direction are determined, the mask pattern size of anti-etching material will be determined primarily with reference to the thickness of the middle substrate. As shown in FIG. 26, the width d of the top opening of the emitting chamber 600 in this embodiment is preferably 740 $\mu$m when an etching treatment of 170 $\mu$m width is done. This leaves a diaphragm 500 of a width h equal to 500 $\mu$m and a thickness t equal to 30 $\mu$m. In a typical batch, the (111) face undergoes little etching or undercutting, and the size d shown in FIG. 26 becomes a little larger than the mask pattern width d1. Consequently, it is necessary to limit the mask pattern width d1 to that portion of the (111) face which will be undercut, so that d approaches 730 $\mu$m as in the thirteenth embodiment and a predetermined length of approximately 170 $\mu$m can etched away with precision by using the aforementioned alkali etching solution (see FIG. 25(*c*)).

Next, $SiO_2$ membrane 4100*b* on the bottom face of the silicon substrate 5100 is patterned. The thickness of the $SiO_2$ membrane 4100*b* was 1 $\mu$m at the stage FIG. 25(*b*). In an alkali anisotrophy etching process shown in FIG. 25(*d*), the $SiO_2$ membrane 4100*b* is etched by alkali solution and its thickness decreased to 0.3 $\mu$m. According to the thirteenth embodiment, an etching rate of the $SiO_2$ membrane is very small, so reproducing the decrease in thickness of the $SiO_2$ membrane 4100*b* can be successfully accomplished.

Next, a photo-resist pattern (not shown) of a shape corresponding to the diaphragm 500 is formed on the $SiO_2$ membrane 4100*b,* and the exposed portion of the $SiO_2$ membrane 4100*b* is etched by fluoric acid etching solution so as to remove the photo-resist pattern. Simultaneously, all material of the $SiO_2$ membrane 4100*a* remaining on the user face of the substrate 5100 is removed (see FIG. 25(*e*)).

After such steps are finished, the middle substrate 200 shown in FIG. 23 is completed.

Next, the manufacturing steps of the lower substrate according to the thirteenth embodiment of the present invention will be explained with reference to FIGS. 27(*a*) to 27(*d*).

First, both the faces of a n-type silicon substrate 5200 of (100) face direction are mirror-polished and heat oxidized at 1100° C. for a predetermined time in order to form the $SiO_2$ membranes 4200*a* and 4200*b* on both the faces of the silicon substrate 52 (see FIG. 27(*a*)).

Next, a photo-resist pattern (not shown) is applied on the upper $SiO_2$ membrane 4200*a* except those areas designated for the electrode members 2100. Then, the exposed portions of the $SiO_2$ membrane 4200*a* are etched by a fluoric acid etching solution to remove the photo-resist pattern (see FIG. 27(*b*)), leaving wells 4300 to hold the electrodes.

In the next step, the exposed Si portion 4300 of the silicon substrate 5200 is boron-doped. A suitable boron-doping process is described below. The silicon substrate 5200 is held in a quartz tube through a quartz holder. Steam with bubbled $BBr_3$ with $N_2$ carriers is led together with 02 into the quartz tube. After the silicon substrate 5200 is treated at 1100° C. for a predetermined time, the substrate 5200 is lightly etched by fluoric acid etching agent, and the $O_2$ is driven in. The exposed part of Si 4300 becomes a p-type layer 4400 (see FIG. 27(*c*)). The p-type layer 4400 functions as the electrode 2100 as shown here, and in FIG. 23.

In the step of FIG. 27(*c*), the thickness of the $SiO_2$ membranes 4200*a* and 4200*b* on the upper face of the silicon substrate 52 increases, so in the thirteenth embodiment, the thickness of the $SiO_2$ membrane 4200*a* increases to 0.2 $\mu$m.

Next, a photo-resist pattern (not shown) is applied to $SiO_2$ membrane 4200*a* except for those areas immediately above p-type layer 4400 (electrode 2100). Then, the exposed areas of the $SiO_2$ membrane 4200*a* are etched by a fluoric acid etching agent (see FIG. 27(*d*)). Thus, the lower substrate 300 shown in FIG. 23 is obtained.

According to the ink jet head of the thirteenth embodiment of the present invention, the size of the gap length G between the diaphragm 500 and the electrode 2100 is determined to 0.5 $\mu$m on the basis of an ink emitting characteristic of the ink jet head. Because the thickness of the $SiO_2$ membrane 4100*b* of the middle substrate 200 is 0.3 $\mu$m as mentioned above, the process is carried out so that the thickness of the $SiO_2$ membrane 4200*a* in the step of FIG. 27(*c*) becomes 0.2 $\mu$m.

The middle and lower substrates formed according to the steps above are joined by a Si—Si direct connecting method to complete the head construction as shown enlarged in FIG. 24. The joining steps will be described in more detail hereinbelow.

First, the silicon substrate 200 is washed with a mixture of sulfuric acid and hydrogen peroxide of 100° C., then positions of the corresponding patterns of both the substrates 200 and 300 are matched, and finally they are applied to each other. After that, both the substrates 200 and 300 are thermally treated at a temperature of 1100° C. for one hour, thereby obtaining a firm lamination structure.

The observed sizes of the gap length G of one hundred ink jet heads manufactured scatter along a range of ±0.05 $\mu$m. The observed thickness of the diaphragms are distributed in a range of 30.0 $\mu$m±0.8 $\mu$m. When the ink jet heads are driven with 100V and 5 Khz, ink drop emitting speeds are scattered in a range of 8±0.5 $\mu$m/seconds and ink drop volumes are distributed in a range of $(0.1\pm0.01)\times10^{-6}$ cc. In a practical printing test of the one hundred ink jet heads, good results of printing are obtained.

According to the thirteenth embodiment of the present invention, a gaseous process using $BBr_3$ forms a p-type layer and the electrode 2100. However, the p-type layer forming method could alternatively include other processes well known in the art, such as an ion injection method, a spin-coating method in which a coating agent $B_2O_3$ is scattered in inorganic solvent and spun, and other known methods which use a distribution source of BN (Boron nitrogen) plate. Also, it is possible to use other elements in group III, such as Al, Ga in order to form suitable p-type layers.

It is also possible to make the electrode 2100 a n-type layer if the silicon substrate 3 is a p-type substrate. In this case, various known doping methods are used. That is, V group elements such as P, As, Sb and the like are doped to make the electrode 2100.

According to the thirteenth embodiment, the $SiO_2$ membranes 4100 and 4200 form the gap portions. However, because it is possible if any one of the $SiO_2$ membranes is not used to connect both the substrates (owing to the principle of Si—Si direct connecting process), it should become obvious to those ordinarily skilled in the art that one of the membranes 4100 and 4200 may have the necessary length of the gap and another membrane may be removed by fluoric acid etching agent in a Si—Si direct connecting process to obtain a desired gap portion composed of a unitary material.

In the thirteenth embodiment, the $SiO_2$ gap spacer can also be used as an etching mask during alkali anisotrophy etching process. During the etching, the size of the membrane decreases, and the material can be thinned enough where the connecting face itself will begin to deteriorate. When the face deteriorates to a certain degree and once all the $SiO_2$ membrane is removed by a fluoric acid etching agent, a thermal oxidization process is used to form $SiO_2$ membrane of a necessary thickness to obtain an appropriate gap spacer.

In addition, according to the thirteenth embodiment, considering the specification of the ink jet head, the gap length is determined temporarily to 0.5 $\mu$m. However, because Si thermal oxidized membranes can be manufactured precisely and easily until their maximum thickness approaches 1.5 $\mu$m, controlling only the thickness of the Si thermal oxidized membranes of the gap spacers to produce a gap length between 0.05 to 2.0 $\mu$m enables one to obtain an ink jet head provided with the gap portion having a precise measurement similar to that of the thirteenth embodiment.

Embodiment 14

FIG. 28 shows a partly-broken perspective view of the middle substrate used to the ink jet head according to the fourteenth embodiment of the present invention. The lower substrate and the upper substrates on which electrodes may be formed are identical with that of the previously described embodiment (embodiment thirteen), so they need not be discussed further here.

According to the fourteenth embodiment of the ink jet head, a second electrode 4600 consisting of a p-type or n-type impurity layer is formed on the gap opposed face 4500 of the diaphragm 500 as shown in FIG. 28 in order to improve frequency characteristic of the oscillation circuit or crosstalk when the ink jet head is driven. The gap length G of the fourteenth embodiment is the separation between the second electrode 4600 and the electrode 2100 on the lower substrate (see, e.g., FIG. 23). The distance holding means is constructed by the $SiO_2$ membrane 4100 formed on the bottom face of the middle substrate 200 in a manner described below and on the lower substrate in reference to the thirteenth embodiment. In this case too however, it is possible to obtain an optimal gap length G by only one of the $SiO_2$ membranes.

The manufacturing steps of the middle substrate of the fourteenth embodiment of the present invention is shown in FIGS. 29(*a*) to 29(*g*).

First, both the sides of a silicon wafer of n-type of (100) face direction are mirror-polished to manufacture a silicon substrate 5300 of a thickness 200 $\mu$m (see FIG. 29(*a*)). Then, the silicon substrate 5300 is thermally oxidization-treated in an oxygen-steam atmosphere at 1100° C. for 4 hours in order to form $SiO_2$ membranes 4100*a* and 4100*b* of thickness 1 $\mu$m on both the faces of the silicon substrate 5300 (see FIG. 29(*b*)).

Next, on the lower $SiO_2$ membrane 4100*b*, a photo-resist pattern (not shown) is applied except for those areas which will contain electrode 4600 as shown in FIG. 28 and a lead (not shown) is formed. Thereafter, the exposed portion of the $SiO_2$ membrane 4100*b* is etched and removed by fluoric acid etching agent in order to remove the photo-resist pattern (see FIG. 29(*c*)).

At the next stage, the exposed Si portion 4700 of the silicon substrate 5300 is doped according to the treatment process identical with that of the thirteenth embodiment of the present invention in order to form a p-type layers 4800. The p-type layer 4800 functions as the second electrodes 4600 (see FIG. 29(*d*)).

A photo-resist pattern is (not shown) corresponding to the outlines of the shapes of the nozzle holes 400, emitting chambers 600 and the like are formed on the upper $SiO_2$ membrane 4100*a*. Thereafter, exposed portion of the $SiO_2$ membrane 4100*a* is etched away to remove the photo-resist pattern (see FIG. 29(*e*)).

The following steps of the manufacturing process are identical with that of the thirteenth embodiment. The $SiO_2$ membrane 4100*b* is pattern treated so as to form the diaphragm 500, nozzles 400, emitting chambers 600, orifices 700, and ink cavity 800, and the gap portion between the diaphragm and the lower substrate (see FIG. 29(*e*) to 29(*g*)).

Similar to that of the thirteenth embodiment, various methods can be used to form the electrode 4600 and various kinds of dopants can be used to the doping process.

According to the fourteenth embodiment, respective diaphragms 500 have respective driving electrodes 4600 formed thereon, so it is possible to obtain a high speed driving of the oscillation circuit, or a high printing speed of the ink jet head of the present invention.

According to the thirteenth embodiment, the highest driving frequency for forming independent ink drops was 5 Khz, However, in the fourteenth embodiment, the highest driving frequency is 7 Khz. Also, the lead wires for connecting respective electrodes 4600 and the oscillation circuit are integrally and simultaneously formed with the electrodes 4600 to attain a compact and high speed ink jet head. However, this configuration does important additional manufacturing cost over that presented in the eleventh or thirteenth embodiments.

Embodiment 15

Figure 30:
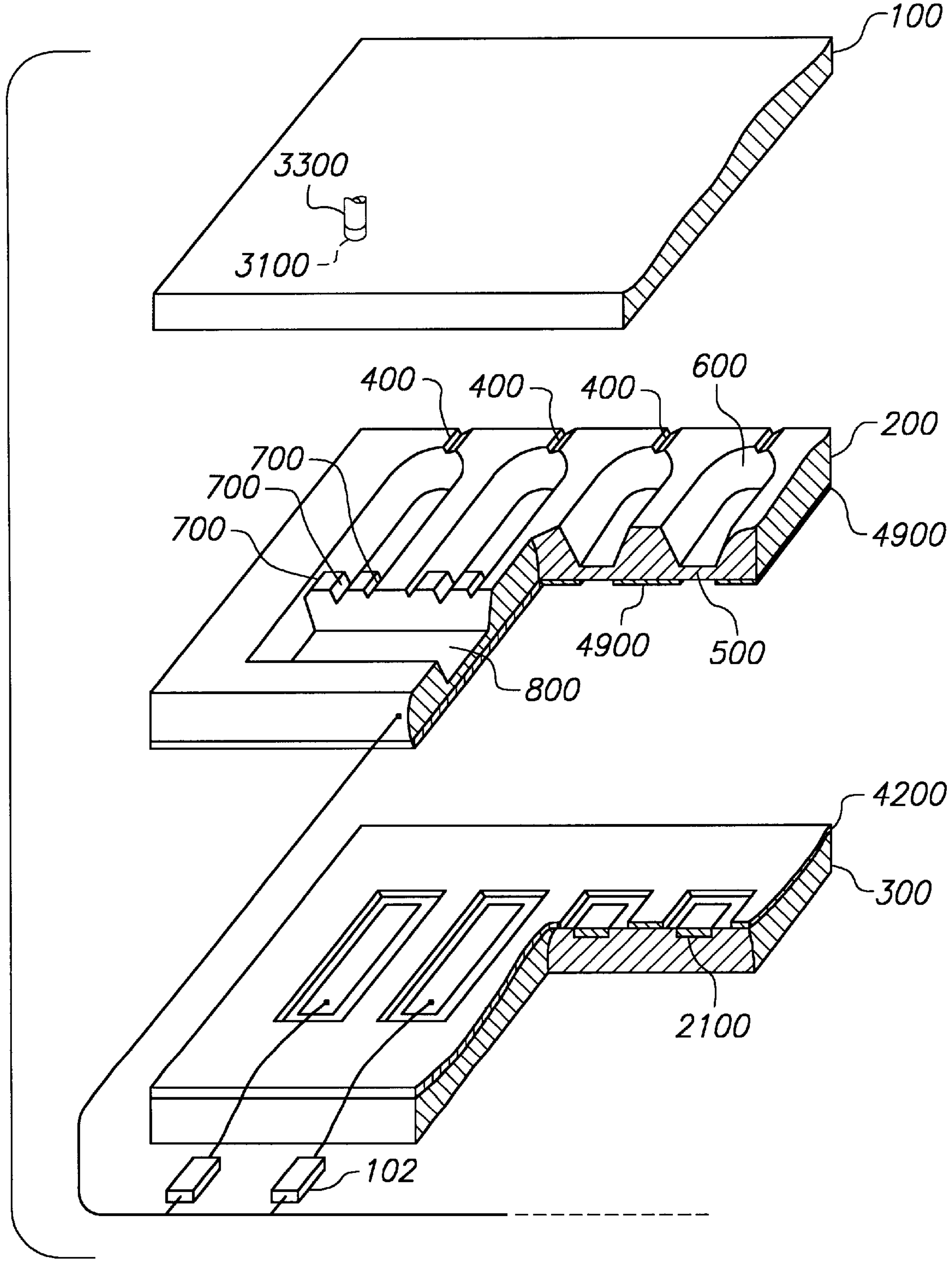
FIG. 30 is an exploded perspective view of the ink-jet head according to the fifteenth embodiment of the present invention.
Figure 31A:
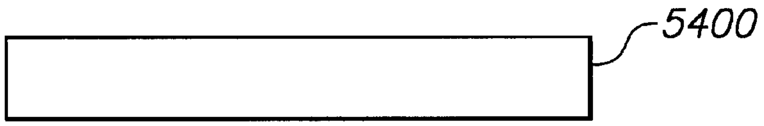
FIGS. 31(*a*) to 31(*g*) show a manufacturing step diagram of the middle substrate according to the fifteenth embodiment of the present invention.
Figure 31B:
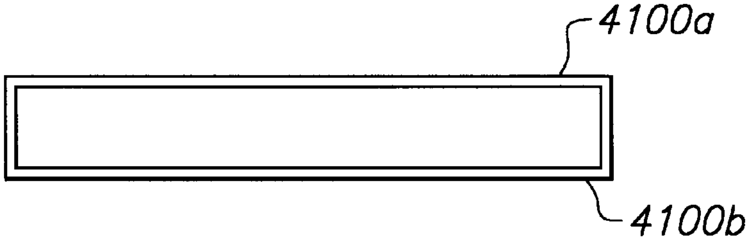
Figure 31C:
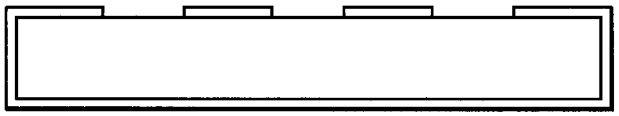
Figure 31D:
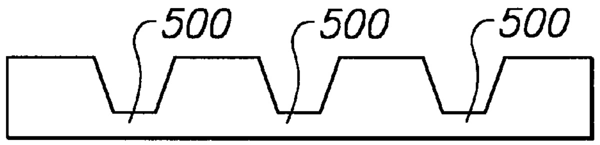
Figure 31E:
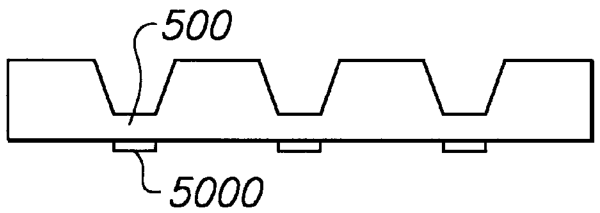
Figure 31F:
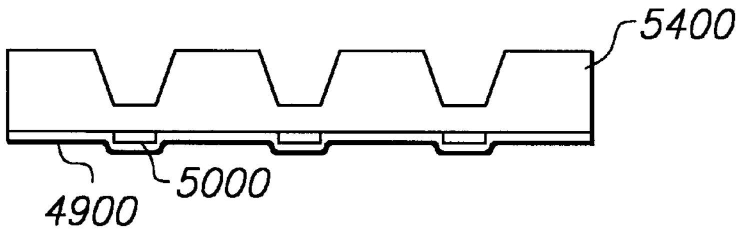
Figure 31G:
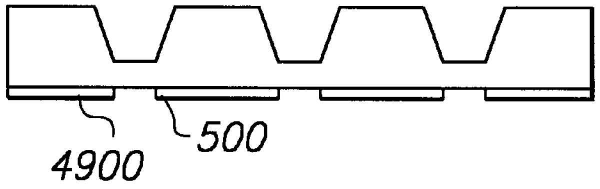

FIG. 30 shows a partly-broken exploded perspective view of the ink jet head of the fifteenth embodiment of the present invention. The ink jet head of the fifteenth embodiment has a structure basically identical with that of the thirteenth embodiment shown in FIG. 23 and has a characteristic thin membrane or film for restricting the distance of the gap formed between the diaphragm 500 and the electrode 2100 when the middle substrate 200 and the lower substrate 300 are combined. The thin film is preferably made of boro-silicated glass (thin membrane 4900) and formed on the bottom face of the middle substrate 200.

FIGS. 31(*a*) to 31(*g*) shows the manufacturing steps of the middle substrate according to the fifteenth embodiment of the present invention.

First, both the faces of silicon wafer of (100) face direction is micro-polished to manufacture a silicon substrate 5400 of a thickness 200 $\mu$m (see FIG. 31(*a*)), and the silicon substrate 5400 is thermal oxidization-treated in an oxygen and steam atmosphere at 1110° C. for 4 hours in order to form $SiO_2$ membranes 4100*a* and 4100*b* of 1 $\mu$m thickness each (see FIG. 31(*b*)).

Next, a photo-resist pattern (not shown) corresponding to outlines of the shapes of nozzle holes 400, emitting chambers 600, etc. is formed on the upper $SiO_2$ membrane 4100*a*, and the exposed portion of the $SiO_2$ membrane 4100*a* is etched by a fluoric acid etching agent in order to remove the photo-resist pattern (see FIG. 31(*c*)).

An anisotrophy etching is carried out on the silicon by using an alkali agent. According to the anisotrophy etching process described in regard to the thirteenth embodiment, the nozzle holes 400 and the emitting chamber 600, etc. are formed. Then, the $SiO_2$ membranes 4100*a* and 4200*b* of anti-etching material are removed by a fluoric acid etching agent (see FIG. 31(*d*)).

Next, boro-silicated glass thin membrane 4900 functioning as a gap spacer precisely restricting the distance between the diaphragm 500 and the electrode 2100 is formed on the lower face of the silicon substrate 5400 through anode bonding as described below.

First, a photo-resist pattern 5000 corresponding to a shape of the diaphragm 500 is formed on the bottom face of the silicon substrate 5400 (see FIG. 31(*e*)). Next, a spattering apparatus forms a boro-silicated glass thin membrane 4900 on the bottom face of the silicon substrate 5400 (see FIG. 31(*f*)). The silicon substrate 5400, sintered in an organic solvent, is then deposited with ultra-sound vibrationin a known manner in order to remove the photo-resist pattern 5000. Consequently, a boro-silicated glass thin membrane 4900 gap spacer is formed on substrate 5400 in a manner surrounding the lower surfaces of the diaphragms as shown in FIG. 31(*g*).

The spattering conditions of the boro-silicated glass this membrane 4900 are described below.

Preferably, in this embodiment, Corning Colporation-made #7740 glass is used as a spattering target, a spattering atmosphere is 80% Ar - 20% $O_2$ at a pressure of 5 m Torr, and microwaved at an RF power og 6 W/cm$^2$. Thus, 0.5 $\mu$m thickness glass thin membrane 4900 is obtained.

The lower substrate 300 and the upper substrate 100 shown in FIG. 30 used to assemble the ink jet head of the present invention are manufactured by the method of the thirteenth embodiment. The middle substrate 200 and upper substrate 100 are anode-bonded or attached integrally by the method of the thirteenth embodiment. The diaphragm 500 formed on the substrate 200 and the electrode 2100 formed on the substrate 300 are matched in their positions and juxtaposed vertically. Combined substrates 200 and 300 are heated to 300° C. on a hot plate, and a DC voltage 50V is applied between them for ten minutes with the middle substrate being positively charged and the lower substrate being negatively charged.

The ink jet head manufactured according to the fifteenth embodiment of the present invention has been tested in real-printing operations and a good result of printing similar to that of the thirteenth embodiment was observed.

According to the fifteenth embodiment, in order to form the gap portion between the diaphragm 500 and the electrode 2100, a boro-silicated glass thin membrane 4900 is formed on the bottom face of the middle substrate 200. Alternatively, one can form the boro-silicated glass thin membrane 4900 on the upper face of the lower substrate 300 instead but still obtain the same effect.

Also, the boro-silicated glass thin membrane 4900 may be formed by the method of the fifteenth embodiment on the lower substrate 300. In an anode bonding of the middle and lower substrates, a DC voltage 50V is applied between them with the middle substrate being positively charged and the lower substrate being negatively charged while heated to a temperature of 300° C. This eventually produces an ink jet head of a quality and a performance identical with that of the fifteenth embodiment.

According to the fifteenth embodiment, it is possible to bond the middle substrate and the lower substrates at 300° C., obtaining the effects mentioned below.

Also, it is possible to use not only p-type or n-type impurities of the thirteenth embodiment, but also, for example, a metal membrane or film of Au or Al, etc. provided that its melting point ranges from at least 100° C. to several hundred degrees centigrade for the electrode 2100. When such metal film is used, it is possible to decrease electric resistance value of the electrode, thereby improving driving frequency of the ink jet head over semiconductor electrode type devices.

Embodiment 16

FIG. 32 shows a partly-broken perspective view of the middle substrate 200 used to the ink jet head according to the sixteenth embodiment of the present invention. The lower and upper substrates having electrodes formed thereon have the structures identical to that of the thirteenth embodiment.

The middle substrate 200 of the sixteenth embodiment is made of the silicon substrate 5700 which includes a p-type silicon substrate 5500 and an n-type Si layer 5600 epitaxially grown on the bottom face of the p-type silicon substrate 5500. In detail, a part of the p-type silicon substrate 5500 is selectively "etched through" by an electro-chemical alkali anisotrophy etching process (to be explained later) in order to remove the substrate 5500 and obtain a diaphragm 500 of precise thickness.

The manufacturing steps of the middle substrate of the sixteenth embodiment is shown in FIGS. 33(*a*) to 33(*e*).

First, both the faces of a silicon wafer of p-type (100) face direction are mirror-polished in order to manufacture a silicon substrate 5500 of a thickness 170 $\mu$m Then, an n-type Si layer 5600 of a thickness 30 $\mu$m is epitaxially grown on a bottom face of the silicon substrate 5500 obtaining a silicon substrate 5700 (see FIG. 33(*a*)). Preferably, boron is doped into the silicon substrate 5500 of a density approaching $4\times10^{15}$/cm$^3$. Al is doped into the n-type Si layer 5600 of a density approaching $5\times10^{15}$/cm$^3$. The epitaxial growth process above can form a Si layer 5600 having a uniform thickness. It is possible to control the thickness with allowance ±0.2 $\mu$m of a preferred target of 30 $\mu$m.

Next, the silicon substrate 5700 is brought under heat-oxidization-treatment in an oxygen-steam atmosphere at 1100° C, for 4 hours. This forms $SiO_2$ membranes 4100*a* and 4100*b* of thickness 1 $\mu$m are formed both the faces of the silicon substrate 5700 (see FIG. 33(*b*)).

A photo-resist pattern (not shown) corresponding to the outlines of the shapes of nozzle holes 400, emitting chambers 600, etc., is formed on the upper $SiO_2$ membrane 4100*a*, and a photo-resist pattern (not shown) corresponding to an electrical lead opening portion 5800 is formed on the lower $SiO_2$ membrane 4100*b*. Then, the exposed portions of the $SiO_2$ membranes 4100*a* and 4100*b* are etched by a fluoric acid etching agent in order to remove the photo-resist pattern (see FIG. 33(*c*)).

Figure 34:
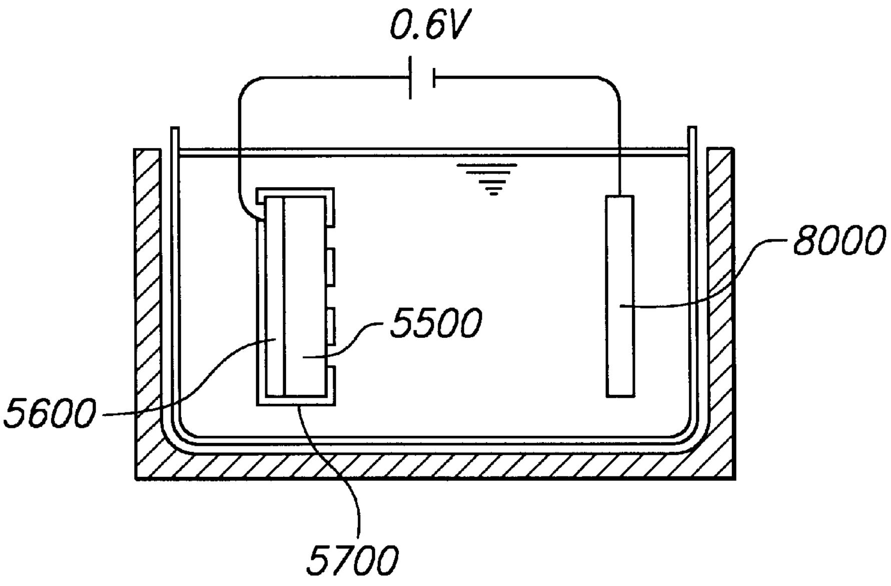
FIG. 34 is a view showing an electrochemical anisotropic etching process used in the sixteenth embodiment of the present invention.

Using the apparatus shown in FIG. 34, the electro-chemical anisotrophy etching steps are carried out. As shown in FIG. 34, a DC voltage of 0.6V is applied when n-type Si layer 5600 is positively charged and platinum plate 8000 is negatively charged. The silicon substrate 5700 is then sunk in KOH solution (70° C.) containing isopropyl alcohol to induce an etching step. When the exposed portions of the p-type silicon substrate 5500 (the portions a $SiO_2$ membrane 4100*a* fails to cover) are completely etched and removed, n-type Si layer 5600 is neutralized by a plus DC voltage to prevent the etching process from proceeding further. At this time, the etching is finished and the silicon substrate of a condition shown in FIG. 33(*d*) is obtained.

Turning back to FIG. 33, in the next stage, a photo-resist (not shown) of a shape corresponding to the diaphragm 500 is formed on the lower $SiO_2$ membrane 4100*b*, the exposed portion of the $SiO_2$ membrane 4100*b* is etched by fluoric acid, and the photo-resist is removed. Simultaneously, all material of the $SiO_2$ membrane 4100*a* remaining on the surface of p-type silicon substrate 5500 is removed, and the middle substrate 200 shown in FIG. 32 is obtained (see FIG. 33(*e*)).

Steps other than those described above are identical to that of the thirteenth embodiment. The observed thickness of the diaphragms 500 of one hundred (100) ink jet heads manufactured by the steps of the sixteenth embodiment are distributed in a range of 30.0±0.2 μm. When the ink jet head of the sixth embodiment is driven with 100V, at 5 Khz, the emitting speeds of ink drops are distributed in a range of 8±0.2 μm/sec, and ink drop volumes are in a range of $(0.1\pm0.005)\times10^{-6}$ cc. This results in a good printing in conformance with the objects of the invention.

Embodiment 17

Figure 35:
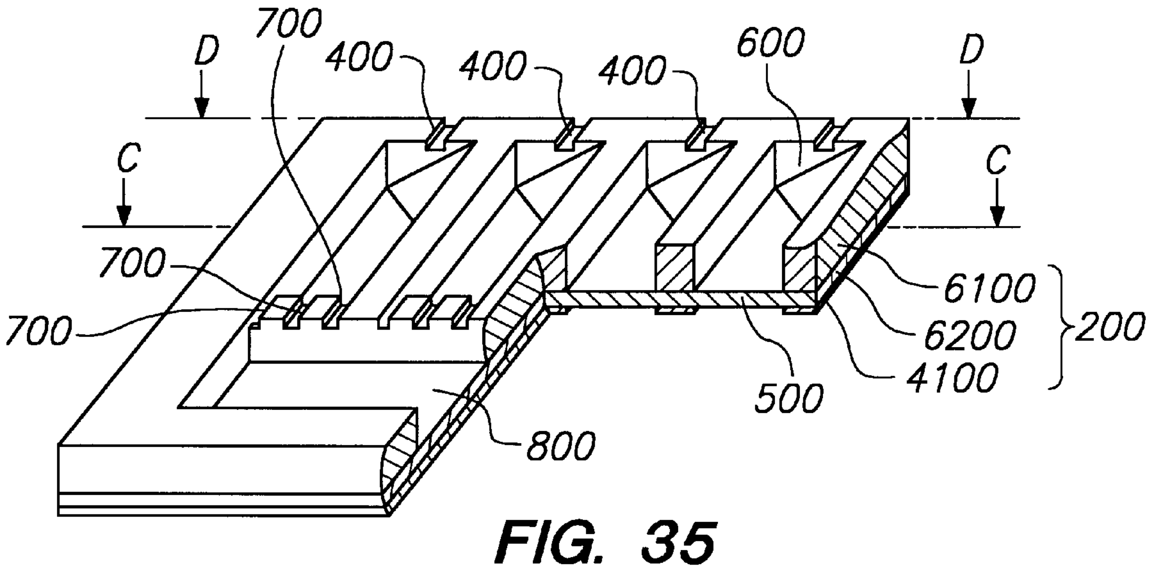
FIG. 35 is a perspective view of the middle substrate of the ink-jet head according to the seventeenth embodiment of the present invention.

FIG. 35 shows a partly-broken perspective view of the middle substrate used in the ink jet head according to the seventeenth embodiment of the present invention. The lower and upper substrates and the manufacturing method for these substrates are identical with that of the thirteenth embodiment. Thus, further explanations thereof are omitted from the specification.

The middle substrate 200 of the seventeenth embodiment is obtained by etch treating a silicon substrate 6300 (FIG. 36) formed by an epitaxially growing of n-type Si layer 6200 on the bottom face of the p-type silicon substrate 6100. The crystal face direction of p-type silicon substrate 6100 is (110). As is well known, in a (110) arrangement, the (111) face perpendicularly crosses to the substrate (110) face in direction (211) and an alkali anisotrophy etching process will enable one to form a wall structure oblique to the substrate face.

The seventeenth embodiment uses this property to narrow each chamber and pitch distances to realize a high density arrangement of the nozzles.

The manufacturing steps of the middle substrate of the seventeenth embodiment are shown in FIGS. 36(*a*) to 36(*g*).

The steps shown in FIGS. 36(*a*) to 36(*d*) correspond to that of the C—C line sections of FIG. 35 and steps of FIGS. 36(*e*) to 36(*g*) correspond to the D—D line sections of FIG. 35.

First, both the faces of the silicon wafer of p-type (110) face direction are mirror-polished to form a silicon substrate 6100 of a thickness 170 mm. An n-type Si layer 6200 of 3 μm is formed on the bottom face of the silicon substrate 6100 by an epitaxial growth step to form the silicon substrate 6300 (see FIG. 36(*a*)). Preferably, the silicon substrate 6100 is doped with B (boron) of density $4\times10^{15}/cm^3$, and the n-type Si layer 6200 is doped with Al of density $5\times10^{14}/cm^3$. In the epitaxial growth step, it is possible to control the target thickness of 3 μm within a ±0.05 μm tolerance.

Next, the silicon substrate 6300 is thermally oxidized-treated at 1100° C. in an oxygen and steam atmosphere in order to form $SiO_2$ membranes 4100*a* and 4100*b* of the thickness 1 μm on both the faces of the silicon substrate 6300 (see FIG. 36(*b*))

A photo-resist pattern (not shown) corresponding to the shapes of cavities and ink cavity, etc. is formed on the upper $SiO_2$ membrane 4100*a*. Also, a photo-resist pattern (not shown) corresponding to an electrical lead opening portion 6400 is formed on the lower $SiO_2$ membrane 4100*b*, and the exposed portions of the $SiO_2$ membranes 4100*a* and 4100*b* are etched by fluoric acid to remove the photo-resist pattern (see FIG. 36(*c*)).

As the size of the photo-resist patterns correspond to the shape of the emitting chamber 600, its width is 50 μm. Also, the distance from the neighboring pattern is 20.7 μm to give a 70.7 μm pitch distance. In turn, the ink drop density per inch is 360 dpi (dots per inch).

Next, the electrochemical anisotrophy etching process, previously mentioned in conjunction with the sixteenth embodiment, is applied to the silicon substrate 6300. Etching is done until the exposed portions of p-type silicon substrate 6100 are completely etched away (see FIG. 36(*d*)). The dents formed in the step shown in FIG. 36(*d*) consist of perpendicular walls relative to the surfaces of the silicon substrate 6300.

The electro-chemical anisotrophy etching process forms a photo-resist pattern (not shown) corresponding to the nozzles 400 and the orifices 700 on the $SiO_2$ membrane 4100*a* which, by now, has itself etched partially away. A photo-resist membrane (not shown) covers all the lower $SiO_2$ membrane 4100*b*. Application of a fluoric acid etching agent etches the exposed portion of the $SiO_2$ membrane 4100*a*, and the photo-resist pattern is removed (see FIG. 36(*e*)).

Next, similarly with the steps shown in FIG. 36(*d*), an electro-chemical etching process etches the substrate until the nozzles 400 and the orifices 700 of thickness 30 μm are formed (see FIG. 36(*f*)).

Last, the whole silicon substrate is dipped in fluoric acid to remove $SiO_2$ membranes 4100*a* and 4100*b* in order to obtain the middle substrate 200 (see FIG. 36(*g*)). The width of the emitting chamber formed on the resulting middle substrate becomes 55 μm, which is a little enlarged by undercutting during the etching step. The pitch distance is 70.7 μm, so it is said the middle substrate obtained has ideal measurements for maximizing nozzle density. The most suitable value of the width of the cavity is determined due to desired ink emitting characteristics. Considering the undercutting, the size of the photo-resist pattern is calculated to obtain the ideally shaped cavity.

Embodiment 18

FIG. 37 is a partly-broken perspective view of the middle substrate of the ink jet head according to the eighteenth embodiment of the present invention. Here, diaphragm 500 is a boron doped layer 6600 having a thickness identical to that necessary for the diaphragm 500 to optimally function. It is known to those ordinarily skilled that the etching rate of alkali used in the diaphragm Si etching step becomes very small when the dopant is a high density (about $5\times10^{19}/cm^3$ or greater) boron.

According to the eighteenth embodiment, the forming range assumes a high density boron doped layer. When an alkali anisotrophy etching forms the emitting chamber 600 and the ink cavity 800, a so-called "etching stop" technique is observed in which the etching rate greatly lessens at the time the boron doped layer 6600 is exposed. This forms the diaphragm 500 and emitting chambers 600 of necessary shape.

The manufacturing steps of the middle substrate according to the eighteenth embodiment of the present invention are shown in FIGS. 38(*a*) to 38(*e*).

First, the faces of a silicon wafer of n-type (110) face direction are mirror-polished in order to form a silicon substrate 6500 of a thickness 200 μm. Then, the silicon substrate 6500 is brought under a thermal-oxidization treatment of 1100° C. for 4 hours in an oxygen and steam atmosphere so as to form $SiO_2$ membranes 4100*a* and 4100*b* of thickness 1 μm on both the faces of the silicon substrate 6500 (see FIG. 38(*a*)).

Next, a photo-resist pattern (not shown) corresponding to the shapes of the diaphragm (boron doped layer) 6600, ink cavity 800, and electrode leads (not shown) is deposited on the lower $SiO_2$ membrane 4100*b*. The exposed portion (parts corresponding to the diaphragm, ink cavity, leads) of the $SiO_2$ membrane 4100*b* is thereafter etched by fluoric acid etching agent and the photo-resist pattern is removed (see FIG. 38 (*b*)). With regard to n-type silicon substrates such as substrate 6500, the etching process proceeds at an etching rate of about 1.5 μm/minutes However, in the boron high density range, e.g., diaphragm 6600, the etching rate lowers to about 0.01 μm/minutes Because the thickness (designed value) of the diaphragm 500 (6600) is 10 μm, it is sufficient to etch and remove only 190 μm of the total thickness 200 μm of the silicon substrate 6500 in order to form the emitting chambers 600 and the ink cavity 800. In practice, it is conventionally difficult to make the thickness of the diaphragms 500 uniform, since the thickness of the base silicon substrates 6500 can vary (±1 to 2 μm).

According to the eighteenth embodiment, the process described herein below can form the thickness to the diaphragms correctly.

It is necessary to etch the silicon substrate for about 126 minutes, 40 seconds in order to etch and remove 190 μm of a thickness of the silicon substrate. In order to etch a thickness 10 μm, an etching step applied for about 6 minutes, 40 seconds is necessary. And, in order to etch and remove 200 μm thickness, a total time of 133 minutes 20 seconds is needed.

On the silicon substrate 6500 of the condition shown in FIG. 38(*d*), an etching step of total time of about 133 minutes 20 seconds using the etching agent is done. After the etching process is started, and about 126 minutes 40 seconds has elapsed, about 190 μm of etching is done on the emitting chamber and the face undergoing etching (not shown) reaches to the boundary of the boron doped layer 6600. Meanwhile, the etching end detection pattern 7100, similarly about 190 μm has been etched. Thereafter, an etching of about 6 minutes 40 seconds is carried out. If the etchant does not reach the boron doped layer 6600, it proceeds at an etching rate of similarly 1.5 μm/minutes This is the case with the etching end detection pattern 7100. However, when the etchant reaches the boron doped layer 6600, the etching rate suddenly drops to about 0.01 μm/minutes Consequently, during the entire 6 minute time period, the boron doped layer 6600 is not noticeably etched, leaving a diaphragm 500 having a boron doped layer of thickness 10 μm.

On the contrary, on the etching end detection pattern 7100, the etching step advances at an etching rate of about 1.5 μm/minutes At last, after the etching for a total time of about 133 minutes 20 sec, a through hole 72 is formed, signaling stoppage of etching.

As described above, the etching time necessary to make this through hole is distributed owing to various thicknesses of the silicon substrate 6500, So, it is necessary to detect when the through hole 7200 is completed at the time of about 133 minutes being elapsed after the etching starts through various means (for example, observation by the operator or applying a laser beam on the etching end detection pattern from one side of the pattern and receiving the laser beam by a light receiving element placed on the opposite side of the pattern when the through hole is completed, see FIG. 38(*e*)).

Next, similar to that of the thirteenth embodiment, a pattern machining for restricting the distances between electrodes formed on the lower substrates is carried out so as to obtain the middle substrate 200.

Notwithstanding that the silicon substrate 6500 has various thickness portions, the diaphragm 500 formed by the process about has a precision of 10±0.1 μm. Such error or allowance of ±0.1 μm appears to depend on distribution of the boron doping and doping depth, and does not depend on application of a particular alkali enchant. Thus, according to the eighteenth embodiment, the precision of the thickness of boron doped layer determines the thickness precision of the diaphragm. In order to obtain the correct thickness precision in the range of about 10 μm thickness, it is the most preferable method to use $BBr_3$ as the diffusion source. However, other suitable methods known to those ordinarily skilled in the art can be used to attain the doped thickness precision corresponding to that obtained by $BBr_3$ diffusion.

According to the eighteenth embodiment, simultaneously with the boron doping step for the diaphragm, the doping is performed to those leads positioned on the diaphragm. Because of that, the driving electrodes having the structure identical with the diaphragm of the fourteenth embodiment, so it is possible also to attain an improvement in driving frequency (and ultimately print speed).

In addition, according to the eighteenth embodiment, an n-type substrate is used for the silicon substrate base material. However, if p-type substrate is instead used, it will become recognizable to an ordinary skill that it is still possible to form the boron doped diaphragms, using suitable n-type dopants.

The substrate anode-junction methods according to the present invention will be explained with reference to the following embodiments 19 to 22.

Embodiment 19

Figure 40:
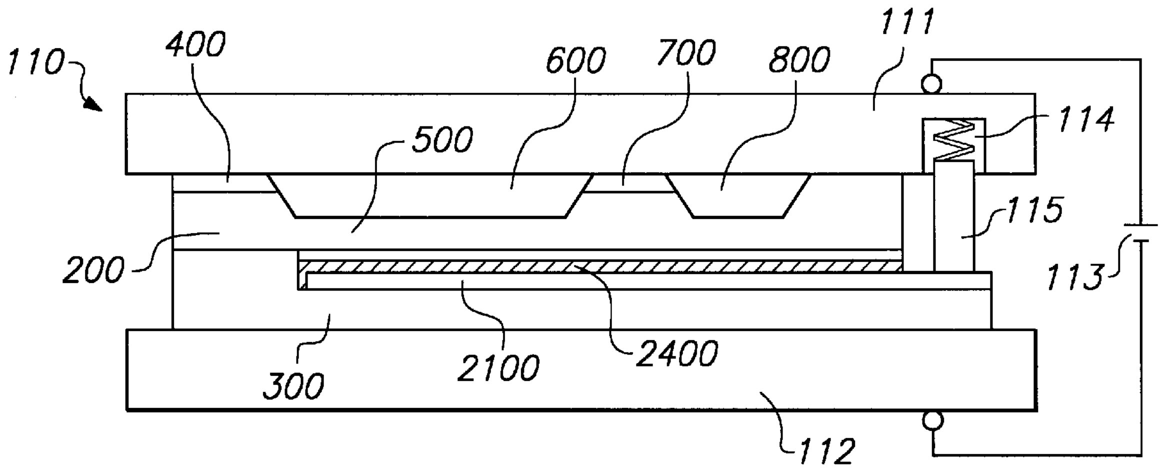
FIG. 40 is a sectional view of the nineteenth embodiment depicting an anode connecting apparatus used in the anode connecting process of the present invention.
Figure 41:
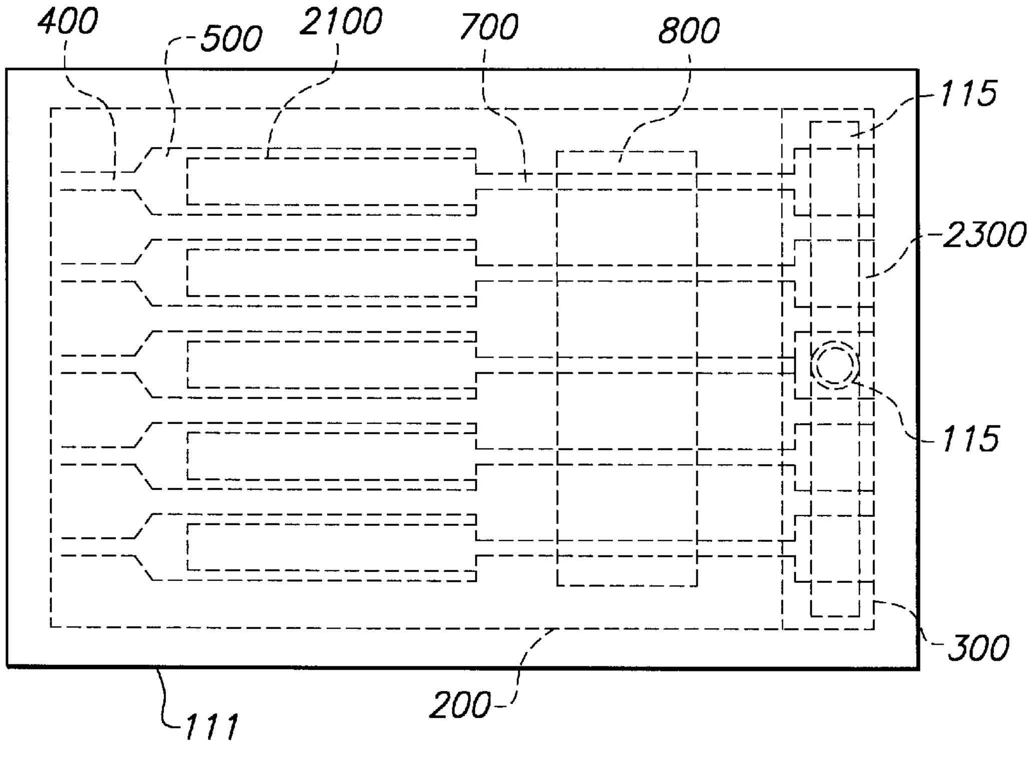
FIG. 41 is a plan view of the anode connecting apparatus shown in FIG. 40.

FIG. 40 shows an outline of the nineteenth embodiment of the present invention illustrating an anode bonding method. More particularly, it illustrates a section of a bonding apparatus used for the method and of the substrates undergoing bonding. FIG. 41 is a plan view of this bonding apparatus.

The nineteenth embodiment shown relates to an anode bonding method for bonding of a middle silicon substrate 200 and a lower boro-silicated glass substrate 300. The bonding apparatus consists of an anode bonding electrode plate 111 to be connected to a positive terminal of a power source 113, a cathode bonding electrode plate 112, and a terminal plate 115 protruding from the anode bonding electrode plate 111 through a spring 114. Gold plating is applied on the surfaces of the anode bonding electrode plate 111 and the cathode bonding electrode plate 112 in order to decrease contact resistance of the surfaces. The terminal plate 115 is constructed by a single contact plate in order to equalize in potential a plurality of electrodes 2100 on the boro-silicated glass substrate 300 and the silicon substrate 200. The terminal plate 115 is connected to the anode bonding electrode plate 111 by means of the spring 114 and the spring keeps the terminal plate 115 in suitable contact pressure with the electrode 2100. The terminal plate 115 comes to contact with the terminal portion 2300 of the electrode 2100.

The middle silicon substrate 200 and the lower boro-silicated glass substrate 300 are aligned as described hereinabove. In detail, each of the diaphragm 500 and the electrode 2100, respectively formed thereon are aligned by an aligning device (not shown) after they are washed. Then, they are set as shown in FIG. 40 and FIG. 41. During anodic bonding, the electrode 2100, and the electrode plates 111 and 112 are placed in nitrogen gas atmosphere in order to prevent the surfaces of them from being oxidized.

During this anode bonding method, first both the lower and middle substrates are heated. In order to prevent the boro-silicated glass substrate S from breaking due to a sudden rise of temperature, it is necessary to heat it gradually to 300° C. for about 20 minutes Next, the power source 113 applies a 500V voltage for about 20 minutes so as to bond together both substrates. During the anode bonding method, Na ions in the boro-silicated glass substrate 300 move and current flows through the substrate. It is possible to judge the joined condition of them when they are connected because a value of current decreases. In order to prevent strain-crack due to thermal conductivities of both the substrates after they are connected, it is necessary to cool them gradually for about 20 minutes It is possible to prevent discharging and electric field dispersion between the terminal plate 115 and the spring 114 by decreasing the potential difference between the electrode 2100 and diaphragm 500. This effectively minimizes the electric field. As a result, a large current does not flow between the electrode 2100 and the diaphragm 500 preventing the electrode 2100 from melting. Also, because that static electricity attractive force due to electric field will not appreciably occur in the diaphragm 500, no additional stress is generated in the diaphragm 500 after it is secured through its circumference.

Without equalizing the electrode/diaphragm potentials, the dielectric membrane 2400 is charged with electrons transferred from the diaphragm 500 and produces an undesirable electric field. In the presence of such a field, the dielectric membrane 2400 endures static electricity attractive force along the direction of the diaphragm 500 and eventually causes the dielectric to peel off. However, when the electrode 2100 and the diaphragm 500 are made equal in their potential, it is possible to prevent the dielectric membrane 2400 from being peeled off, as no electric field is produced.

Embodiment 20

Alternatively, according to the twentieth embodiment, coil springs similar to that shown in FIG. 40 can extend from the anode-electrode plate to directly contact with respective electrodes 2100. Otherwise, the structure of the embodiment is identical with that shown and described with reference to FIG. 40.

These springs are made of SUS, known for its durability at high temperatures. Ordinarily, SUS is not preferable to be used as terminal material because it has resistance on its surface produced by oxidized films. However, in the anode bonding, where the purpose is to apply high voltage and equalize potential differences, it is possible to obtain good results if the current is low. When independent coil springs as described above are used, it is possible to prevent the substrates from curving due to being heated as a consequence of the anode bonding process and are resistant to wear from repeated use.

Embodiment 21

Figure 43:
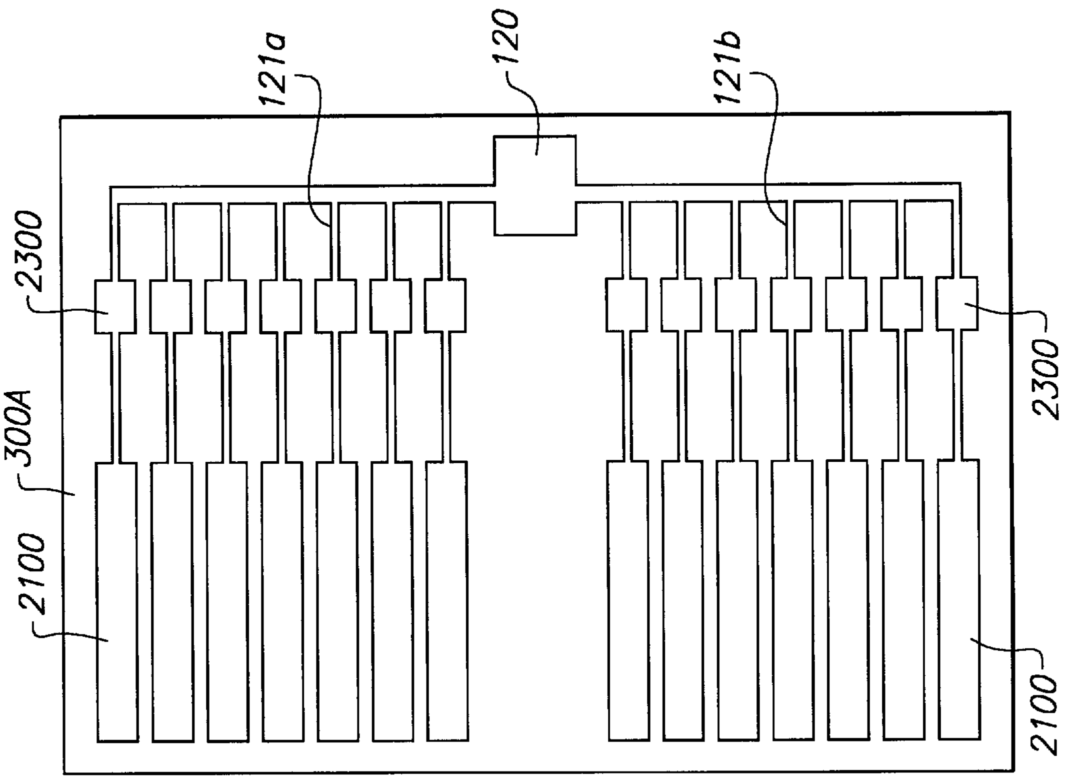
FIG. 43 is a plan view of the anode connecting apparatus shown in FIG. 42.
Figure 42:
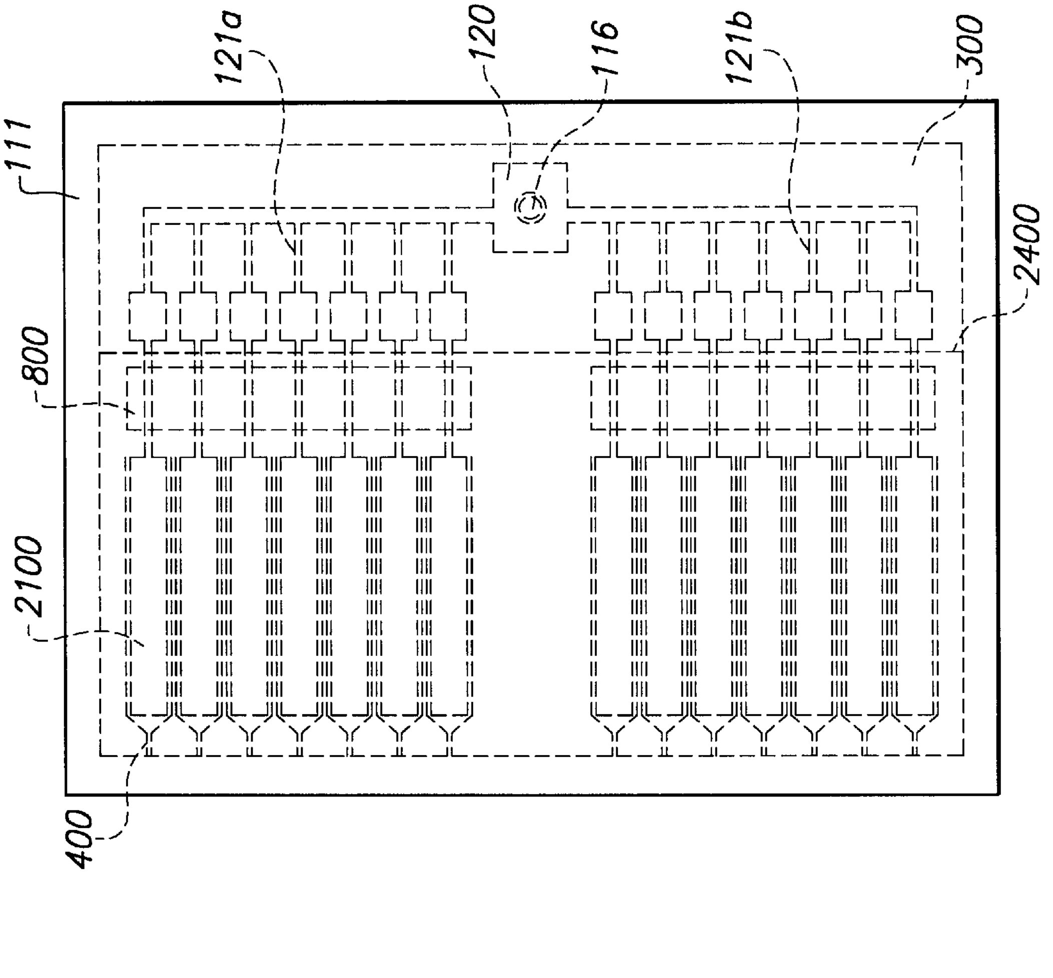
FIG. 42 is a plan view of the twenty-first embodiment depicting yet another anode connecting apparatus.

FIG. 42 shows a plan view of the anode bonding apparatus according to another embodiment of the present invention. FIG. 43 is a plan view showing the arrangement relation of the electrodes on the lower substrate to the common electrode. In FIG. 43, the dielectric membrane 2400 is omitted.

According to the twenty-first embodiment, a photolithography method which involves a batch treatment system is used in order to form simultaneously a plurality of electrodes 2100 for plural sets (in the embodiment, two) of ink jet heads and their respective electrode 2100 on a single boro-silicated glass substrate 300A. The common electrode 120 has lead portions 121*a* and 121*b* to be connected to the terminal portion 2300 of all the electrodes 2100. In addition, a single "middle" silicon substrate (not shown) to be connected to the boro-silicated glass substrate 300A has a plurality of sets of elements (nozzle, emitting chamber, diaphragm, orifice and ink cavity) having the structures shown in FIG. 40 . Then, in the joining step, a single terminal 116 consisting of a coil spring shown in FIG. 26 comes to contact with the common electrode 120 in order to lead it to the anode-side joining electrode plate 111.

Consequently, it is possible to make all electrodes 2100 and all diaphragms of respective sets equal to each other in potential obtaining the same effect, as that described in the previous embodiments.

After they are connected, each set is cut by dicing a known method. The common electrodes 120 are cut off from the electrodes 2100 of respective sets by separating lead portions 121*a* and 121*b*.

Embodiment 22

Figure 44:
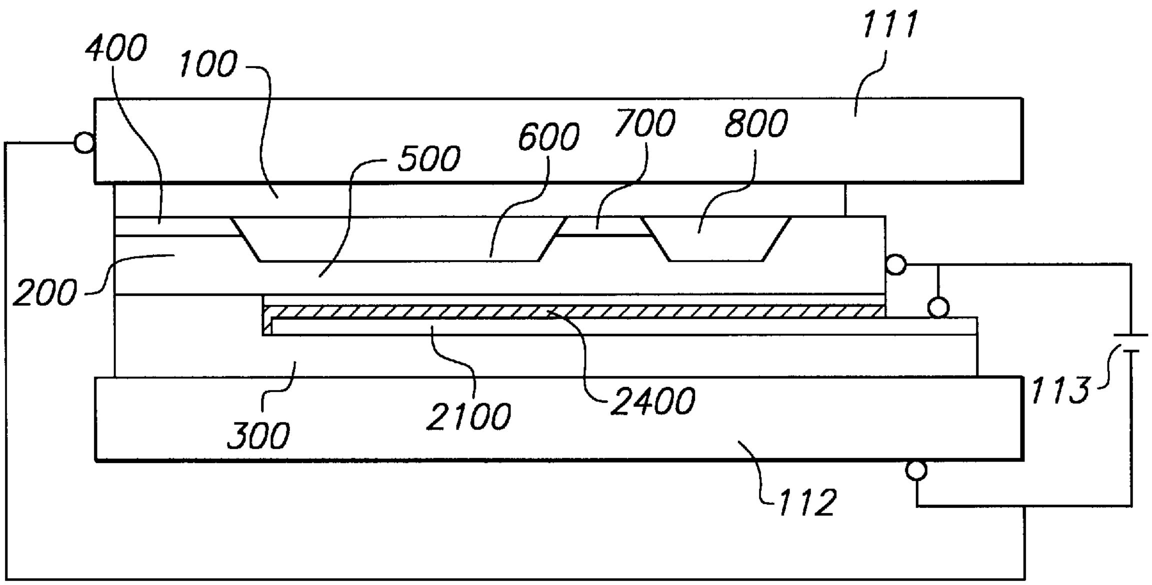
FIG. 44 is a sectional view of the twenty-second embodiment depicting still another anode connecting apparatus.

FIG. 44 is a section of an anode bonding apparatus according to still another embodiment of the present invention.

According to the twenty-second embodiment, three substrates 100, 200 and 300 are simultaneously anode-bonded to each other. The middle substrate 200 is of silicon, and the second and upper substrates, 200 and 300, are boro-silicated. The upper substrate 100 functions merely as a lid for nozzle holes 400, emitting chamber 600, orifice 700 and ink cavity 800. The bond between the upper 100 and middle 200 substrates is consequently less critical, so soda glass may be substituted for boro-silicated with respect to upper substrate 100. However, when the upper substrate is made of boro-silicated glass, it is possible to improve its reliability.

In accordance with the twenty-second embodiment, upper and lower joining electrode plates 111 and 112 to be contacted with the lower and upper boro-silicated glass substrates 300 and 100 are connected to a negative terminal of the power source 113, the middle silicon substrate 200 and the electrode 2100 on the boro-silicated glass substrate 300 are connected to the positive terminal of the power source 113. Then, they are simultaneously anode bonded. As a result, according to the simultaneous anode bonding process, it is possible to reduce the time used to heat and gradually cool the substrates 100, 200 and 300, thus effectively reducing the overall anode bonding processing time. Additionally, as described in regard to the nineteenth embodiment and the twenty-first embodiments above, it is possible to protect the surface on the silicon substrate 200 from being polluted by direct contact with the upper bonding electrode plate 111.

In the twenty-third and twenty-fourth embodiments below, structures preventing dust from invading into the gap portion during anodic bonding are formed. Here, a static electricity actuator is exemplified.

Embodiment 23

Figure 45:
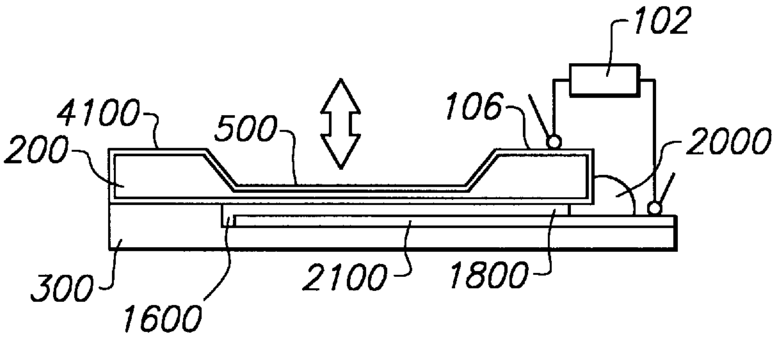
FIG. 45 is a sectional view of the twenty-third embodiment of the present invention which incorporates dust prohibition.
Figure 46:
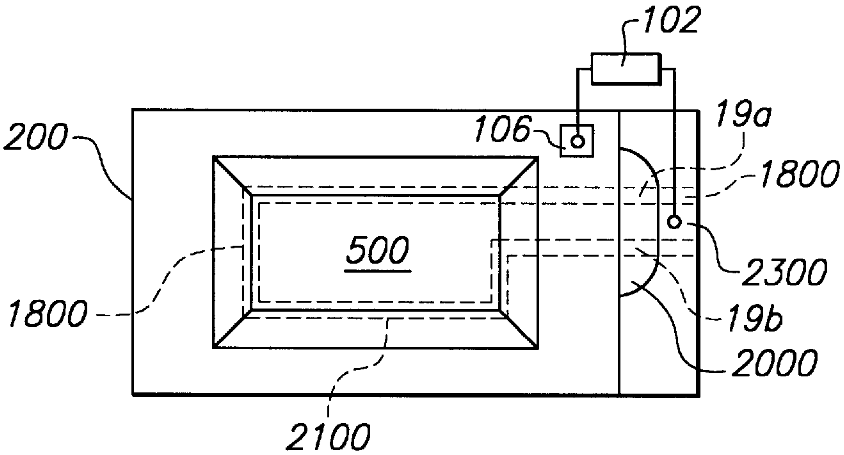
FIG. 46 is a plan view of the embodiment shown in FIG. 45.

FIG. 45 is a section of a static electricity actuator similar to that of the thirteenth embodiment of the present invention. FIG. 46 is its sectional view.

As is apparent from the previous embodiments, the middle substrate 200 and the lower substrate 300 are direct Si bonded or anode bonded with respect to a predetermined gap length. Because a temperature when the anode bonding or bonding process is done is high, air in the gap portion

1600 expands. When air temperature lowers to the room temperature after bonding, the pressure in the gap portion 1600 lowers to less than that of the ambient atmosphere, so the diaphragm 500 bends toward the electrode 2100, eventually coming into contact with the electrode 2100 and being short-circuited. Also, unnecessary stress may be imparted on the diaphragm 500. Further, when the gap portion 1600 is open to the atmosphere in order to prevent such disadvantageous effects and kept at such open conditions, static electricity in the gap portion and the surrounding mechanism sucks in dust. As a result, such dust attaches to the electrode 2100, thereby changing the vibration characteristic of the vibrating chamber.

In order to solve these problem, an epoxy sealant is applied to the cooling vents of each vibrating chamber formed when substrates 200 and 300 are joined by anodic bonding. Preferably, the sealant will allow air to pass between the outside air and the vibrating chamber when the substrates 200 and 300 are still relatively hot (due to anodic bonding). However, the sealant will begin to seal off the chamber starting at a particular chamber and eventually plug off the vent as the structure cools to room temperature.

More particularly, in reference to FIGS. 45 and 46, these figures depict the ink jet head of the thirteenth embodiment after application of a suitable sealing epoxy. Gap portion 1600 is open to the atmosphere through the passage 1800. Immediately after anodic bonding and while the ink jet head is still hot, outlet ports 19*a* and 19*b* of the passage 1800 are sealed by sealer agent 2000 of epoxy or like material which has a high viscosity when the substrates 200 and 300 are cooled to the room temperature after anode-bonding.

Reference numerals 2300 indicate a terminal portion of the electrode 2100. 4100 relates to an $SiO_2$ membrane or a dielectric membrane formed on the middle substrate 200, 102 relates to an oscillation circuit, and 106 is a metal membrane formed to connect one terminal of the oscillation circuit 102 to the middle substrate. Passage 1800 extends to surround the electrode 2100.

Because the silicon substrate constituting the middle substrate 200 has a high thermal conductivity, the sealer 2000 is preferably made of thermal plastic resin. Because sealing member 2000 has a high viscosity, it fails to flow-in to the passage 1800.

Consequently, according to the twenty-third embodiment of the present invention, the gap portion 1600 is open or led to the atmosphere through the passage 1800 while undergoing anode bonding, so that any heating caused by the anode-bonding operation fails to raise the pressure in the gap portion 1600. After anode-bonding is finished and the temperature lowers to the room temperature, the sealing member 2000 flows and seals the outlet of the passage 1800, preventing dust from invading the gap portion 1600. The aforesaid effect is also available if a gaseous body such as nitrogen, argon, etc. is enclosed in said gap portion 1600 when it is sealed.

Embodiment 24

Figure 47:
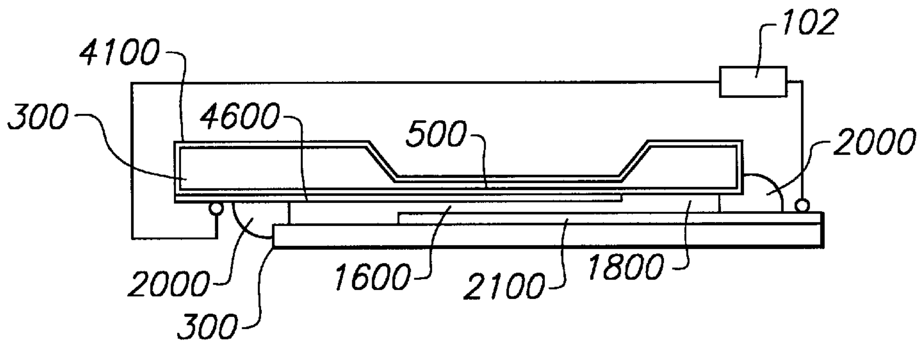
FIG. 47 is a sectional view of the twenty-fourth embodiment which includes dust prohibition according to the invention.

FIG. 47 depicts a section of the static electricity actuator according to another embodiment of the present invention.

According to the twenty-fourth embodiment, the static electricity actuator has a second electrode 4600 placed under the diaphragm 500 so as to oppose to the electrode 2100. The second electrode 4600 is preferably made of Cr or Au, arranged as a thin membrane.

The static electricity actuator functions as a capacitor. When "V" volts are applied across the opposed electrodes 2100 and 4600, Vc, the voltage between the opposed electrodes 2100 and 4600 behaves according to the following equations:

$$Vc=V\,(1-\exp(-t/T)) \qquad \text{charging time}$$

$$Vc=V\exp(-t/T) \qquad \text{discharging time}$$

Wherein T: time constant.

It is apparent from the equations above that they involve exponential functions. When the time constant T is large, rising speed of Vc is made slow. The time constant T is given by an equation RC (wherein the resistance is R and static electricity capacitance is C). Because a resistance of silicon is higher than metals, -the electrode 46 of Cr or Au thin membrane having low resistance is used as a diaphragm 500 so as to drive the ink jet head at a high speed. When the time constant is made low, responsibility of the actuator improves.

Embodiment 25

Figure 48:
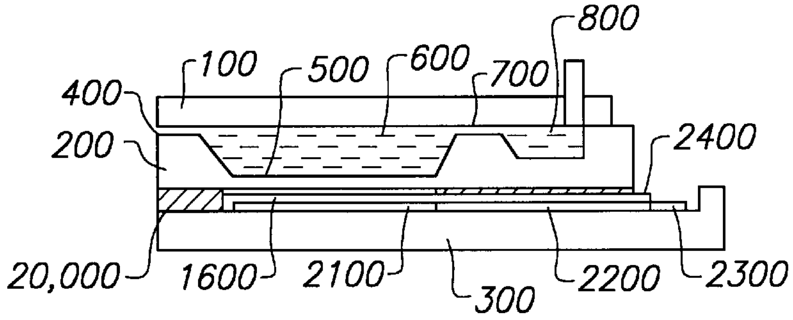
FIG. 48 is a sectional view of embodiment twenty-five according to the present invention.

FIG. 48 shows a section of the ink jet head according to still another embodiment of the present invention.

In the twenty-fifth embodiment, the gap G to be formed under the diaphragm 500 is kept by a thickness of photo-sensitive resin layer or adhesive agent layer 20,000. That is, patterns of the photosensitive resin layer or adhesive agent layer 20,000 are printed around the electrode 2100 of the lower substrate 300 and both the lower substrate 300 and the middle substrate 200 are adhered to each other making a lamination. In practice, soda glass is used as the lower substrate 300 and it is constructed as described in the twelfth embodiment.

A photo-sensitive polymid is used as a photo-sensitive resin and is printed around the electrode 2100 of the lower substrate 300 forming the pattern 20,000 of photo-sensitive resin layer. While similar to that of the twelfth embodiment, the bottom face of the middle silicon substrate 200 is plainly polished and the middle substrate 200 and lower substrate 300 are laminated. As a result, when the photo-sensitive resin is used, the gap length G between the diaphragm 500 and the electrode 2100 is 1.4 $\mu$m. When an adhesive agent of epoxy bond is used, its thickness G is 1.5 $\mu$m, and the substrates 200 and 300 are laminated at a temperature of 100° C. In this case, the gap length G is a little less than 1.9 $\mu$m. When an adhesive agent is used, it is necessary to press together the substrate 200 and other substrate 300, so the gap length G decreases from that of the photo-sensitive resin.

It is possible to use such a gap holding means of photo-sensitive resin and adhesive agent to keep the predetermined length or thickness of the gap. It is noted that the ink jet head of the present invention using such gap holding means can be driven by a low voltage identical with that of the twelfth embodiment attaining a good printing result. Of course, this type of ink-jet head is simple to produce.

Not only polymid but also other materials of photo-sensitive resin such as acrylic, epoxy and the like can be used. Temperature of thermal treatment is controlled according to the kind of various resins. With regard to adhesive agents, acrylic, cyano, urethane, silicon or other like various materials can be substituted with equal effect.

The foregoing disclosure and description of the invention are illustrative and explanatory thereof, and various changes in the size, shape, materials, components, circuit elements, wiring connections and contacts, as well as in the details of the illustrated circuitry, construction, processing and method of operation may be made without departing from the spirit of the invention.

We claim:

1. A method for producing an electrostatically-driven ink jet head, comprising the steps of:

(A) etching a first surface of a silicon substrate to define an ink ejection chamber therein, the ink ejection chamber including a deformable diaphragm interposing the first and an opposing second surface of the silicon substrate;

(B) patterning a gap-spacing section of a substantially uniform thickness on the second surface of the silicon substrate circumscribing the diaphragm;

(C) bonding a first insulating substrate to the first surface of the silicon substrate;

(D) forming an electrode on a surface of a second insulating substrate;

(E) aligning the silicon substrate and the second insulating substrate such that the gap-spacing section disposed on the second surface of the silicon substrate and the surface of the second insulating substrate are juxtaposed with the diaphragm and the electrode substantially overlapping; and (F) anodically bonding the silicon substrate and the second insulating substrate together to form a multilayered structure having the diaphragm and electrode separated by a distance including the thickness of the gap-spacing section.

2. The method of claim 1 wherein said step (A) further comprises etching the first surface of the silicon substrate to define a nozzle channel in communication with the ink ejection chamber.

3. The method of claim 1 wherein a nozzle opening is formed in the first insulating substrate; and wherein said bonding step (C) comprises bonding the first insulating substrate to the first surface of the silicon substrate thereby communicating the ejection chamber to the nozzle opening.

4. The method of claim 1, further comprising the step of:

(G) etching a portion of the second surface of the silicon substrate adjacent the diaphragm to form a cavity proximate the diaphragm at one end and extending to an outlet port positioned at an edge of the silicon substrate.

5. The method of claim 4, wherein said aligning step (E) comprises aligning the silicon substrate and the second insulating substrate such that the gap-spacing section disposed on the second surface of the silicon substrate and the surface of the second insulating substrate are juxtaposed with the diaphragm and cavity of the silicon substrate substantially overlapping the electrode of the second insulating substrate; and wherein said bonding step (F) comprises anodically bonding the silicon substrate and the second insulating substrate together to form a multilayered structure including a vibration chamber in communication with the outlet port interposing the diaphragm and cavity of the silicon substrate and the electrode of the second insulating substrate.

6. The method of claim 5, further comprising the step of:

(H) applying a viscous epoxy to the outlet port to seal-off the vibration chamber.

7. The method of claim 1, wherein said patterning step (B) further comprises etching the second surface of the silicon substrate to form a concave portion of substantially uniform depth surrounding the diaphragm.

8. The method of claim 1, wherein said patterning step (B) comprises patterning a gap-spacing section of $SiO_2$ via one of a spattering process, a CVD process, a vapor deposition process, an ion-implanting process, a sol-gel process, a thermal oxidation process, and an organic silicon composition sintering process.

9. The method of claim 1, wherein said patterning step (B) comprises patterning a gap-spacing section of boro-silicated glass via a spattering process.

10. The method of claim 1 wherein the second insulating substrate is a substantially pure silicon substrate, and further comprising the step of:

(I) doping the electrode of the second insulating substrate with a first type impurity; and (J) doping the diaphragm of the silicon substrate with a second type impurity.

11. The method of claim 1, wherein said bonding step (F) comprises the steps of:

(F1) gradually heating the silicon substrate and the second insulating substrate;

(F2) applying a voltage across the heated silicon substrate and the heated second insulating substrate for a preselected time period; and (F3) detecting and minimizing an electrostatic charge differential between the diaphragm and the electrode during the preselected time period to reduce electrostatic damage to the electrode.

12. A method for producing an electrostatically-driven ink jet head, comprising the steps of:

(A) etching a first surface of a silicon substrate to define an ink ejection chamber therein, the ink ejection chamber including a deformable diaphragm interposing the first and an opposing second surface of the silicon substrate;

(B) bonding a first insulating substrate to the first surface of the silicon substrate;

(C) forming an electrode on a surface of a second insulating substrate;

(D) patterning a gap-spacing section of substantially uniform thickness on the surface of the second insulating substrate circumscribing the electrode;

(E) aligning the silicon substrate and the second insulating substrate such that the gap-spacing section disposed on the surface of the second insulating substrate and the second surface of the silicon substrate are juxtaposed with the diaphragm and the electrode substantially overlapping; and (F) anodically bonding the silicon substrate and the second insulating substrate together to form a multilayered structure having the diaphragm and electrode separated by a distance including the thickness of the gap-spacing section.

13. The method of claim 12 wherein said step (A) further comprises etching the first surface of the silicon substrate to define a nozzle channel in communication with the ink ejection chamber.

14. The method of claim 12 wherein;

a nozzle opening is formed in the first insulating substrate; and said bonding step (C) comprises bonding the first insulating substrate to the first surface of the silicon substrate thereby communicating the ejection chamber to the nozzle opening.

15. The method of claim 12, further comprising the step of:

(G) forming a terminal to supply a power voltage to the electrode on a portion of the surface of the second insulating substrate, (H) etching a portion of the surface of the second insulating substrate adjacent the electrode to form a cavity proximate the electrode at one end and extending to an outlet port positioned at a distal end of the terminal, and (I) forming a lead electrically connecting the terminal to the electrode within the cavity.

16. The method of claim 15, wherein said bonding step (F) comprises anodically bonding the silicon substrate and the second insulating substrate together to form a multilayered structure including a vibration chamber in communication with the outlet port, the vibration chamber interposing the diaphragm of the silicon substrate and the electrode of the second insulating substrate.

17. The method of claim 15, further comprising the step of (I) applying a viscous epoxy to the outlet port to seal-off the vibration chamber.

18. The method of claim 12, wherein said patterning step (D) further comprises etching the second insulating substrate to form a concave portion of substantially uniform depth on the surface of the second insulating substrate; and wherein said forming step (C) comprises forming the electrode within the concave portion of the second insulating substrate.

19. The method of claim 12, wherein said patterning step (D) further comprises patterning a gap-spacing section of $SiO_2$ via one of a spattering process, a CVD process, a vapor deposition process, an ion-implanting process, a sol-gel process, a thermal oxidation process, and an organic silicon composition sintering process.

20. The method of claim 12, wherein said patterning step (D) comprises patterning a gap-spacing section of borosilicated glass via a spattering process.

21. The method of claim 12, wherein the second insulating substrate is a substantially pure silicon substrate, and further comprising the step of:

(J) doping the electrode of the second insulating substrate with a first type impurity; and (K) doping the diaphragm of the silicon substrate with a second type impurity.

22. The method of claim 12, wherein said bonding step (F) comprises the steps of:

(F1) gradually heating the silicon substrate and the second insulating substrate;

(F2) applying a voltage across the heated silicon substrate and the heated second insulating substrate for a preselected time period; and (F3) detecting and minimizing an electrostatic charge differential between the diaphragm and the electrode during the preselected time period to reduce electrostatic damage to the electrode.

23. A method for producing an electrostatically-driven ink jet head, comprising the steps of:

(A) etching a first surface of a first silicon substrate to define an ink ejection chamber therein, the ink ejection chamber including a diaphragm extending to an opposing second surface of the first silicon substrate;

(B) patterning an $SiO_2$ membrane on the second surface of the first silicon substrate circumscribing the diaphragm;

(C) forming an electrode on a surface of a second silicon substrate;

(D) patterning an $SiO_2$ membrane on the surface of the second silicon substrate circumscribing the electrode;

(E) aligning the first and second silicon substrates such that their respective $SiO_2$ membranes are juxtaposed with the diaphragm and the electrode substantially overlapping; and (F) bonding the first and second silicon substrates together at their respective $SiO_2$ membranes via a direct Si—Si bonding process to form a multilayered structure having the diaphragm and electrode separated by a precise gap distance.

24. The method of claim 23, wherein said patterning steps (B) and (D) each comprise patterning an $SiO_2$ membrane via one of a spattering process, a CVD process, a vapor deposition process, an ion-implanting process, a sol-gel process, a thermal oxidation process, and an organic silicon composition sintering process.

25. The method of claim 23, further comprising the step of:

(G) doping the electrode of the second silicon substrate with a first type impurity; and (H) doping the diaphragm of the first silicon substrate with a second type impurity.

26. A method for producing an electrostatically-driven ink jet head, comprising the steps of:

(A) etching a first surface of a silicon substrate to define an ink ejection chamber therein, the ink ejection chamber including a deformable diaphragm interposing the first and an opposing second surface of the silicon substrate;

(B) etching a portion of the second surface of the silicon substrate adjacent the diaphragm to form a cavity proximate the diaphragm at one end and extending to an outlet port positioned at an edge of the silicon substrate;

(C) forming an electrode on a surface of an insulating substrate;

(D) aligning the silicon and insulating silicon substrates such that the second surface of the silicon substrate and the surface of the insulating substrate are juxtaposed with the diaphragm and cavity of the silicon substrate substantially overlapping the electrode of the insulating substrate;

(E) anodically bonding the silicon and insulating substrates together to form a multilayered structure including a vibration chamber in communication with the outlet port, the vibration chamber separating the diaphragm and cavity of the silicon substrate from the electrode of the insulating substrate; and (F) applying a viscous epoxy to the outlet port to seal-off the vibration chamber.

27. The method of claim 26, wherein the viscous epoxy comprises a thermal plastic resin.

28. The method of claim 26, further comprising the step of:

(F) doping the electrode of the insulating substrate with a first type impurity; and (G) doping the diaphragm of the silicon substrate with a second type impurity.

29. The method of claim 26, wherein said bonding step (E) comprises the steps of:

(E1) gradually heating the silicon and insulating substrates;

(E2) applying a voltage across the heated silicon and insulating substrates for a preselected time period; and (E3) detecting and minimizing an electrostatic charge differential between the diaphragm and the electrode during the preselected time period to reduce electrostatic damage to the electrode.

30. The method of claim 29, wherein said detecting and minimizing step (E3) comprises eliminating the detected charge differential between the diaphragm and electrode by electrically shunting the diaphragm to the electrode during the preselected time period.

31. A method for producing an ink jet head, comprising the steps of:

(A) selectively etching a first surface of a silicon substrate to define a plurality of substantially concave ink ejection chambers;

(B) etching portions of the second surface of the silicon substrate beneath each ink ejection chamber to form a corresponding plurality of thin diaphragms, each diaphragm interposing a corresponding ink ejection chamber and the second surface of the fsilicon substrate;

(C) bonding a first insulating substrate to the first surface of the silicon substrate;

(D) forming a corresponding plurality of electrodes on a surface of a second insulating substrate;

(E) aligning the silicon and second insulating substrates such that the second surface of the silicon substrate and the surface of the insulating substrate are juxtaposed with each silicon substrate diaphragm in facing relation with a corresponding electrode of the second insulating substrate; and (F) bonding the silicon and second insulating substrates together to form a multilayered structure which separates each diaphragm from its corresponding electrode by a predetermined gap distance.

32. A method for producing an ink jet head, comprising the steps of:

(A) selectively etching a first surface of a silicon substrate to define a plurality of substantially concave ink ejection chambers;

(B) bonding a first insulating substrate to the first surface of the silicon substrate;

(C) forming a corresponding plurality of electrodes on a surface of a second insulating substrate;

(D) patterning a gap-spacing section of substantially uniform thickness on the surface of the second insulating substrate circumscribing each electrode;

(E) aligning the silicon and second insulating substrates such that the second surface of the silicon substrate and the surface of the insulating substrate are juxtaposed with each silicon substrate diaphragm in facing relation with a corresponding electrode of the second insulating substrate; and (F) bonding the silicon and second insulating substrates together to form a multilayered structure which separates each diaphragm from its corresponding electrode by a predetermined gap distance.

* * * * *

UNITED STATES PATENT AND TRADEMARK OFFICE

CERTIFICATE OF CORRECTION

PATENT NO. : 6,117,698
DATED : September 12, 2000
INVENTOR(S) : Mitsuro Atobe, et al.

It is certified that an error appears in the above identified patent and that said Letters Patent is hereby corrected as shown below:

Title page, item 60, Related U.S. Application Data, change "which is" to --and-- after "Pat. No. 5,534,900".

Column 33:

line 14, change "a first insulating" to --an upper--;

line 16, change "a second" to --an--;

line 18, delete "second";

line 21, delete "second";

line 24, delete "second";

line 34, change "first insulating" to --upper--;

line 36, change "first insulating" to --upper--;

line 48, delete "second";

line 50, delete "second";

line 53, delete "second";

line 56, delete "second" and line 60, delete "second".

UNITED STATES PATENT AND TRADEMARK OFFICE

CERTIFICATE OF CORRECTION

PATENT NO. : 6,117,698

DATED : September 12, 2000

INVENTOR(S) : Mitsuro Atobe, et al.

It is certified that an error appears in the above identified patent and that said Letters Patent is hereby corrected as shown below:

Column 34:

line 12, delete "second";

line 21, delete "second";

line 24, delete "second";

line 37, change "a first insulating" to --an upper--;

line 39, change "a second" to --an--;

line 42, delete "second";

line 44, delete "second";

line 46, delete "second";

line 50, delete "second";

line 60, change "first insulating" to --upper-- and line 62, change "first insulating" to --upper--.

Column 35:

line 4, delete "second";

line 6, delete "second";

line 14, delete "second";

UNITED STATES PATENT AND TRADEMARK OFFICE

CERTIFICATE OF CORRECTION

PATENT NO. : 6,117,698
DATED : September 12, 2000
INVENTOR(S) : Mitsuro Atobe, et al.

It is certified that an error appears in the above identified patent and that said Letters Patent is hereby corrected as shown below:

line 18, delete "second";

line 24, delete "second";

line 26, delete "second";

line 28, delete "second";

line 39, delete "second";

line 42, delete "second";

line 48, delete "second"and line 51, delete "second".

Column 36:

line 40, delete "silicon".

Column 37:

line 21, change "fsilicon" to --silicon--;

line 22, change "a first insulating" to --an upper--;

line 25, change "a second" to --an-- and line 26, delete "second".

UNITED STATES PATENT AND TRADEMARK OFFICE

CERTIFICATE OF CORRECTION

PATENT NO. : 6,117,698

DATED : September 12, 2000

INVENTOR(S) : Mitsuro Atobe, et al.

It is certified that an error appears in the above identified patent and that said Letters Patent is hereby corrected as shown below:

Column 38:

line 1, delete "second";

line 3, delete "second";

line 12, change "a first insulating" to --an upper--;

line 15, change "a second" to --an--;

line 17, delete "second";

line 19, delete, "second";

line 23, delete "second" and line 25, delete "second".

Signed and Sealed this

First Day of May, 2001

Attest:

Nicholas P. Godici

NICHOLAS P. GODICI

*Attesting Officer*

*Acting Director of the United States Patent and Trademark Office*